United States Patent [19]

Allan et al.

[11] Patent Number: 5,099,090
[45] Date of Patent: Mar. 24, 1992

[54] CIRCUIT WRITER

[75] Inventors: G. Graham Allan, Seattle; Gary A. DeBardi, Bellvue; Amar N. Neogi, Seattle, all of Wash.; Kenneth N. Bates, Eugene, Oreg.; Robert B. Erley, Woodinville; Thomas L. Jacobs, Lynnwood, both of Wash.; Ramzi F. Hamade, Sunnyvale, Calif.; Stephen J. Horne, El Granada, Calif.; Manu C. Patel, Sunnyvale, Calif.; John E. Rose, Half Moon Bay, Calif.; Mark S. Schlosser, Seattle, Wash.; David P. Warden, Belmont, Calif.

[73] Assignee: Ariel Electronics, Inc., Sunnyvale, Calif.

[21] Appl. No.: 460,980

[22] PCT Filed: May 11, 1989

[86] PCT No.: PCT/US89/02026
§ 371 Date: Jan. 11, 1990
§ 102(e) Date: Jan. 11, 1990

[87] PCT Pub. No.: WO89/11209
PCT Pub. Date: Nov. 16, 1989

Related U.S. Application Data

[63] Continuation-in-part of Ser. No. 193,291, May 11, 1988, abandoned, and a continuation-in-part of Ser. No. 192,523, May 11, 1988.

[51] Int. Cl.[5] .............. H05K 1/00; B28B 7/22; B23B 19/00
[52] U.S. Cl. .................. 174/257; 29/846; 106/20; 118/411; 118/412; 118/415; 264/40.7; 264/104; 264/254; 425/114; 425/133.1; 425/145; 425/150
[58] Field of Search ............ 174/250, 257, 261; 29/846; 106/20; 252/512, 514; 264/40.7, 104, 254; 425/113, 114, 133.1, 135, 145, 150, 378.1, 376.1, 381, 461; 118/410, 411, 412, 415; 523/457–459; 524/401, 439, 871

[56] References Cited

U.S. PATENT DOCUMENTS

Re. 30,274  5/1980  Bolon et al. .............. 174/260 X
(List continued on next page.)

FOREIGN PATENT DOCUMENTS 0113979  7/1984  European Pat. Off. .
(List continued on next page.)

OTHER PUBLICATIONS

Delio, R., Extrusion Printing, IBM Technical Disclosure Bulletin, vol. 15, No. 10, Mar. 1973, pp. 3029 and 3030.

*Primary Examiner*—Morris H. Nimmo
*Attorney, Agent, or Firm*—Limbach & Limbach

[57] ABSTRACT

An apparatus and method are disclosed for preparing electrically conductive traces on a circuit board using an additive technology. The traces are directly written in a serial process with each trace being able to be individually insulated. The apparatus includes an extrusion element for extruding a first material and a stage. The stage is for holding the extrusion element and the circuit board in relative proximity and for producing relative motion between the extrusion element and the circuit board in order to extrude the first material onto the surface of the circuit board along preselected paths to produce the electrically conductive traces. According to the method of invention, a first polymerizable material is extruded onto a circuit substrate support along preselected paths to form traces, and the first polymerizable material is polymerized, the first polymerizable material being conductive after polymerization. A circuit board for holding electrical components is disclosed which includes a circuit substrate support and a plurality of electrically conductive traces. The traces are adhered to the circuit substrate support between locations for the electrical components, the traces being formed of a polymer thick film by extrusion from an orifice onto the support along paths defining the location of the traces. Several embodiments of extrusion systems are described as are systems for milling and drilling boards to provide new manufactures of circuit boards.

92 Claims, 51 Drawing Sheets

U.S. PATENT DOCUMENTS

| | | | |
|---|---|---|---|
| 3,240,624 | 3/1966 | Beck | 117/212 |
| 3,892,339 | 7/1975 | Idler | 118/410 X |
| 4,075,301 | 2/1978 | Oswald | 264/40.7 |
| 4,094,852 | 6/1978 | Sundermann et al. | 524/871 X |
| 4,187,339 | 2/1980 | Cayrol | 174/261 X |
| 4,237,606 | 12/1980 | Niwa et al. | 29/830 |
| 4,291,642 | 9/1981 | Kolc | 118/415 |
| 4,402,135 | 9/1983 | Schweingruber et al. | 174/267 X |
| 4,557,860 | 12/1985 | DiSalvo et al. | 252/512 |
| 4,564,410 | 1/1986 | Clitheros et al. | 118/410 X |
| 4,568,592 | 2/1986 | Kawaguchi et al. | 428/107 |
| 4,652,398 | 3/1987 | Goswami et al. | 252/512 X |
| 4,694,138 | 9/1987 | Oodaira . | |
| 4,696,764 | 9/1987 | Yamazaki | 252/504 X |
| 4,720,914 | 1/1988 | Maeda et al. | 29/846 |
| 4,743,465 | 5/1988 | Saeki et al. | 118/411 X |
| 4,748,068 | 5/1988 | Fahner et al. | 174/257 X |
| 4,749,347 | 6/1988 | Valavaara | 264/40.1 X |
| 4,755,123 | 7/1988 | Otake | 425/145 |
| 4,775,573 | 10/1988 | Turek | 174/254 X |
| 4,818,437 | 4/1989 | Wiley | 252/506 X |
| 4,842,504 | 6/1989 | Bentivoglio et al. | 425/378.1 X |
| 4,872,417 | 10/1989 | Kuwabara et al. | 118/411 |
| 4,874,548 | 10/1989 | Hajovsky | 252/512 X |
| 4,911,629 | 3/1990 | Fujita | 425/135 |
| 4,913,638 | 4/1990 | Buja | 425/145 X |
| 4,946,356 | 8/1990 | Kumazaki | 425/135 |
| 4,952,364 | 8/1990 | Matsuda et al. | 425/145 X |
| 4,961,965 | 10/1990 | Dietz | 118/410 X |

FOREIGN PATENT DOCUMENTS

| | | |
|---|---|---|
| 2205038 | 8/1972 | Fed. Rep. of Germany . |
| 3713400 | 6/1988 | Fed. Rep. of Germany . |
| 2123739A | 4/1982 | United Kingdom . |

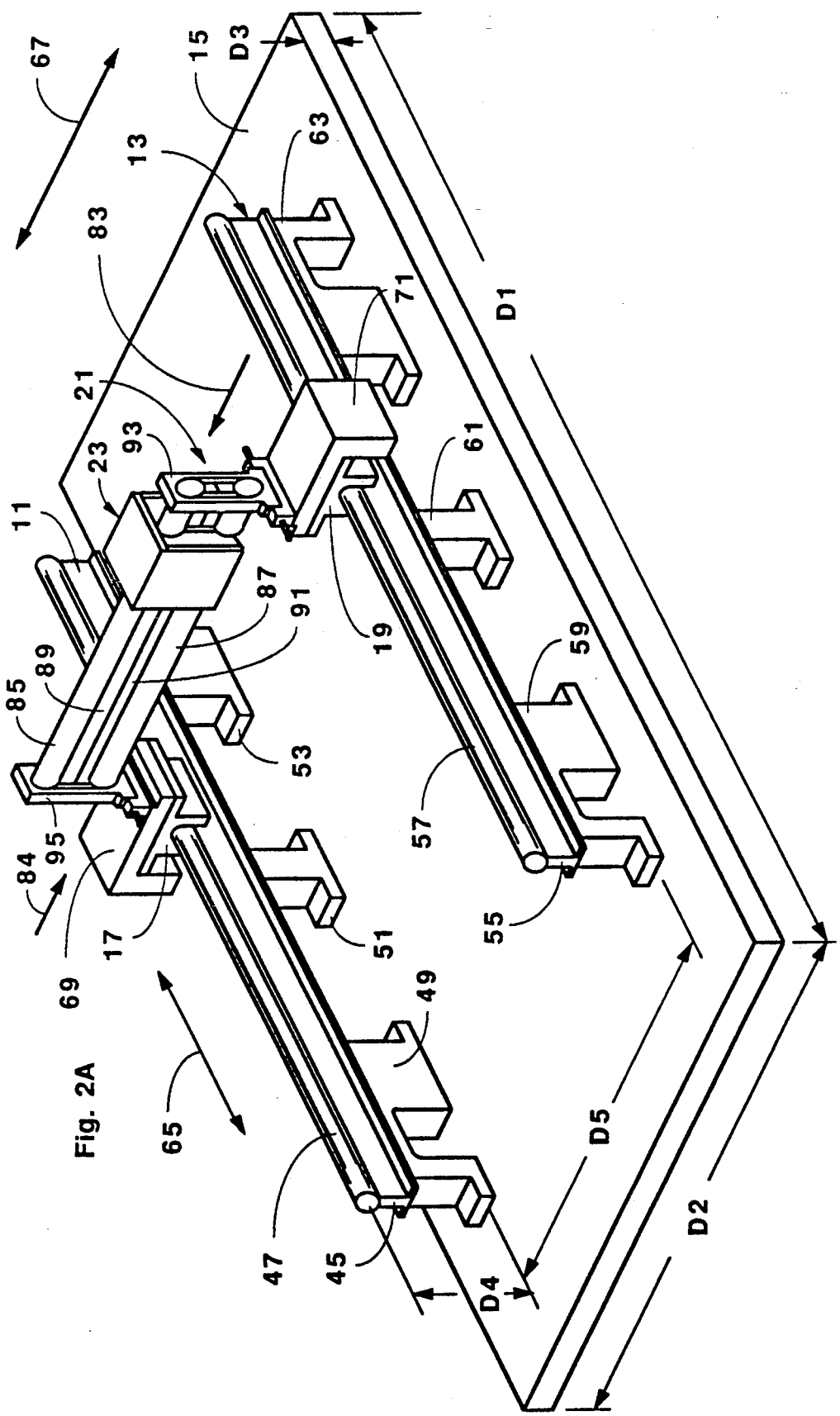

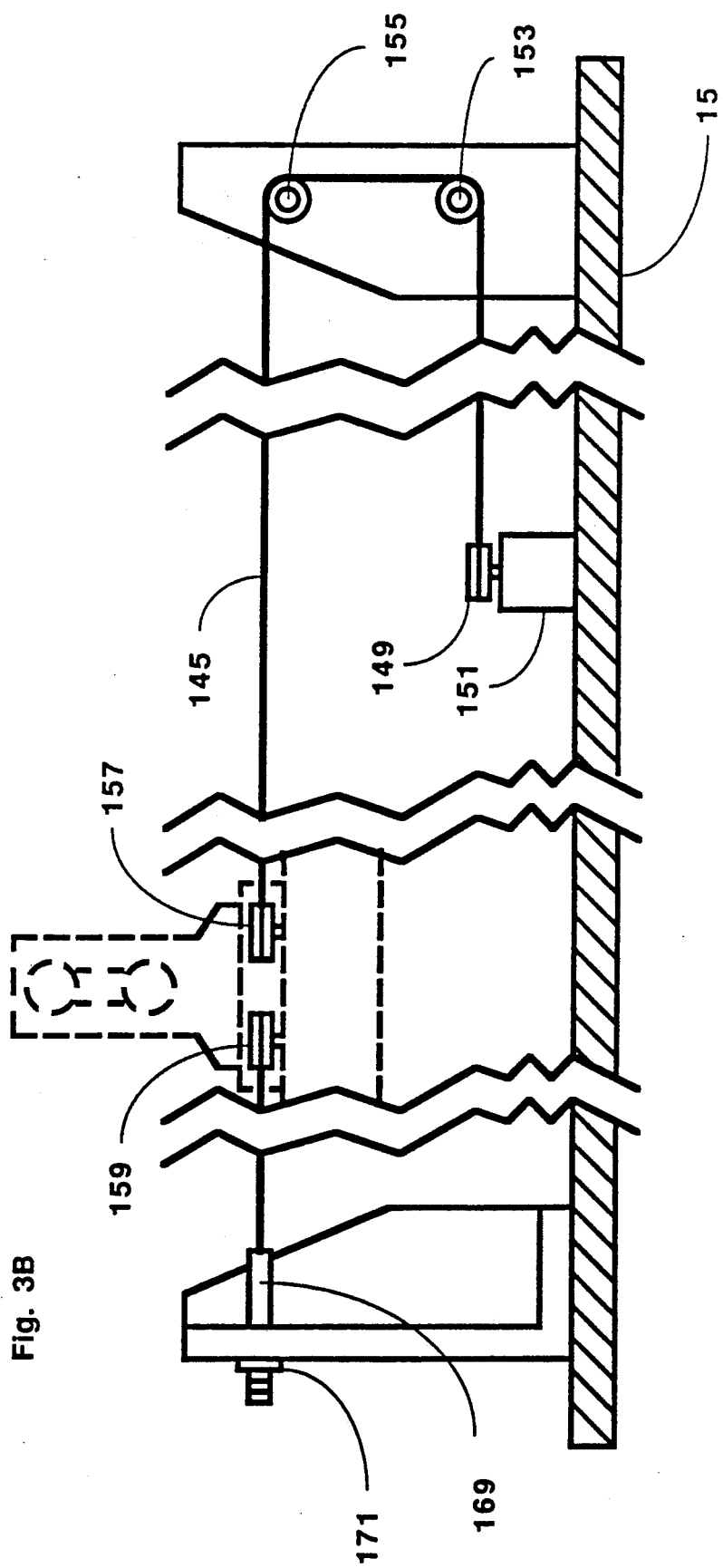

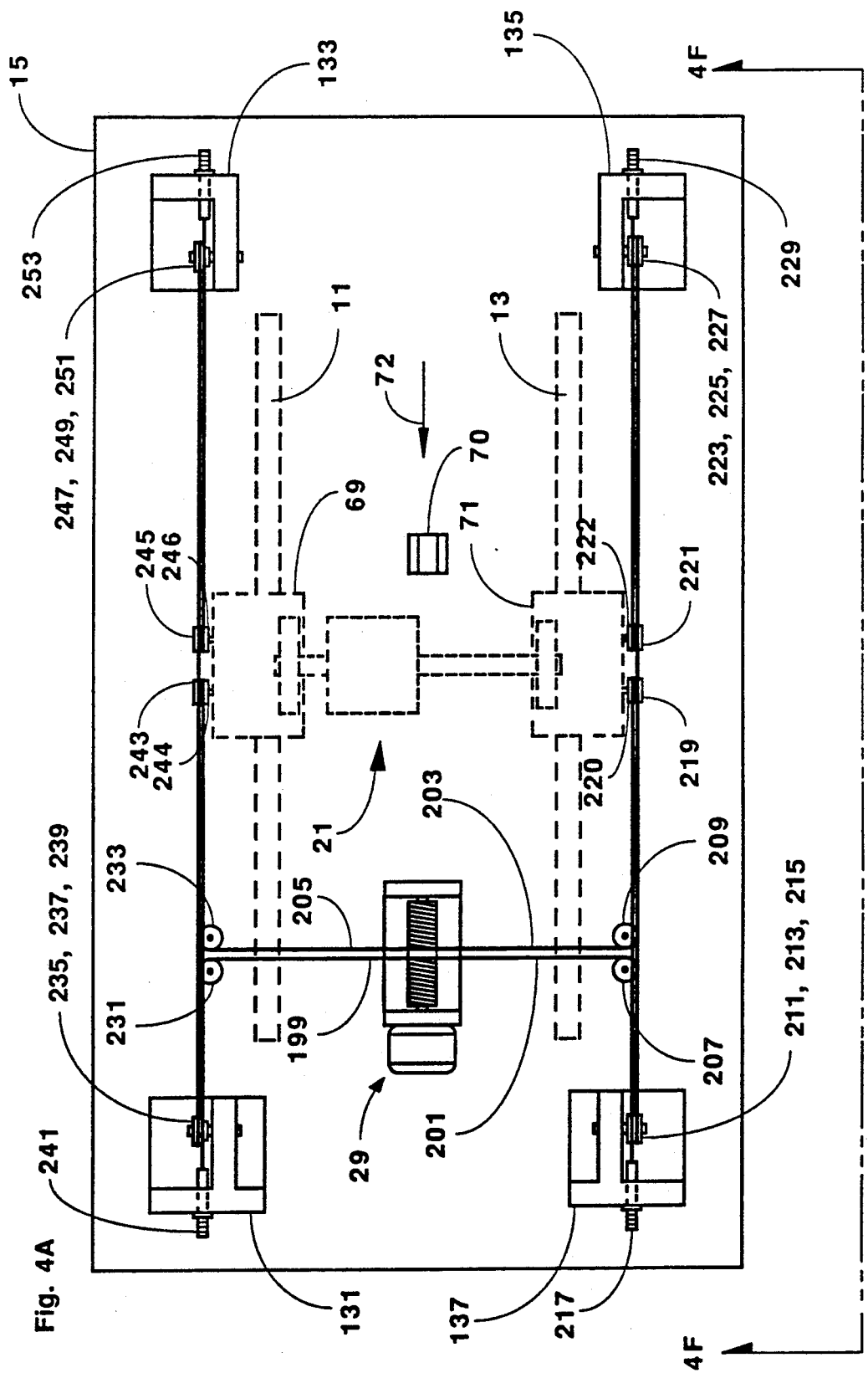

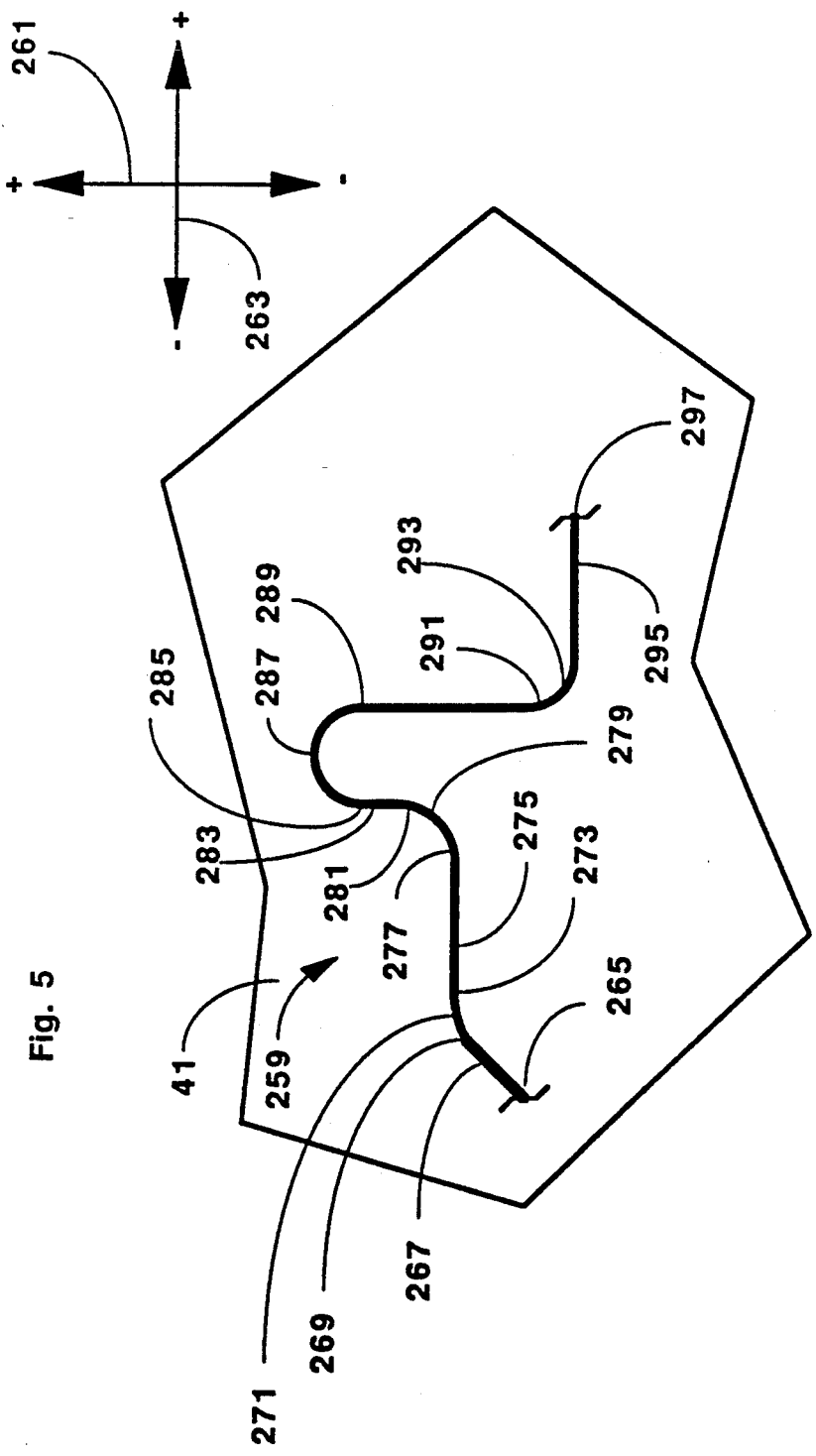

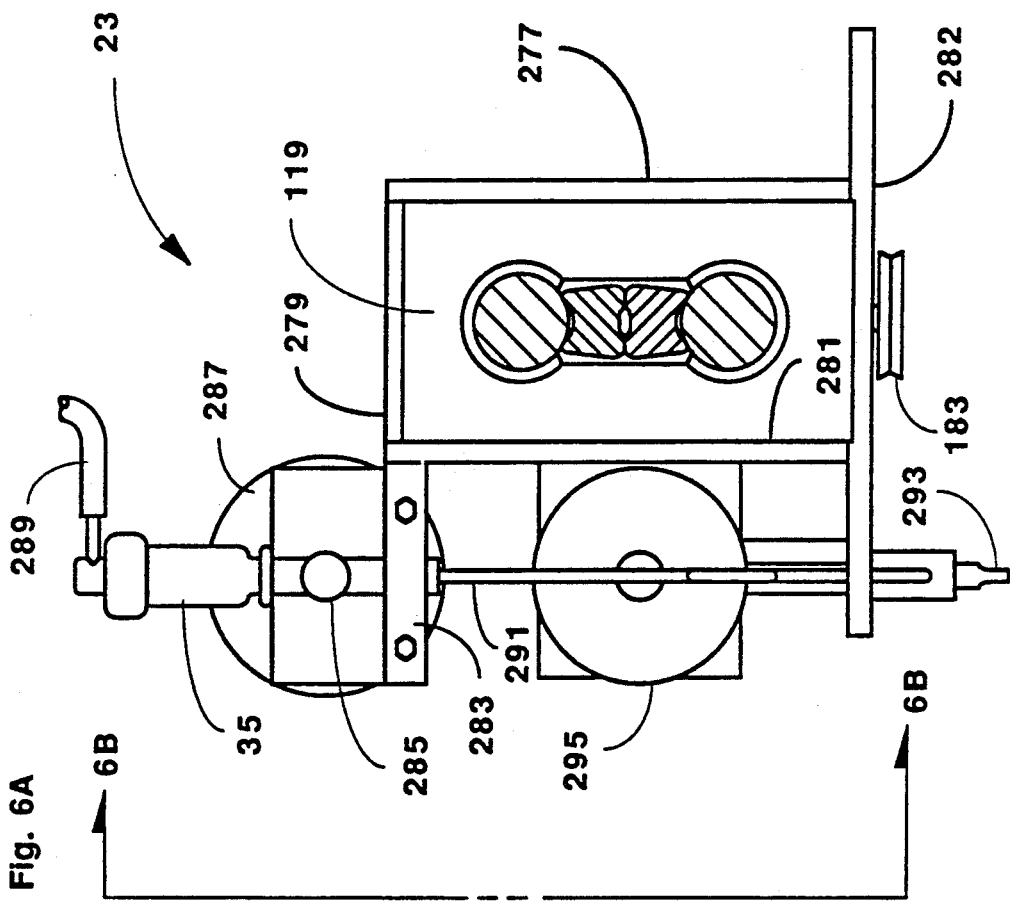

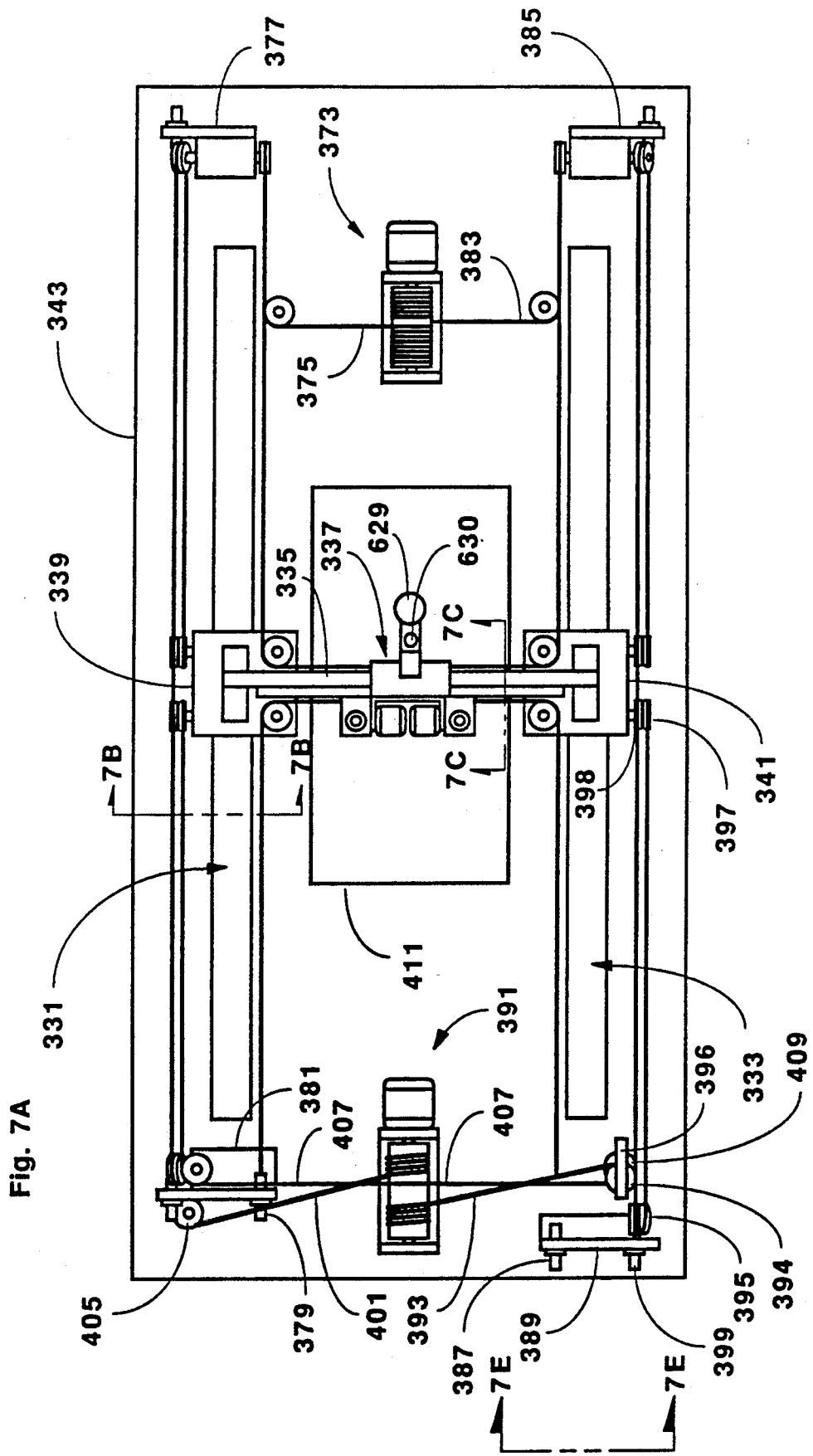

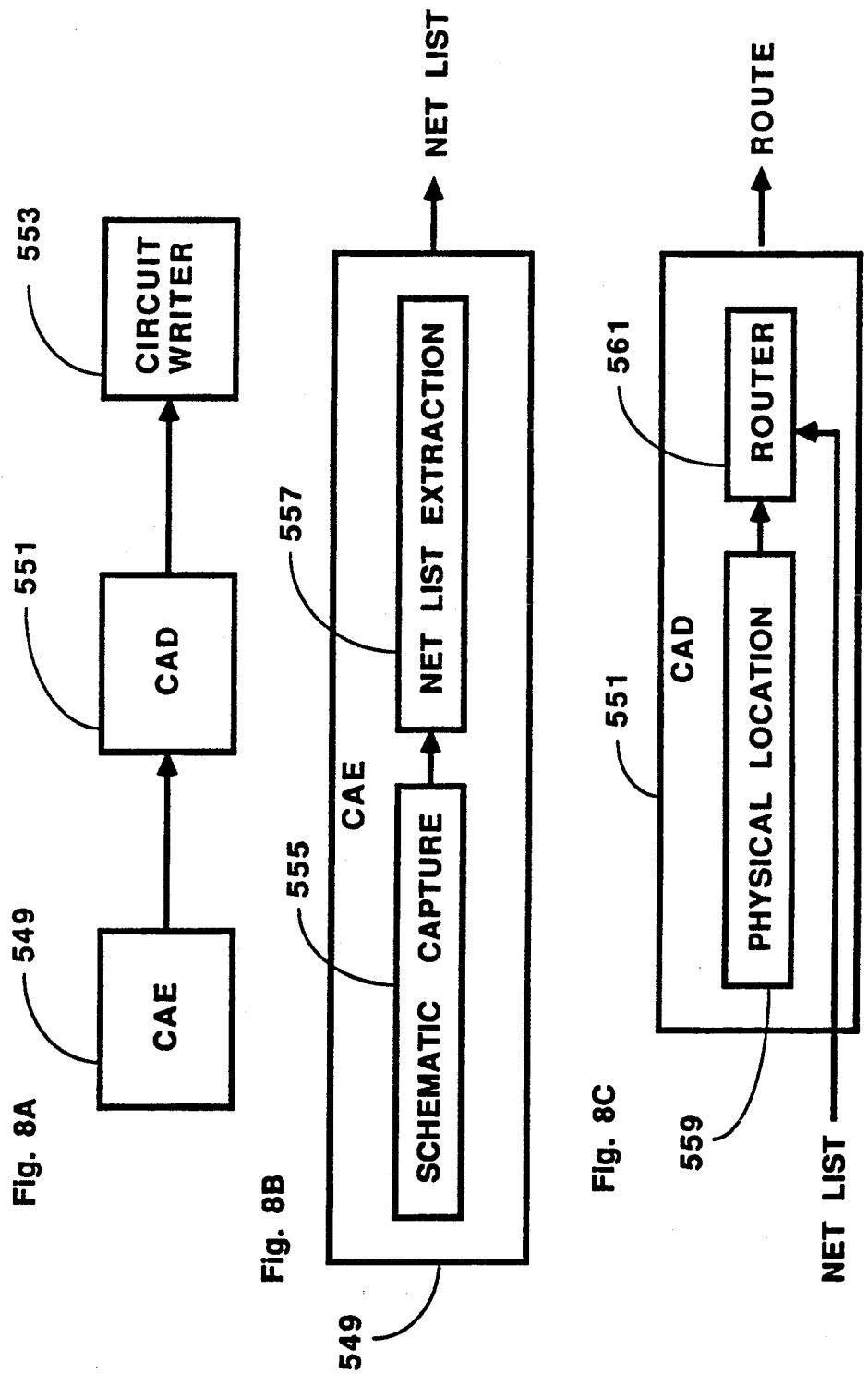

693

693

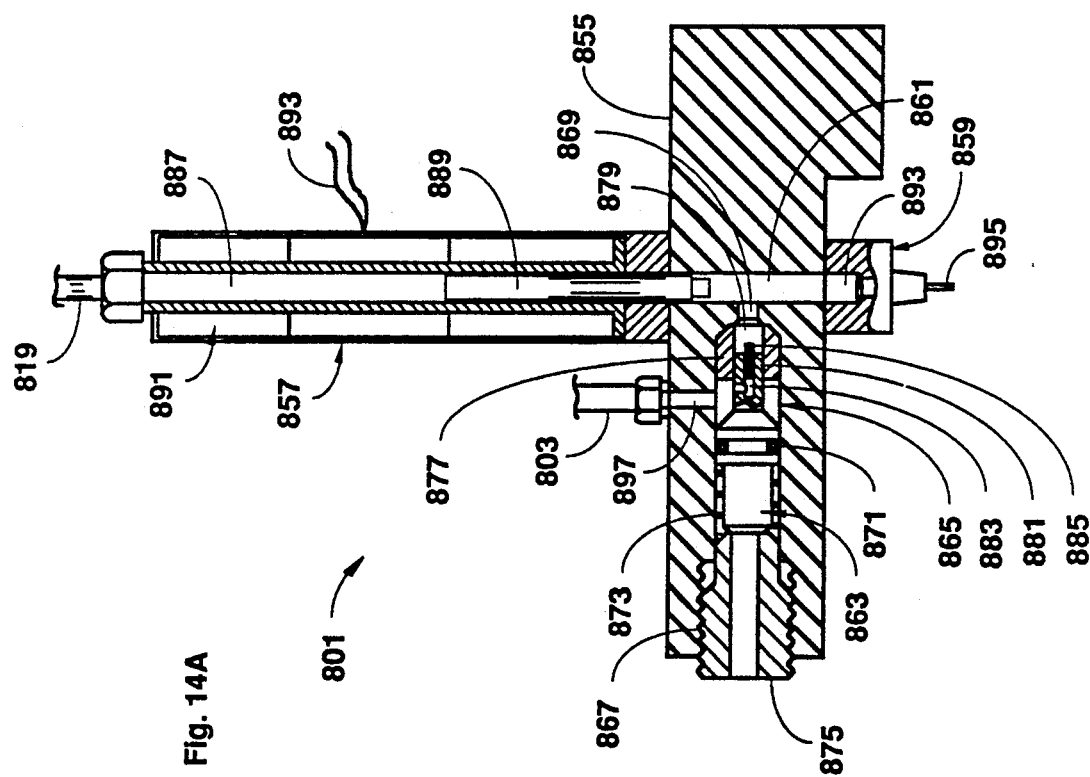

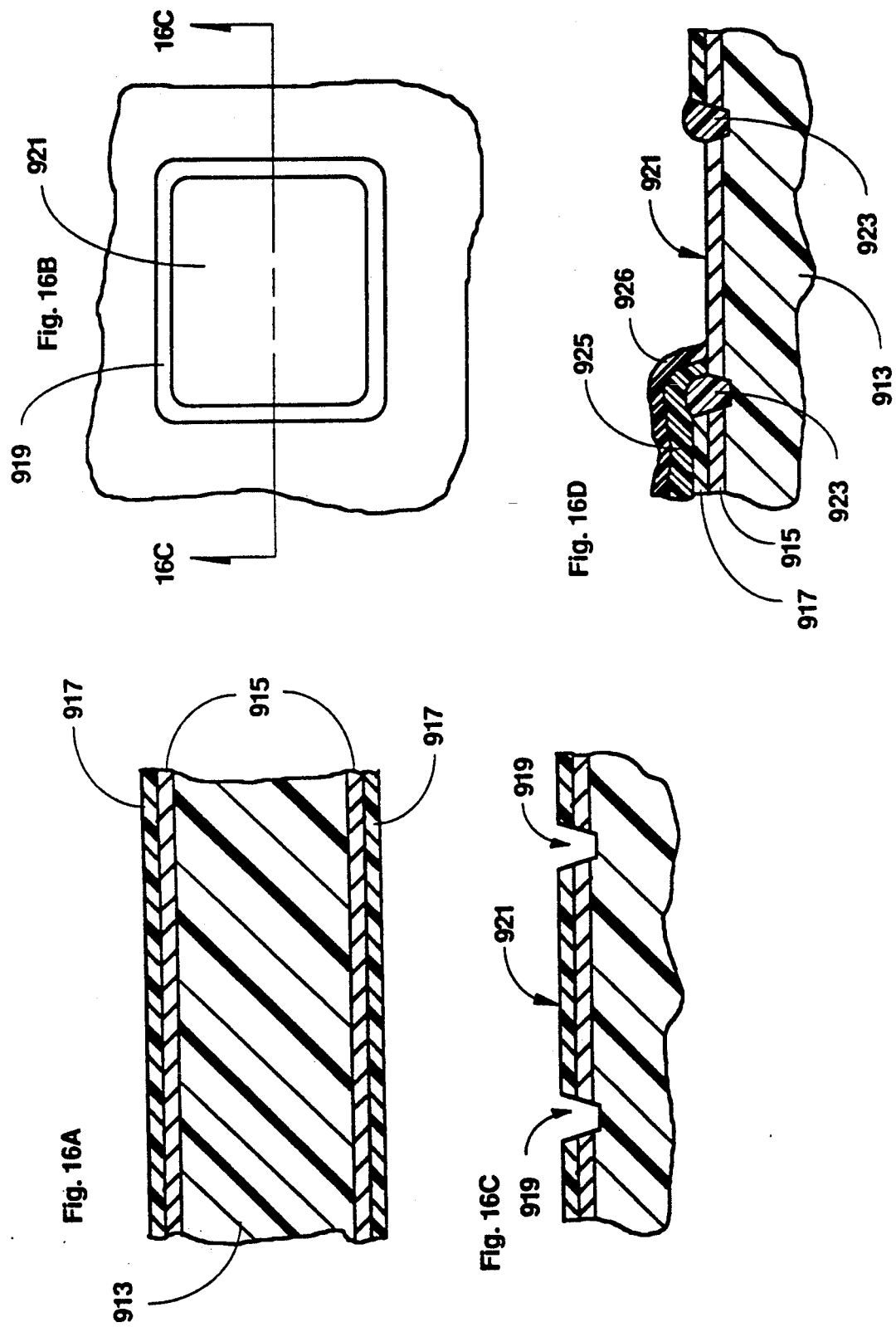

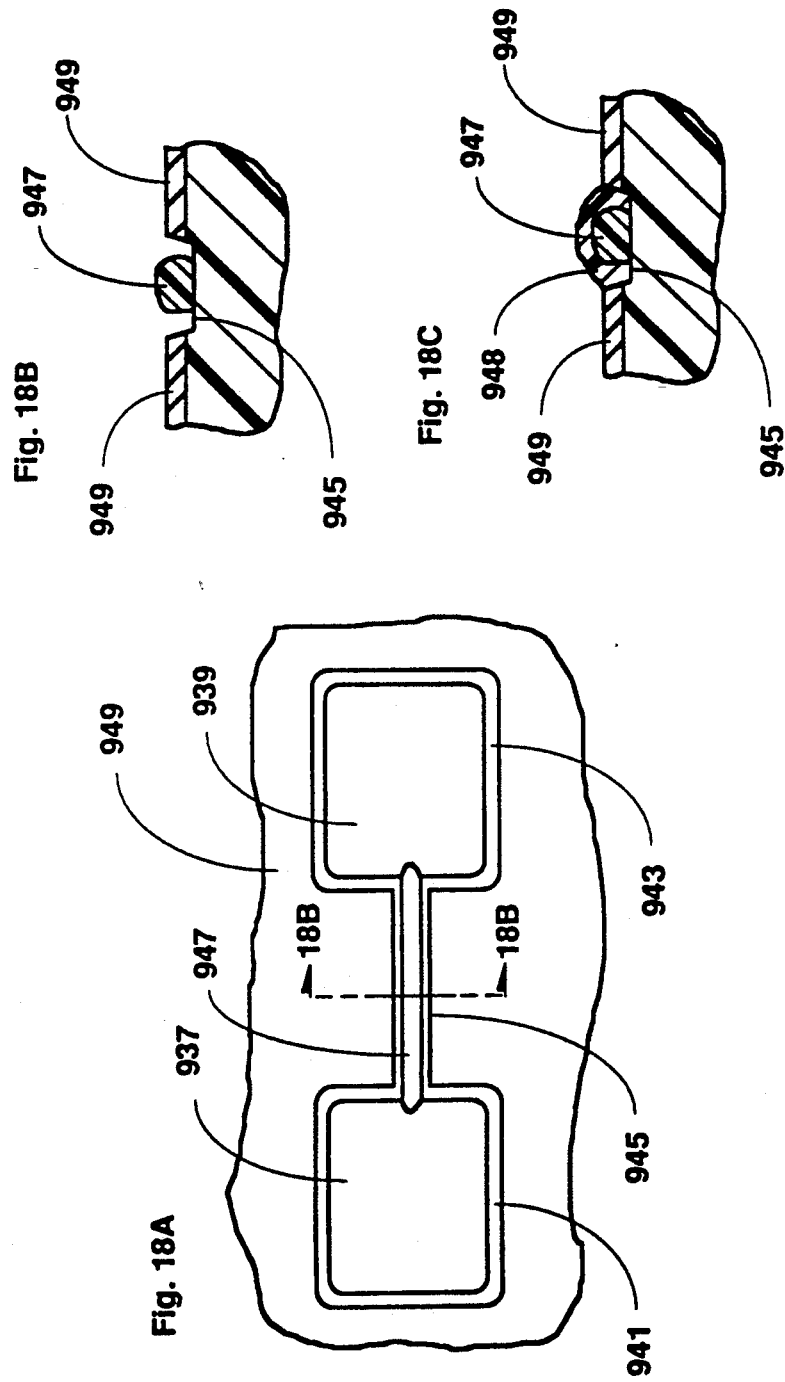

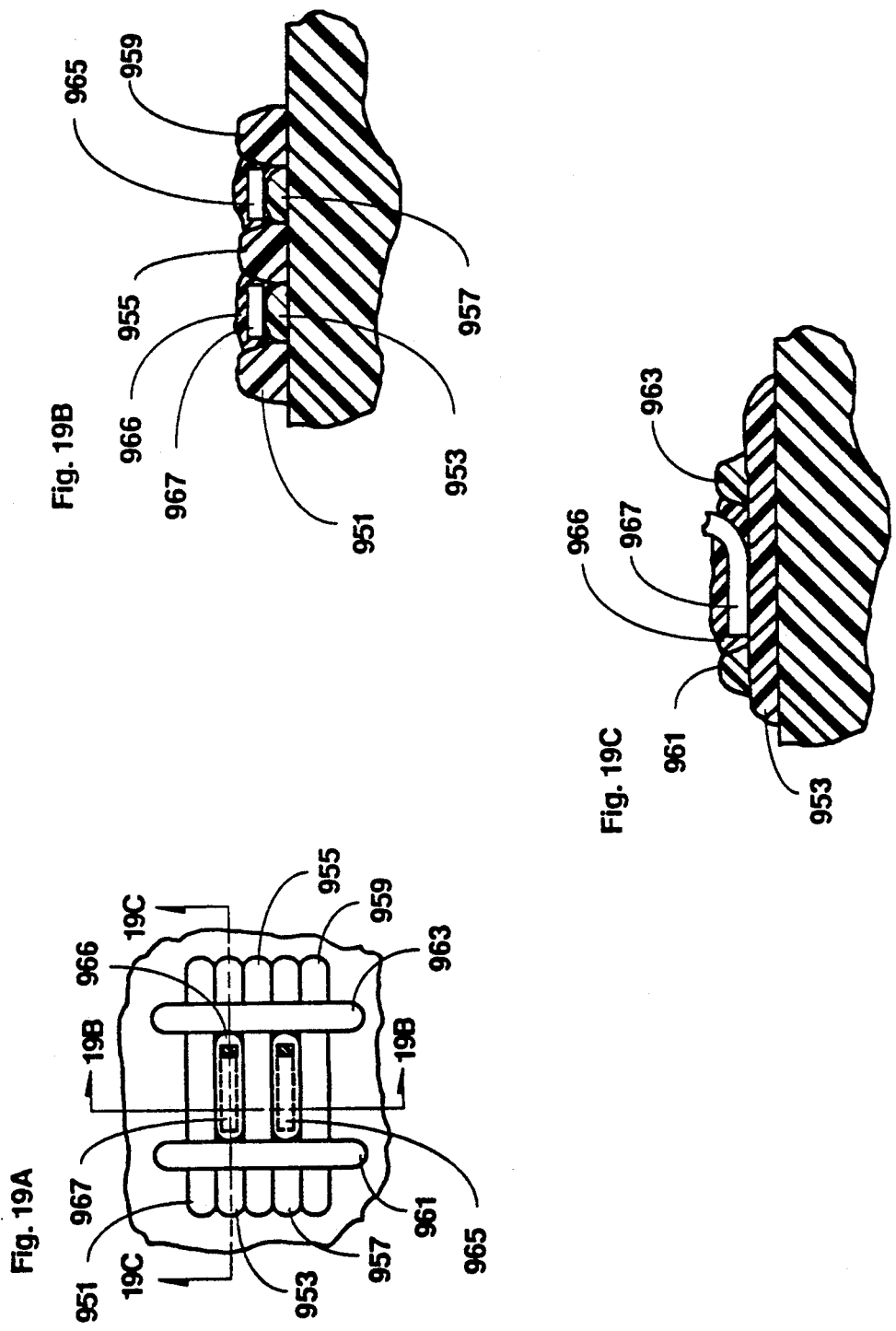

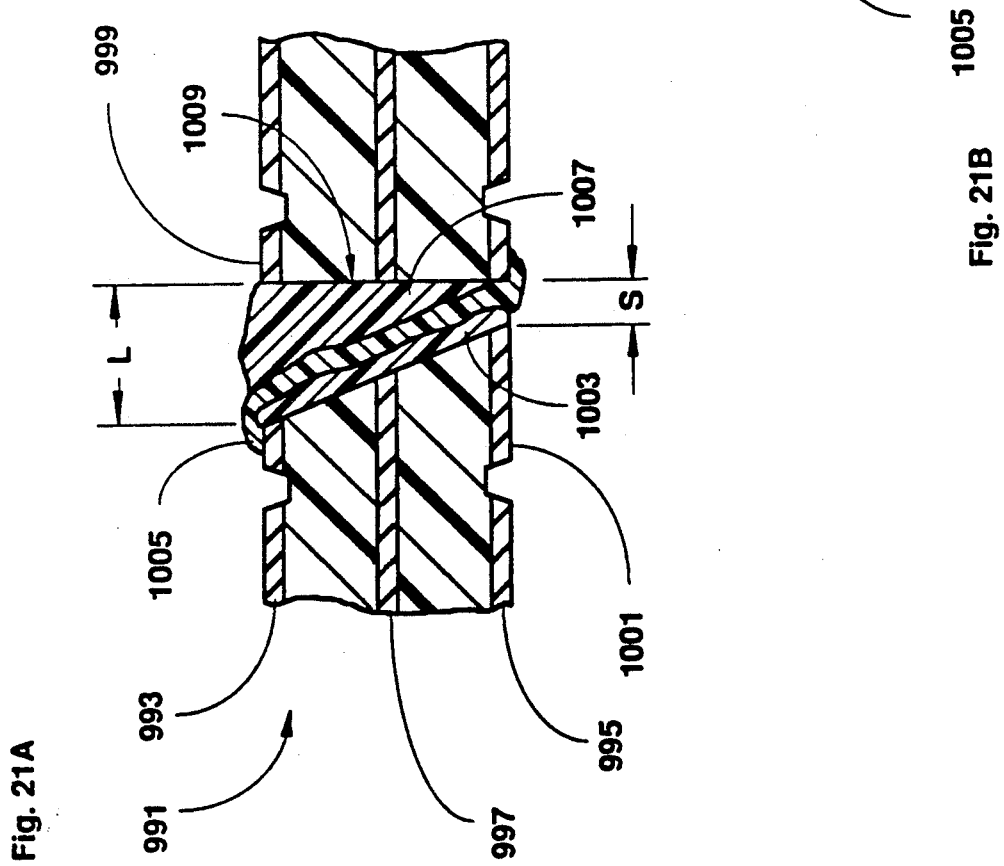
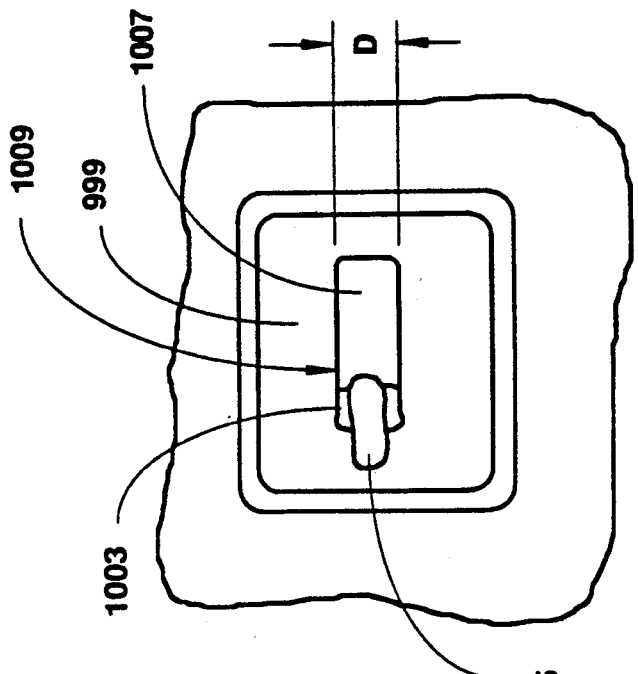
Fig. 21A
Fig. 21B

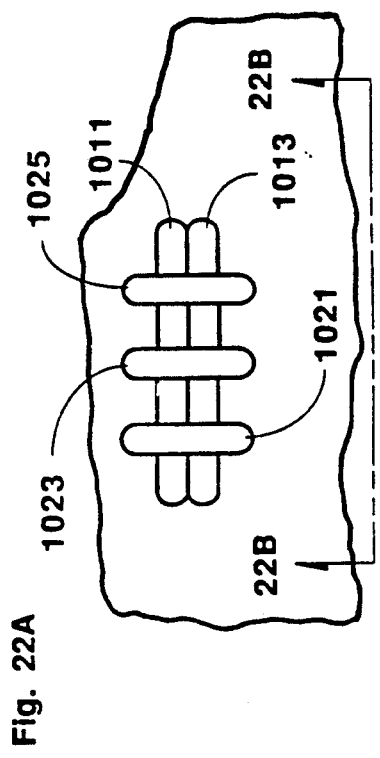
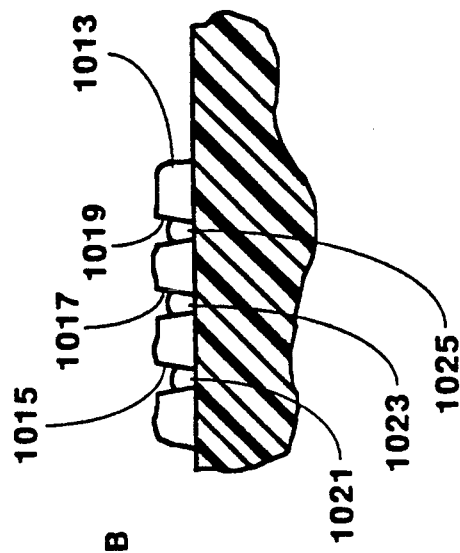
Fig. 22A
Fig. 22B

CIRCUIT WRITER

CROSS-REFERENCE TO RELATED APPLICATIONS

This application is a continuation-in-part of U.S. patent application Ser. No. 193,291, filed May 11, 1988, entitled CIRCUIT Materials, and a continuation in part of U.S. patent application Ser. No. 192,523, filed May 11, 1988, now abandoned, entitled CIRCUIT WRITER.

FIELD OF THE INVENTION

The present invention pertains to the production of circuit boards; in particular the apparatus, methods, and materials for forming conductive circuitry between points on such boards by extrusion; and boards produced by such apparatus.

BACKGROUND OF THE INVENTION

For at least the past twenty-five years, there has been in the U.S. and around the world a rapidly growing electronics industry in which an integral and important part has been the development and manufacture of printed circuit boards. These printed circuit boards are typically formed of electrically conductive traces supported by nonconductive substrates (i.e. boards) in such a manner that electrical and electronic components, for example resistors, capacitors, integrated circuits, and transistors, may be mounted so that the result is an electrical circuit incorporating these components. The electrically conductive traces are the "wires" of the circuit, and the board provides structural integrity, facility for mounting to chassis frames, and support for interconnection to other circuitry. Printed circuit boards are an integral part of almost every electronic product and are often the most complicated and expensive parts of the entire device. All of the working parts and electronic memory of many computers, for example, are implemented on one or more printed circuit boards.

The desktop computer is a good example of a product that makes extensive use of printed circuit boards. The development of integrated circuits has been instrumental in the development of desktop computers, which are based on powerful central processing units (CPUs) and memory chips capable of storing large amounts of digital information. The motivation for more and more processing power, such as sophisticated graphics generation and display, has led to miniaturization techniques to put more and more devices on a single integrated circuit chip. By the same motivation, larger numbers of memory chips and processors have been brought into action in limited space environments, such as the chassis of a desktop computer, by innovative techniques for increasing the density of printed circuits.

Just as in the development of any product, certain techniques have emerged over the years for producing printed circuit boards that have proven to be useful and effective, and have come to be used by many manufacturers. According to one such process, as described in the *Handbook of Printed Circuit Manufacturing*, by Raymond N. Clark, published in 1985 by Van Nostrand, a typical printed circuit board begins with a sheet of nonconductive polymer material, such as fiberglass reinforced epoxy. The material that will eventually form the traces is copper foil, and a thin sheet of the foil is mounted to one or both sides of the fiberglass sheet, typically with epoxy resin as an adhesive to form a blank. Holes are usually drilled into the laminated blank. Some holes are for such purposes as registration, alignment and mounting of the board to other elements of an assembly, many are for accepting wire leads of electrical components to be finally mounted to the finished board, and many are to provide for electrical contact through the laminate between the eventual traces on one side and the traces on the other.

After holes are drilled, electroless plating operations are used in those cases where needed to plate conductive metal, usually copper, through the holes. Imaging techniques are subsequently used to lay a pattern over the copper foil defining the circuit traces to be formed. The two commonly used techniques are silk screening and dry film photoresist. In each of these, the pattern, called artwork, has to be separately determined and rendered in masks as part of the process. In the silk-screening process, plating resist material is applied to the foil through openings in the mask. In the dry film photoresist process the entire copper foil area is coated, then a pattern is cured through a mask by radiation, such as ultraviolet light. The uncured resist is then washed away. In either case the result is a pattern of plating resist material on the foil, covering those areas of the foil that will be eventually be removed to leave the circuit pattern. The resist does not conform the pattern of the circuit traces, but rather to the pattern that is not the circuit, i.e. the negative of the traces.

The next step in the typical process is the plate up of the circuit pattern. Conventional plating techniques are employed to increase the thickness of the exposed copper foil in the circuit pattern to a predetermined thickness to provide adequate current carrying cross-section and structural integrity. The plating operation is typically finished by applying a layer of a material such as tin-lead alloy (solder) over the traces. The resist is then removed, usually by solvent wash, and the foil under the resist is removed by chemical etching. The overplate of solder material protects the circuit traces from the etchant. The conductive circuitry is left on the surface or surfaces of the board.

There are a number of operations performed that are not detailed in this description, such as reflow and solder mask. The purpose here is not to teach the manufacture of printed circuit boards by conventional techniques, but to show that it is indeed a complicated, time consuming, and expensive process. A single board, even mass produced, can cost hundreds of dollars, and to apply these techniques to a limited quantity of boards can costs thousands per board.

In the development of circuit board production techniques, particularly to increase complexity and density, a number of innovations have been made. One development path involves the lamination of boards together so that there are inner layers of complex circuitry. Connection to board components and to other circuitry in other layers is made through holes and vias through the nonconductive board materials. These are known in the art as multilayer boards, and through their use, the amount of circuitry that can be accommodated in the same board space has been increased several-fold.

Another development has been the use of polymer thick film materials in the preparation of printed circuit boards, particularly multilayer boards. Polymer thick films are polymer materials (i.e. plastic resins) that are thixotropic through the use of additives such as when loaded with conductive materials, e.g. fine particles of silver, or with thixotropic additives (e.g. fused silica). These are silk screened directly onto the surface of a nonconductive board, forming the conductive traces directly. Used in multilayer technology, layers of silk screened circuits may be interlayered with other materials and printed circuits in multiple layers, and interconnection between layers is made by vias and drilled and plated holes. In general, polymer thick film multilayer boards can cost half of what laminated copper multilayers cost.

With these new developments and others, there are, however, still significant problems that haven't been adequately addressed, problems which have carried over from one technology to plague the next. One of these is in the application of artwork to the formation of the traces on a board. The first steps to the production of a board are engineering steps. The theoretical circuit is conceived and circuit performance is calculated. Typically, then, components are specified from commercially available stocks, such as one manufacturer's CPU, another's DRAMs, and other elements from still other manufacturers, and calculations are made to determine the desirable traces. There may be, for example, certain restrictions on the length of certain traces where ultra high speed is required in the transmission of signals, or in the cross-section and conductivity, where high current loads are to be borne. There are other engineering considerations, too, such as expansion and contraction of traces versus the supporting materials, and the requirements for cooling and heat dissipation. In these calculations, a design engineer is limited, too, by the nature of the prototyping and production equipment that is to be used to implement the design. These limitations are known as design rules.

In present work environment, the design engineer is now aided in many cases by new and powerful computer programs that take all the design rules into account, calculate, and prepare graphic displays of trace patterns. The patterns created are called routes and the software tools are called routers. A router engine is the basic calculator tool for quickly doing the multitude of alternative layouts that are possible, still obeying all the router rules. Of importance is the fact that at the end of the routing and the iterative process of choosing the options that a computer creates, the route has to be implemented in artwork to be transferred to the board prototype or production process. The conventional process requires masks for the photoresist or for the silkscreening of plating resist. The polymer thick film process requires silkscreens for the application of the uncured materials to the board surfaces.

The implementation of the artwork introduces expensive and time consuming intermediate steps that also increase chances for error, such as misalignment.

Another problem that still prevails, and which becomes ever more complex, is the absolute necessity of verifying a design before dedicating the design to a hugely expensive and cumbersome production process. This process is known as breadboarding, which is the practice of preparing a limited number of boards in, hopefully, a relatively inexpensive way, to verify that a circuit which appears to be functional and for which engineering calculations have shown it to be functional, actually works in the real world. One way that has been used to breadboard is to mount the circuit components on standard boards without circuit traces, but with edge pads and some other more or less standard features, and to connect the components by hand soldering or wire wrapping, using fine wires and other hand manipulatable trace materials. This process is, of course, cumbersome and prone to error. Other breadboarding techniques involve essentially the same techniques that are used in production, but incorporating manually operated systems and smaller-than-production dedicated facilities, such as small plating tanks to do one or a few boards at a time. Again the process is expensive and time consuming.

Another problem that is very typical occurs when breadboarding is finished, the iterative correction process is complete, and a large number of boards have been prepared. An engineering change is often required, such as adding a component or two to upgrade performance. The result is a large stock of finished boards, representing a large amount of money that must either be scrapped, at an unacceptable cost, or reworked. This rework process to make the stock into usable or salable product involves cutting traces and adding jumpers. The process of doing the cuts and jumpers is prone to error, because it is most generally a hand work process, and is quite expensive for the same reason. Moreover, the changes made, since they are most often made in a way foreign to the production process, are clearly visible. The presence of cuts and jumpers is considered by many to be a good way to judge the engineering foresight of a company that manufactures printed circuit boards. Many product reviewers also judge products partially according to the prevalence of cuts and jumpers on the printed circuit boards used.

What is needed is an apparatus that can be computer controlled so that computer aided engineering and computer generated routing and associated artwork can be generated directly on the control computer, or loaded to the control computer, so that traces of a printed circuit board can be generated directly by the apparatus. Such an apparatus would eliminate the intermediate steps of implementing the artwork in other forms, such as masks for applying photoresist or plating resist, and the resist and plate-up operations as well would be eliminated. To achieve maximum utility, such an apparatus should also generate traces that can cross one another (i.e. provide crossovers), then the density of multilayer boards could be provided as well. The direct writing of traces from digitized data would integrate all of the complicated steps of preparation of printed circuit boards, and would particularly facilitate the process of breadboarding. Such a direct circuit writing apparatus could also significantly improve the process of providing rework in the form of cuts and jumpers. On a board made by such a circuit writer, cuts and jumpers could be programmed and automated, and would be difficult to distinguish from original traces. Such an apparatus could also be used on conventional boards (with accessible traces) to provide jumpers, if appropriately programmed and automated, thereby eliminating much expensive and error-prone hand rework.

SUMMARY OF THE INVENTION

In accordance with preferred embodiments of the invention, an apparatus and method are disclosed for preparing electrically conductive traces on a circuit board using an additive technology, rather than a subtractive technology as in wet processing. The traces are directly written in a serial process, rather than in a parallel process as with silk-screening techniques, with each trace being able to be individually insulated.

Hence, cross-overs are customary and permit via-less electrical contact to components, while at the same time simulating multilayer boards prepared by other processes. The intrinsic freedom to follow substantially any pattern is particularly important in that complicated circuits can be easily and quickly breadboarded, usually in a matter of hours rather than days or weeks. Furthermore, the apparatus in the preferred mode is computer controlled, and can be operated according to instructions provided by computer generated routing and computer aided engineering programs. Furthermore, jumpers can be easily programmed for existing boards. Also, due to the automated direct writing capabilities, small production runs which are generally very expensive on a per board basis for parallel production processes, can be very economically and quickly accommodated.

The method of the invention includes the steps of (i) calibrating a stage, e.g. a stage is calibrated so that positions on the substrate correspond to positions pre-programmed into a trace routing engine; (ii) extruding a trace onto the substrate by a first extrusion element under programmed control of the trace routing engine, the trace consisting of a first material; (iii) hardening the trace; (iv) layering a second material on the hardened trace under programmed control of the trace routing engine, the second material encapsulating the hardened trace, (v) hardening the second material, (vi) repeating steps (ii) through (v) until the circuit determined by the trace routing engine is complete, and (vii) curing the first and second materials to form a circuit of insulated conductive traces. Preferably, the step of layering is accomplished by a second extrusion element operated under programmed control of the trace routing engine.

A result of the method is an insulated conductive trace on a substrate. Typically, the insulated conductive trace comprises a core consisting of a conductive polymer thick film made by curing the first material, a sheath consisting of an insulative polymer thick film made by curing the second material, and an interface between the core and the sheath that is impermeable to water and the solvents in the second material.

In an alternative approach, the conductive traces are not completely covered by insulator, but instead the second polymerizable material is applied over the circuit substrate support at a plurality of points overlying the first polymerizable material, points where cross-overs are to occur. In that way, second and subsequent layers can be applied which cross-over the first set of traces where they are insulated, so as to produce a multi-layer board.

The apparatus according to the invention includes a stage and a first extrusion element for extruding a first material. The purpose of the stage is for holding the extrusion element and the circuit board in relative proximity and for producing relative motion between the first extrusion element and the circuit board in order to extrude the first material onto the surface of the circuit board along preselected paths to produce the electrically conductive traces. Preferably, the electrically conductive traces are then covered with an insulating material to provide insulated conductive traces. More preferably, the apparatus further includes a second extrusion element for extruding a second material onto the electrically conductive traces to produce the insulated conductive traces. Most preferably, the first and second materials are polymer solutions that form polymer thick films after a curing step.

In accordance with preferred embodiments of the invention, a circuit board for holding electrical components is disclosed which includes a circuit substrate support and a plurality of electrically conductive traces. The traces are adhered to the circuit substrate support between locations for the electrical components, the traces being formed of a polymer thick film by extrusion from an orifice onto the support along paths defining the location of the traces. In a preferred mode, the traces have a maximum thickness in a single pass that is at least 25% of their minimum width, and preferably a thickness of at least 50% of the minimum width. Furthermore, the traces can be made even thicker by putting down successive layers of electrically conductive material without putting down insulator between passes. In one preferred embodiment, the substrate support has a plurality of electrically conductive pads to which the electrical components are to be electrically connected. The traces then begin and end on top of the pads to form electrical pathways between the pads.

An important feature of the invention is the operational association of the apparatus and the rheological properties of the first and second materials. Preferably, the first and second materials exhibit little or no thixotropic hysteresis with increases and decreases in stress, and are pseudoplastic in that the rate of change in shear rate is a nondecresing function of applied stress. These properties simplify the control of the first and second materials during extrusion, such that a predetermined rate of deposition can be achieved by timed actuation of valves, regulation of pump rates, pressure head, and/or the like, in the first and second extrusion elements.

Another important feature of the invention is that the first and second materials undergo an increase in viscosity immediately after extrusion and before curing. Preferably, the increase in viscosity is achieved by solvent evaporation, and the degree of increase is sufficient for the deposited trace to support the weight of crossover traces, without requiring curing between passes. Most preferably, the first material comprises conductive particles and polymer precursor materials in a solvent mixture comprising one or more solvents, at least one of which possesses a high evaporation rate.

Still another important feature of the invention is the apparent rapid formation of a hydrophobic polymeric layer impermeable to water and solvents in the second material at the interface between the first material and the second material when the latter is deposited, or layered, onto the former. Hereinafter, this solvent-impermeable hydrophobic polymeric layer will be referred to as the interfacial layer. It is belivered that the interfacial layer is formed by reaction of components in the first material with components in the second material. It appears to serve two functions: (i) it locks moisture out of the conductive trace thereby preventing a degradation of conductive properties caused by electrolytic migration of metallic components, and (ii) it prevents transfer of solvent from freshly deposited second material into the conductive trace thereby preventing re-solvation and possible deformation of the conductive trace. Preferably, the interfacial layer is formed by reaction of a polycyanate with a polyamine.

BRIEF DESCRIPTION OF THE DRAWINGS

FIG. 2A shows a perspective view of a typical base plate and rail arrangement of the first preferred embodiment, showing only main framing elements and bearing and rail arrangements to provide precise x, y, and z movements needed for circuit writing.

FIGS. 3A and 3B show one preferred method by which the write carriage may be moved in the y-direction.

FIG. 4A shows a plan view of an x-motion assembly according to the invention.

FIG. 5 shows an example of a trace that may be drawn by the apparatus of the invention.

FIG. 6A shows a side elevation view of the write carriage, from the same direction as FIG. 2E.

FIG. 7A shows a plan view of an alternative preferred embodiment of the invention.

FIGS. 8A, 8B, and 8C show a block diagram illustrating the broad flow of information used in automating the invention.

FIG. 14A is a cutaway view of a portion of the Minibung embodiment.

FIG. 16A shows a partial section through a circuit board.

FIG. 16B shows a plan view of a part of a circuit board having a milled pad.

FIG. 16C shows a partial section view through the pad of FIG. 16B.

FIG. 16D shows a the section of FIG. 16C after additional steps.

FIG. 18A shows a plan view of an alternative approach to forming traces between pads.

FIG. 18B shows a partial section of the board illustrated in FIG. 18A at an intermediate step.

FIG. 18C shows a partial section of a completed board using the alternative approach of FIG. 18A.

FIG. 19A shows a plan view of a polymer pad formed by extrusion.

FIG. 19B shows a partial section of the polymer pad of FIG. 19A.

FIG. 19C shows another partial section of the polymer pad of FIG. 19A from a perspective orthogonal to that of FIG. 19B.

FIG. 21A is cross-section of a board illustrating an alternative method for electrical connection from a pad on one face of a board to the opposite face of a board.

FIG. 21B is a plan view of the board shown in FIG. 21A.

FIG. 22A is a plan view of a polymer pad illustrating a method for providing registration of leads for a discrete device to be attached to the pad.

FIG. 22B shows the polymer pad of FIG. 22A in cross-section.

DESCRIPTION OF THE PREFERRED EMBODIMENTS

Figure 1:
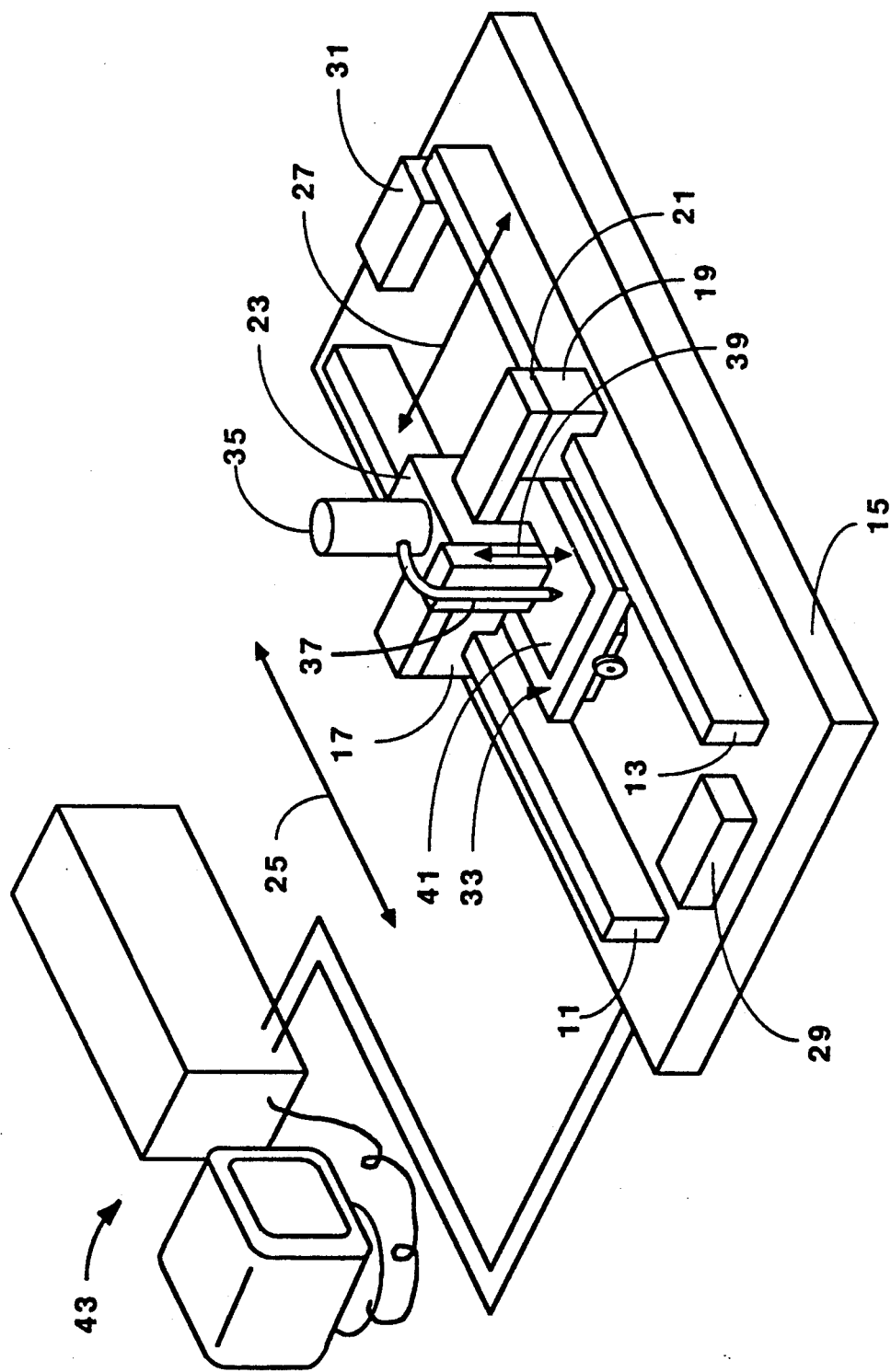
FIG. 1 shows a block drawing of a first preferred embodiment of the invention.

Shown in FIG. 1 is an exemplary system (hereinafter called a circuit writer) for writing traces on a circuit board by applying a conductive material, such as a metal filled epoxy, in a pre-determined pattern onto a surface of a support blank. In the preferred mode, the conductive material is applied by extrusion in a paste or in a semi-liquid form, and cures after application to form permanent electrically-conductive paths between circuity elements that are later added to the resulting printed-circuit board (pcb). The circuit writer is used also in some instances to apply an electrically insulating material, also in paste or semi-liquid form. The support blank is typically a rectangular sheet of reinforced plastic, glass reinforced epoxy for example, and is typically electrically non-conductive. There may be holes of varying small diameter in the blank through which metal wire leads of circuit elements are passed, the leads then being fixed to a portion of an electrically conductive path applied by the circuit writer. In a more advanced pcb design, the circuit elements may be surface mounted, a method in which the element leads do not pass through holes in the board, and the resulting board is said to be SMT (surface mount technology). In either case, fixing of an element lead to a portion of a conductive path on a board may be by soldering or by electrically conductive adhesive material, metal-filled epoxy material for example.

In the first preferred embodiment illustrated in FIG. 1, the circuit writer includes two parallel rail assemblies 11 and 13 mounted to a stable metal baseplate 15. A saddle carriage 17 rides along rail assembly 11 and a saddle carriage 19 rides along rail assembly 13 so that the saddle carriages and rail assemblies form an x-direction rail-and-bearing subsystem. Saddle carriage 17 and 19 are rigidly connected by a cross-rail assembly 21, and a write-carriage 23 rides along rail assembly 21 so that bearings in the write carriage together with the cross-rail assembly form a y-direction rail-and-bearing subsystem. As a result of this right-angle arrangement of the two rail-and-bearing subsystems, write carriage 23 has two degrees of freedom and may move in the x-direction indicated by the arrow 25 and also in the y-direction indicated by the arrow 27. An x-drive 29 propels the joined saddle carriages 17 and 19 in the x-direction, and a y-drive 31 propels write carriage 23 in the y-direction. A table 33 within the x-y system serves to carry a blank 41 upon which a circuit may be written.

A metering subsystem is provided that is capable of starting, stopping, and controlling the flow of PTF and includes a reservoir 35 of uncured PTF that is carried along with write-carriage 23, and is metered by other elements (not shown) through a write extension 37 that extends from the carriage in a substantially vertical orientation. In other embodiments the material reservoir may be stationary relative to the frame of the system, and the material conducted through flexible tubing to the write-carriage. Write extension 37 is moveable vertically in the direction of arrow 39 (the z-direction) to within close proximity of pcb blank 41 on write table 33.

A computerized control system 43 is connected to the mechanical system, and powers and controls movement of the write element, and start, stop and metering of material in response to programmed information. In FIG. 1 the control system and its connections to the mechanical system are not shown in detail.

In the perspective view of FIG. 2A, a typical base plate and rail arrangement of the preferred embodiment are illustrated, showing only the main framing elements and the bearing and rail arrangements to provide the precise x, y, and z movements needed for circuit writing. In the preferred mode, baseplate 15 is machined from a single, solid piece of steel, about 990 mm. in length (D1), about 840 mm, in width (D2) and about 25 mm. thick. (D3), to provide rigidity. In the preferred mode, cutouts are made in the main body of the baseplate for the purpose of reducing the weight of the member, although these cutouts are not shown in FIG. 2A, and are not otherwise functional.

It should be apparaent to those skilled in the art that traces made on a printed circuit board by the circuit writer must typically be quite small in cross section. With the apparatus of the invention, a trace of 12 mils in width and 6 mils high is typical, although narrower or wider traces can be written. The traces typically have an arcuate cross-sectional shape and are generally semiciruclar or hemi-elliptical in cross-section so that at times the thickness is somewhat less than 50% of the width, but in general the thickness is in the preferred mode typically at least 25% of width and preferably much thicker than the 25%. By having traces that are narrower but thicker, the trace density on the surface of the circuit board may be increased. Also, a trace may be required to be quite long in a circuit plan in order to electrically connect elements mounted on a board, and separate traces may be required to be quite close together. It is not unusual for traces that must not touch in a wiring scheme to be within 10 mils of one another. Because of the small and critical dimensions of the typical geometry of a printed circuit board, it is very important that the mechanisms that transport the write carriage be mounted to a flat and stable base, or that any variations in the flatness or stability of the base be accounted for in the drive apparatus. Hence, in the preferred embodiment, the base and other framing elements are relatively massive to provide the needed stability. A further advantage of using massive framing elements is that they also exhibit a correspondingly high thermal mass, and are therefore slow to change in dimension in response to changes in ambient temperature.

In the typical arrangement of FIG. 2A, rail assembly 11 includes a T-rail 45, a hardened, ground shaft 47, and three supports 49, 51, and 53 respectively. Supports 49, 51, and 53 are machined from single blocks of steel and are relatively massive to provide dimensional stability. the supports are mounted to the base plate by fasteners (not shown), and the T-rail is mounted to the supports by fasteners (not shown). Ground shafting 47 is mounted to the top of the T-rail by bolts (not shown) so that the shaft is centered laterally on the rail. The assembly is such that the center of shaft 47 is typically 125 mm. (D4) above the upper surface of base plate 15, and the centerline of the shaft is parallel to the long side of the base plate.

Rail assembly 13 is similar to rail assembly 11 and includes T-rail 55, ground shaft 57, and supports 59, 61 and 63. Shaft 57 is at the same height (D4) above the top surface of base 15 as is shaft 47, and is parallel to shaft 47, so that the two shafts together form a parallel dual-track for restraint of the write carriage in the x-direction. Spacing D5 between the shafts is typically about 840 mm., and commercially available ground shafting, such as Case 60 shafts from Thompson Industries is suitable, although other forms of shafting may be used. The x-direction rail set is substantially centered on base 15 in both the x and y directions, which directions are noted by arrows 65 and 67 respectively.

As indicated earlier, there are two saddle carriages 17 and 19 that carry linear bearings to constrain movement in the x-direction. Saddle carriage 17 is associated with rail assembly 11 and saddle carriage 19 is associated with rail assembly 13. Each saddle carriage supports a mounting block. Mounting block 69 is fixedly attached to saddle carriage 17 and mounting block 71 is fixedly attached to saddle carriage 19. Cross-rail assembly 21 fastens to both mounting blocks so that they are rigidly held together and move together in the x-direction carrying cross-rail assembly 21.

Figure 2B:
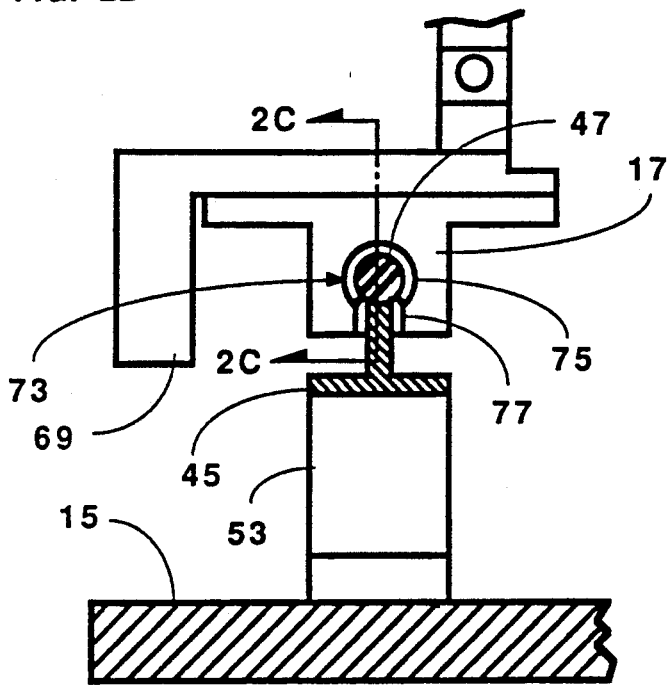
FIG. 2B shows a cross section through a rail assembly adjacent to a saddle carriage viewed in the x-direction, perpendicular to the length of the rail assembly, and illustrates elements making up the saddle carriage.

As illustrated in FIG. 2B, which shows a cross section through rail assembly 11 adjacent to saddle carriage 17 viewed in the x-direction, perpendicular to the length of the rail assembly, saddle carriage 17 has a lengthwise opening 73 having a round through-bore 75 and a rectangular slot 77.

Figure 2C:
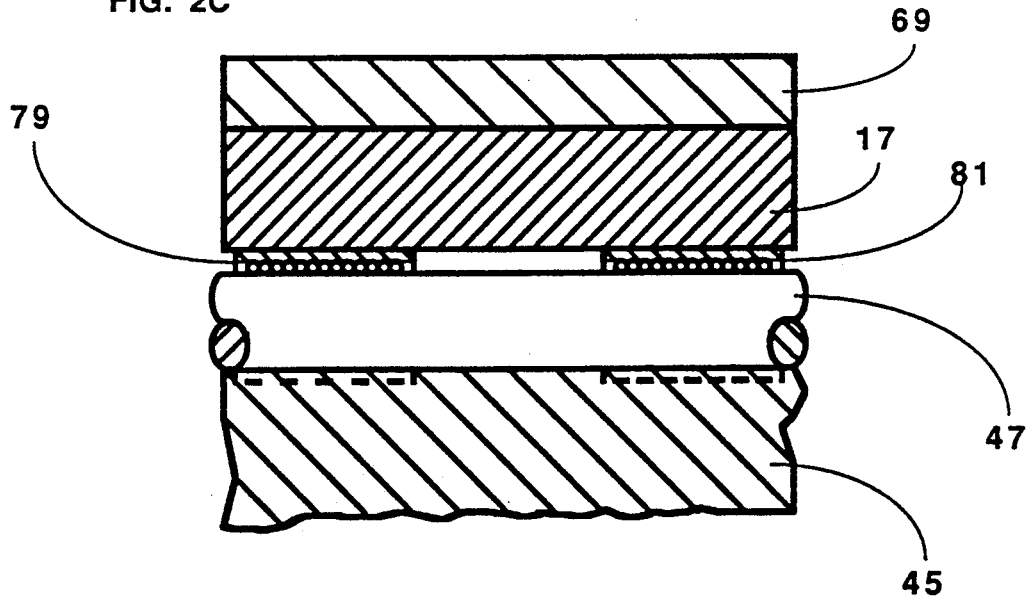
FIG. 2C shows a section view along cut A—A of FIG. 2B.

As illustrated in FIG. 2C, which corresponds to section A—A of FIG. 2B along the length of through-bore 75 and rectangular slot 77, linear bearings 79 and 81 mount to the inside of through-bore 75 and engage shaft 47, constraining saddle carriage 17 to travel along shaft 47. Bearings 79 and 81 may be split ball bushings, such as Series XR extra rigid open type ball bushings made by Thompson Industries, although other similar products may be used. The open type ball bushing does not completely enclose the shaft, but has an opening so that the shaft the bearing engages may be supported along the entire length of the shaft, adding to the rigidity of the mechanical system. FIG. 2B shows bearing 79 from the end view, with the bearing open for the width of slot 77. Slot 77 is wider than the upright portion of T-rail 45 so that carriage 17 may move along the length of shaft 47 without interference. The mounting of saddle carriage 19 on shaft 57 is accomplished with an assembly similar to the assembly shown for saddle carriage 17.

Figure 2D:
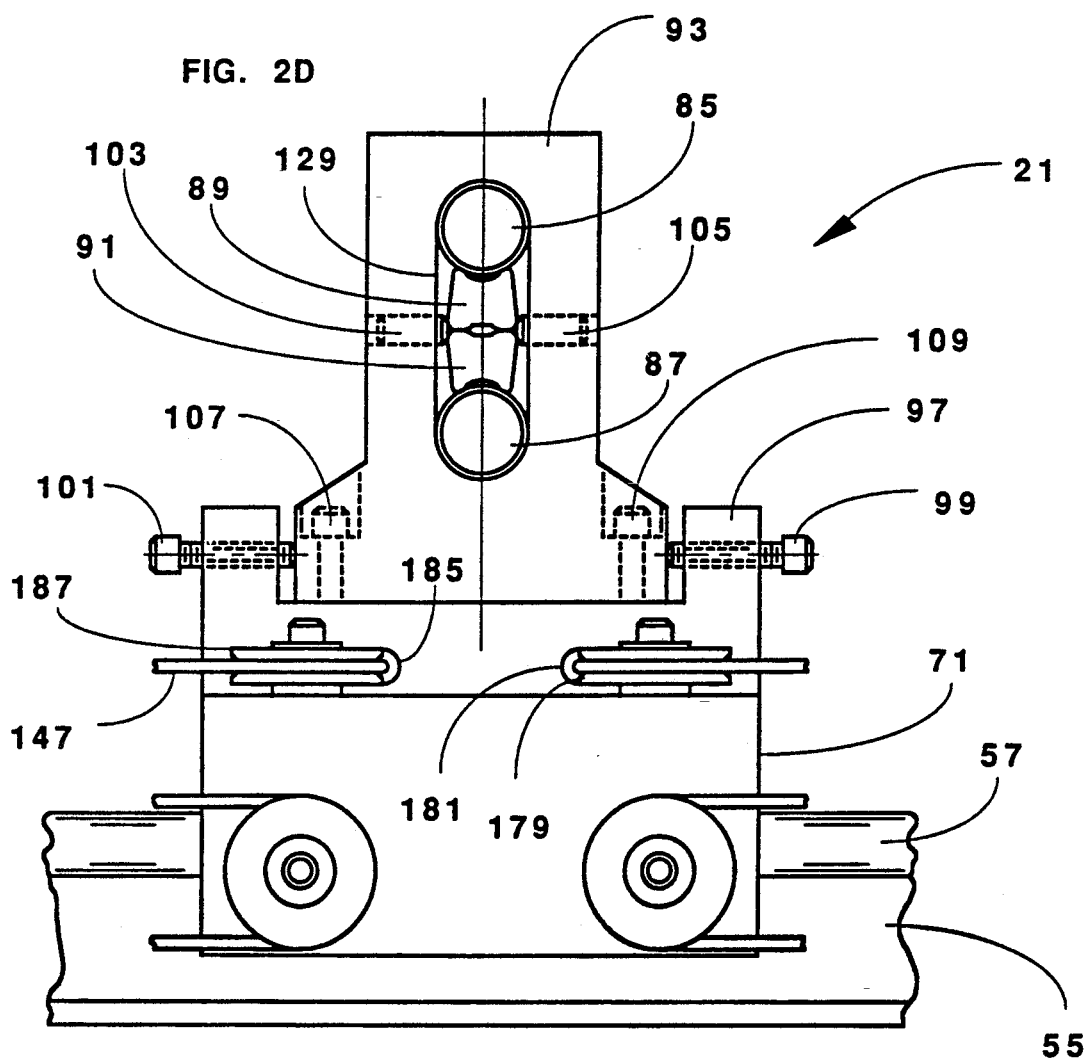
FIG. 2D shows an end view of a cross-rail assembly according to the invention.

In the end view of cross-rail assembly 21 shown in FIG. 2D, a stanchion saddle 97 is shown rigidly attached to mounting block 71, which rides on saddle carriage 19 (not shown). A cross-rail stanchion 93 is mounted to stanchion saddle 97 by means of fasteners 107 and 109, and adjustment screws 101 and 99, each threaded through a separate upright portion of stanchion saddle 97, bear on opposite lower faces of stanchion 93. The holes in stanchion 93 through which fasteners 107 and 109 pass are sufficiently large relative to the diameter of the fasteners that the position of stanchion 93 may be adjusted relative to saddle 97 within the limits imposed by the saddle. The use of this adjustment, along with a similar arrangement associated with saddle carriage 17 on the opposite x-direction rail assembly, is to square the cross-rail assembly with the x-direction rail assembly. When the positions are correct, the fasteners holding stanchion 93 and a similar stanchion 95 on the opposite x-direction rail assembly may be secured, providing a rigid assembly. FIG. 2G provides a view from the opposite end of the cross-rail assembly looking in the direction of arrow 84 of FIG. 2A, and shows elements that make up that end of the cross-rail assembly.

Cross-rail assembly 21 has two hardened and precision ground shafts that are similar to shafts 47 and 57 of the x-direction rail assemblies. The shafts are arranged horizontally in the assembly, one above the other, and orthogonal to the x-direction rail assemblies. Shaft 85 is the upper of the two and shaft 87 the lower. The two shafts fit into a vertical slot 129 that is machined through stanchion 93 and has rounded upper and lower ends. The radius of each rounded end is substantially the radius of shafts 85 and 87. The shafts are spaced apart and held in position by two spacer rails 89 and 91, which are themselves held in position by set screws 103 and 105. Stanchion 95, carried on saddle carriage 17 (FIG. 2A), supports the opposite ends of shafts 85 and 87 and spacer rails 89 and 91 so that shafts 85 and 87 form an over-under cross-rail assembly at right angles to the x-direction rail assemblies. Movement in the direction of the length of the cross-rail assembly is (convention) the y-direction.

Figure 2E:
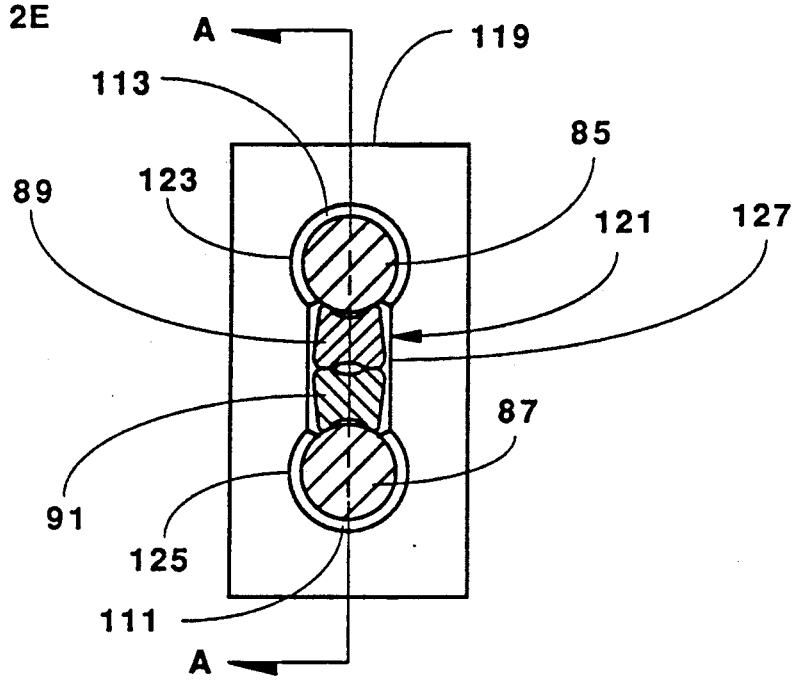
FIG. 2E shows a cross-sectional view taken through shafts and spacer rails that are adjacent to a write carriage according to the invention.

The section view of FIG. 2E taken through shafts 85 and 87 and spacer rails 89 and 91 adjacent to write carriage 23 (FIG. 2A) shows a solid base block 119 that has a machined passage 121 with two round bores 123 and 125 and a connecting rectangular slot 127. The center spacing between bores 123 and 125 is the same as the center spacing between shafts 85 and 87 in the cross-rail assembly.

Figure 2F:
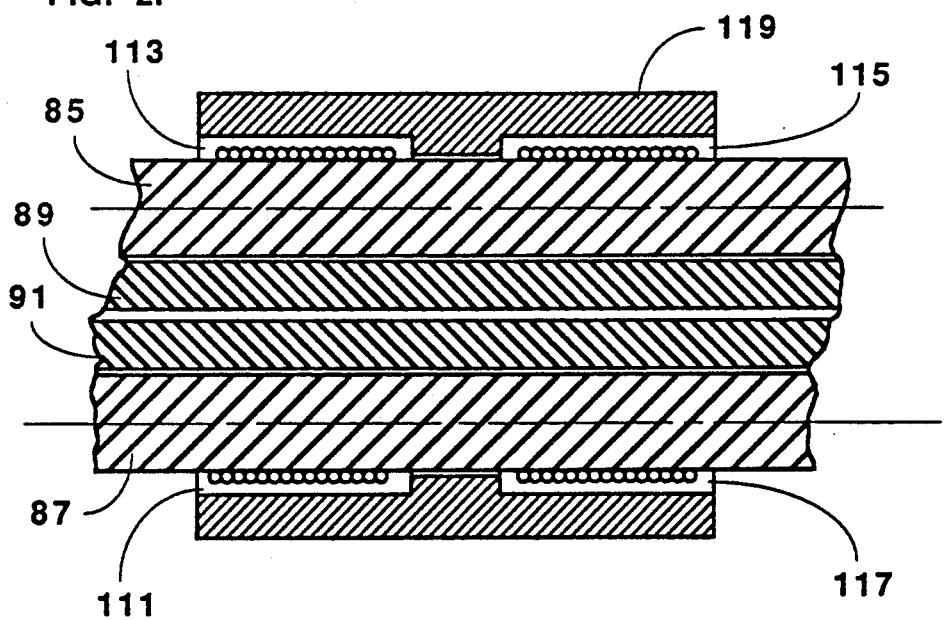
FIG. 2F shows a view through section A—A of FIG. 2E through a write carriage base block according to the invention.
Figure 2G:
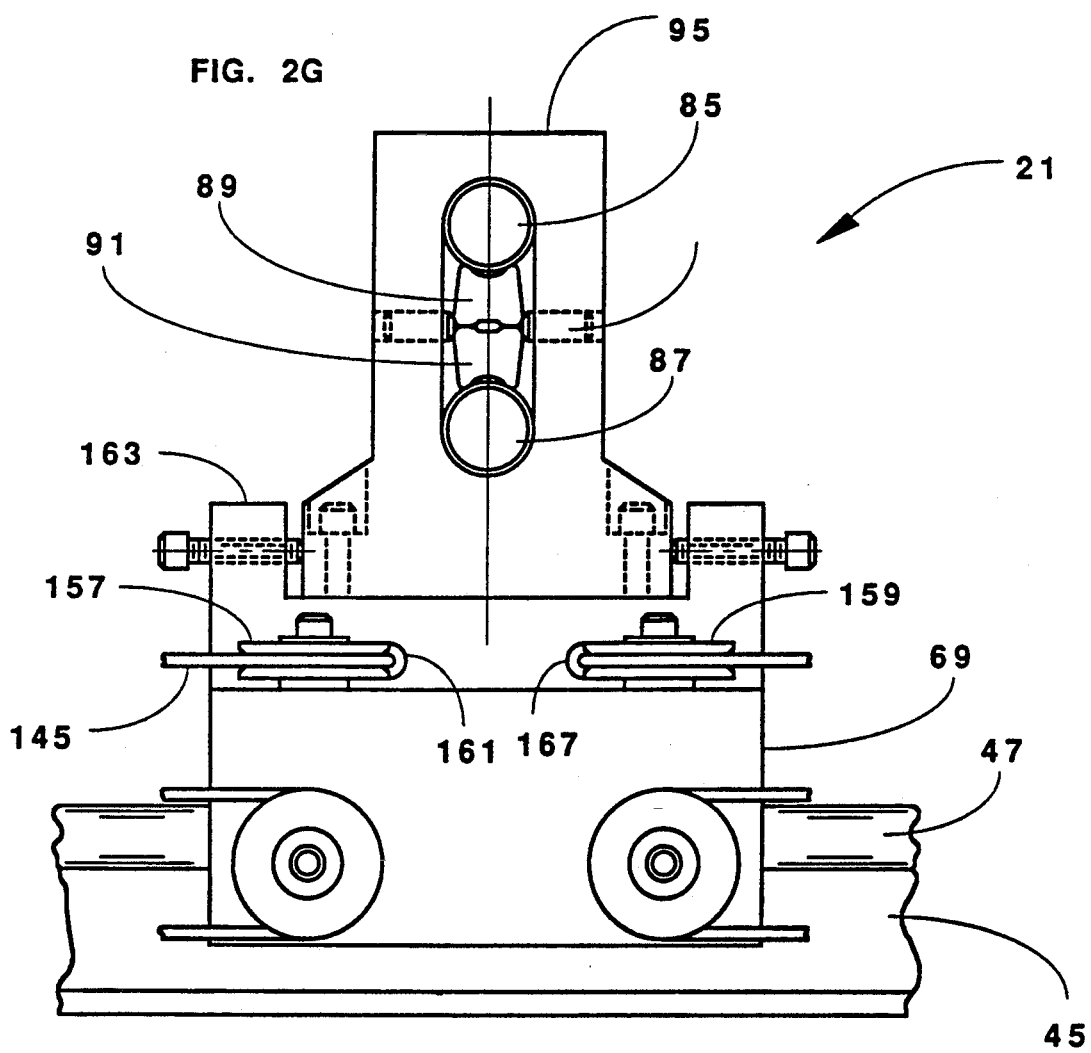
FIG. 2G shows the opposite end view of the cross-rail assembly and is similar to FIG. 2D.

As illustrated in FIG. 2F, which is a view of section A—A of FIG. 2E through the write carriage base block, linear bearings 111 and 113 are assembled into bore 125 and 123 respectively on one side of block 119, and engage shafts 87 and 85. Linear bearings 115 and 117 assemble into block 119 on the opposite side from bearings 113 and 111, and also engage shafts 85 and 87. The bearings are split linear ball bushings of the same kind used in the x-direction rail assemblies, and the arrangement constrains carriage base block 119 to travel only in the y-direction relative to shafts 85 and 87. Block 119 forms a base upon which elements of the write carriage may be firmly mounted. Structural plates, framing elements, and other elements of the write carriage are mounted to the block by means of tapped holes (not shown) in the block.

Figure 2H:
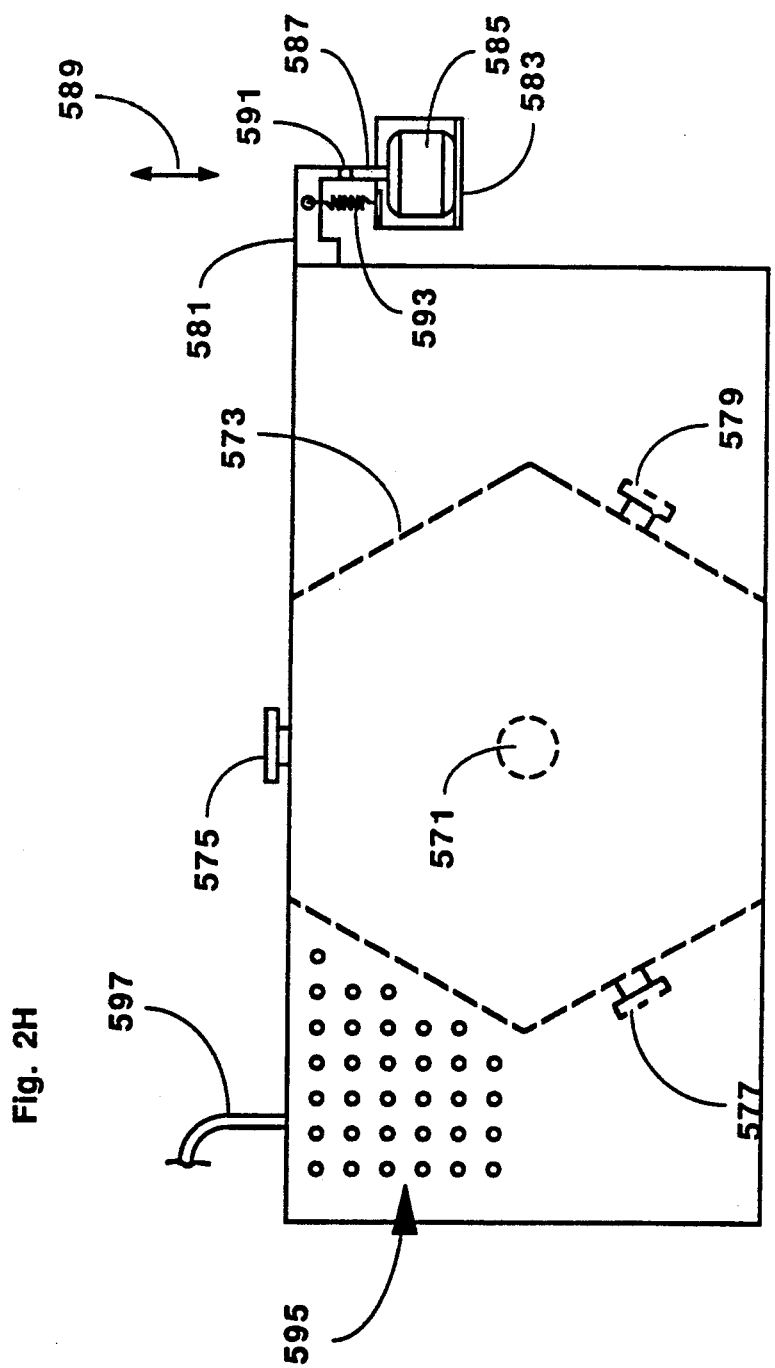
FIG. 2H is a plan view of a write table as used with preferred embodiments of the invention showing elements not shown in other figures.

FIG. 2H is a plan view of a write table 33 of general utility with various embodiments of the circuit writer showing elements not seen in other views. The write table is mounted pivotally to a pivot pin 571 that is turn firmly attached to base plate 15. A lower portion 573 of the write table has three wheels 575, 577, and 579 that are attached to portion 573 and that roll on the upper surface of base 15. The arrangement is such that the write table may rotate relative to the base around the center of the pivot pin, which, in the preferred mode is located substantially at the center of the write table. The weight of the table is borne by the wheels. The mounting of the table to the pivot pin and of the wheels to the table is with a minimum of mechanical clearance, typically less than one-half mil, so that there can be little motion of the table in any way other than rotationally around pivot pin 571.

A bracket 581 is fixed to one corner of table 33 as an operating arm for controlling the rotational position of the table relative to the base and other elements of the circuit writer. A separate bracket 583 is mounted to base 15 and holds a linear actuator 585. A shaft 587 of the linear actuator extends or retracts in the directions shown by arrow 589, and has a spherical end cap 591. A tension spring 593 attached at one end to bracket 581 and at the other end to bracket 583 urges the table bracket at all times against the actuator shaft. Linear actuator 585 is operated through computerized control system 43, and is used to rotate the write table within a relatively small arc, typically five degrees, in alignment procedures after mounting a blank to the write table and before circuit writing commences.

One method by which a pcb blank may be fixed to the write table for a circuit to be written is to use vacuum. In a preferred embodiment, the upper portion of the write table is a vacuum chuck. In FIG. 2H a number of small holes 595 are shown opening to the upper surface of the write table. The holes are shown only over a small area of the upper surface to avoid obliterating other details, but in the actual device, there are similar holes over substantially all of the upper surface of the write table where a blank pcb might contact. The holes are connected internally and terminate at a tubing connection 597 that leads to vacuum apparatus (not shown in FIG. 2H). A typical approach for providing these holes in the upper surface of the write table is to use sintered metal spheres for the write table surface. Although vacuum alone could be used as a board hold down mechanism, such an approach would be excessively noisy, Since the pcb blank typically has holes in it for mounting components. Hence, in the preferred mode, a sheet of tape such as that typically used in the semiconductor industry (i.e. a tape which leaves no residue when removed) is placed over the upper surface of the write table and the vacuum holds the tape securely in place. Then the pcb blank is placed on top of the tape and the blank is held in place by the adhesive quality of the tape.

Figure 3A:
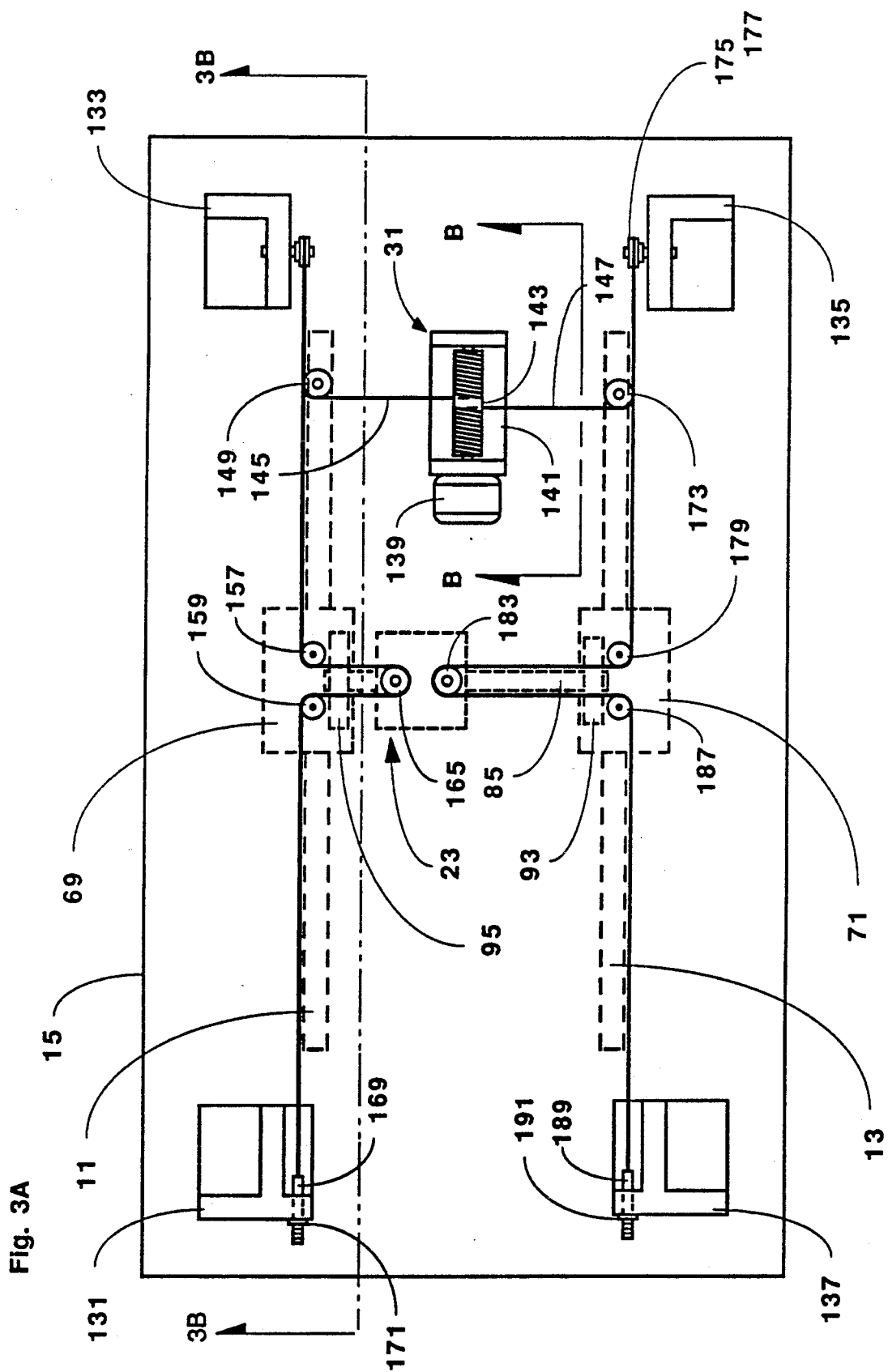

The method in the preferred embodiment by which write carriage 23 is moved in the Y-direction is shown in FIGS. 3A and 3B. In FIG. 3A, rail assemblies 11 and 13, mounting blocks 69 and 71, stanchions 93 and 95, upper cross-rail shaft 85, and write carriage 23 all are shown in phantom view. Four relative massive corner posts 131, 133, 135 and 137 are mounted firmly to baseplate 15 with conventional fasteners (not shown). The corner posts serve as anchors to the frame for drum-driven cable assemblies by which both x- and y-direction movement are accomplished.

FIG. 3B, which is a view of section A—A of FIG. 3A, shows corner posts 131 and 133 in elevation, as well as the placement of various elements of the cable arrangement by which y-motion is accomplished.

Figure 3C:
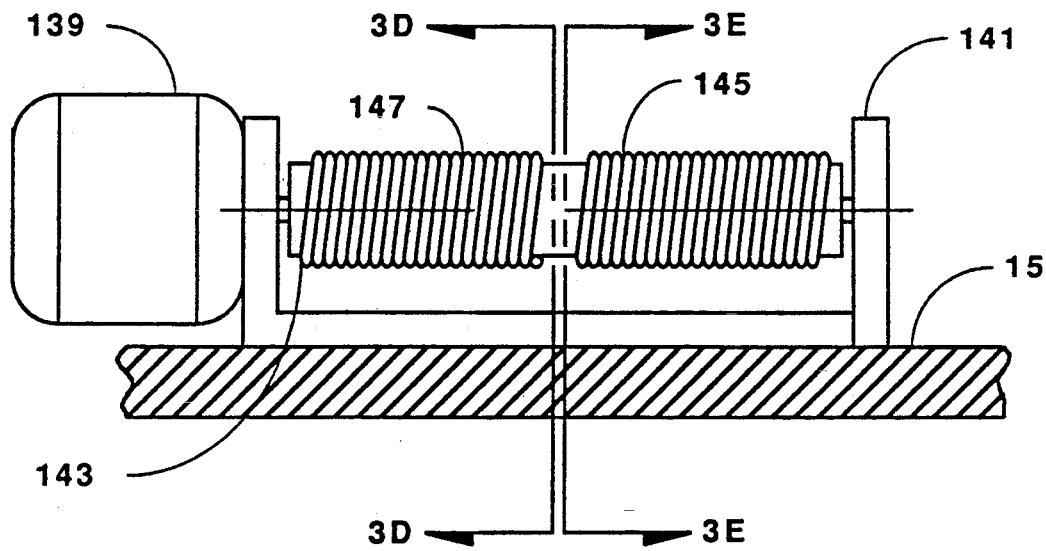
FIG. 3C shows a view through section B-B of FIG. 3A, and illustrates, in elevation, a y-drive system according to the invention.

Motive power for moving the write carriage in the y-direction is provided by drive 31, which incudes a stepper motor 139, a framing assembly 141 and a cable drum 143. FIG. 3A shows y-drive 31 in plan view. FIG. 3C, which is a view of section B—B of FIG. 3A, shows y-drive 31 in elevation. Drum 143 is pivoted between two upright portions of frame assembly 141, and is driven by the output shaft of motor 139 from one end. The frame assembly is firmly mounted to base 15 by fasteners (not shown).

Figures 3D, 3E:
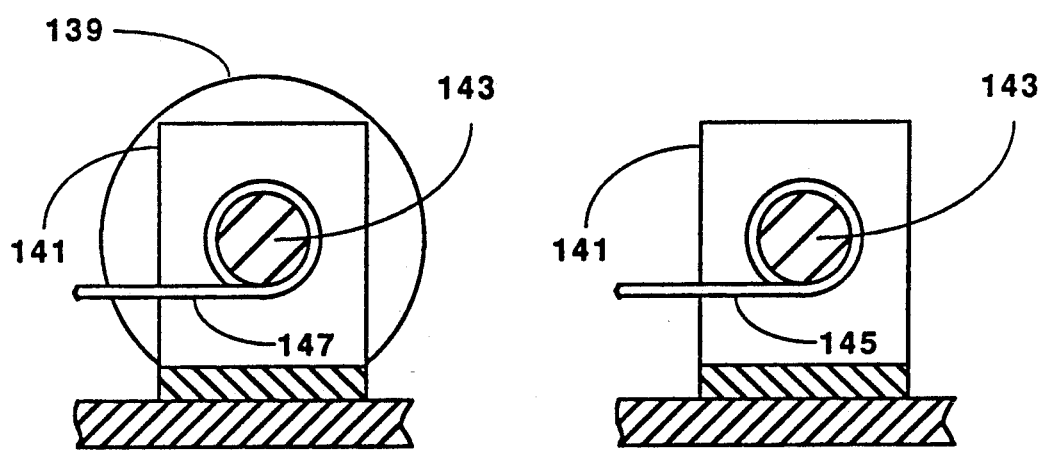
FIG. 3D shows a view through section C—C of FIG. 3C.
FIG. 3E shows a view through section C'—C' of FIG. 3C.

In the preferred mode, there are two high-strength, braided steel cables involved in the operation of the y-drive. Cable 147 is wrapped on drum 143 beginning at the end closest to the motor, and anchored at that end of the drum, and exits the drum from underneath, extending toward the side of the circuit writer occupied by corner brackets 135 and 137. The wrap on the drum is single, with each turn around the drum immediately adjacent the next. FIG. 3D shows a view of section C—C through the drum, and shows cable 147 as it exits from under the drum. Cable 145 is wrapped on the drum beginning at the end opposite the motor connection, and also exits from cnder the drum, but in the opposite direction from cable 147, toward the side of the circuit writer occupied by corner brackets 131 and 133. FIG. 3E is a view along section line C'—C' of FIG. 3C showing cable 145 as it exits from the drum.

Because cable is wrapped at just one level on the drum, and the two cables are wrapped around the drum is opposite rotation from one another, rotation of the drum in one direction will cause one cable to be wrapped on the drum and the other to be played out from the drum at the same rate. In the view toward the motor of FIG. 3D, rotation of the drum clockwise will cause cable 147 to pay out from the drum, and cable 145 to be taken up on the drum at the same rate.

Cable 145 extends from drum 143 to a bearing-mounted pully 149 where it turns 90 degrees toward corner post 133. The positions of the pully and cable show in plan view in FIG. 3A. FIG. 3B (section A—A of FIG. 3A) shows pully 149 mounted atop a rigid support 151 which is firmly mounted to base plate 15. FIG. 3B is broken into four sections so the full length of the Circuit Writer can be portrayed in the one figure.

At corner post 133 there are two pulleys, pulley 153 and pulley 155, similar to pully 149, but arranged with the flat plane of the pulleys vertical, to change the height and direction of cable 145 while serving as a stable anchor point. Cable 145 passes around pulleys 153 and 155 and extends horizontally back in the x-direction at a height above the base plate just above the top surface of mounting block 69, which rides on saddle carriage 17. There are two pulleys, pulley 157 and pulley 159, on mounting block 69, arranged in a horizontal plane, and placed substantially side-by-side. The position of these two pulleys on block 69 relative to other elements is shown in elevation in FIG. 2G.

Cable 145 from pulley 155 turns 90 degrees around pulley 157, passes through a hole 161 in a stanchion saddle 163 (similar to stanchion saddle 97), and extends in the y-direction toward write carriage 23. Base block 119 of the write carriage has a pulley 165 mounted to the underneath side in a horizontal plane at the same height as pulleys 157 and 159. Cable 145 makes a 180 degree turn around this pulley, extends in the y-direction back toward mounting block 69, passes through a second hole 167 in stanchion saddle 163 and turns 90 degrees around pulley 159 to extend toward corner bracket 131. At corner post 131 cable 145 is firmly anchored to an anchor pin 169 that passes through a portion of the corner post. Pin 169 is threaded and includes a nut 171 so that turning nut 171 will tend to take up cable 145 and loosening the nut will provide slack in cable 145. Cable 145 is anchored to drum 143, so tightening nut 171 will add tension to the cable.

Cable 147, also anchored to drum 143 at the opposite end of the drum from cable 145, extends from the drum to a pulley 173, similar to pulleys 149, mounted on a support similar to support 151, attached to base 15. Cable 145 turns 90 degrees around pulley 173 and extends toward corner post 135. At the corner post, cable 147 turns around pulleys 175 and 177, and extends back toward saddle carriage 19, where it turns 90 degrees around a pulley 179, passes through a hole 181 (FIG. 2D) in stanchion saddle 97 and extends to a pulley 183, which is mounted underneath write carriage 23 near pulley 165. Both pulley 165 and pulley 183 are securely mounted to base block 119, which forms the base of the write carriage.

Cable 147 turns 180 degrees around pulley 183, extends back toward mounting block 71, and passes through a hole 185 in stanchion saddle 97. The cable turns 90 degrees around a pulley 187 and extends to corner post 137 where it is firmly attached to an anchor pin 189 similar to anchor pin 169 that anchors cable 145 at corner post 131. Anchor pin 189 has a nut 191 which is used to adjust tension in the cable system.

Clockwise rotation of drum 143 (FIG. 3D) wraps cable 145 onto the drum and unwraps cable 147 from the drum at exactly the same rate. This action causes the overall length of cable 145 in the arrangement of pulleys between drum 143 and anchor 169 at corner post 131 to shorten, and the overall length of cable 147 between the drum and anchor 189 at corner 137 to lengthen by the same amount. The distance between the drive assembly and each of pulleys 149 and 173 cannot change, because all three are securely mounted to base 15, as are all four corner posts. The only place that the dimension change can be accommodated is in the position of the write carriage, which is mounted on ball bushings and can move along the cross-rail assembly.

Rotation of drum 143 clockwise shortens the effective length of cable 145, which moves the write carriage toward x-direction rail assembly 11. Specifically, the write carriage will move by a distance equal to one-half the dimension that the cable is shortened. If, for example, the drum is rotated by an amount sufficient to shorten the effective length of cable 145 by 4 cm., the write carriage will move 2 cm. The same rotation will add 4 cm. to the effective length of cable 147, so the write carriage won't be constrained from moving by cable 147 around pulley 183.

To perform the precise movements required for circuit writing, backlash or dimensional instability can cause serious errors in making circuit connections. Hence, in the preferred mode, this dimensional instability is typically limited to ±2 mils maximum. The adjustable anchor pins are used accordingly to preload the cables to a tension near (but not equal to) the elastic limit of the cables. In addition the cables are worked and stressed prior to installation to eliminate any minute kinking. Together, these efforts eliminate any plastic or non-linear elastic deformation in the cables during operation and substantially all backlash. Another important result of the arrangement of the cables on the drum is that any elastic deformation on one side of the apparatus is precisely balanced by an equal amount of elastic deformation on the other side. For example, in the y-direction cable assembly, the angle between each of cables 145 and 147 and the axis of rotation of drum 143 is 90 degrees only at the point in operation that the write carriage is midway in its limit of travel, i.e. halfway between saddle-carriage 17 and saddle carriage 19. As the drum rotates, cables 143 and 145 wrap and unwrap on drum 143, the angle changes, and the tangential points of contact of the two cables with the drum (i.e. where they leave the drum and extend toward pulleys 173 and 179, respectively) move together, along the length of the drum, one direction or the other, depending on which direction the drum is rotating. This movement of the tangential points of contact (or, equivalently, the change in angle between the cables and the axis of the drum) results in stretching and relaxing of the cables. Ensuring that the points of contact move together, e.g. by using the single wrap of each cable from opposite ends of the drum, and that they are substantially equidistant from pulleys 173 and 179, so that each cable is stretched or relaxed by substantially the same amount as the drum rotates, ensures that stress in each cable is identical, so that precise movements of the carriage assembly are directly related to how far the cables are moved, and are not a function of the stress in the cables.

The operation of the write carriage in the y-direction is independent of the position of the cross-rail assembly in the x-direction. Movement in the x-direction along rail assemblies 11 and 13 will cause pullies 159, 157, 165, 183, 179 and 187 to rotate, but will not affect the effective length (off the drum) of either y-direction cable.

X-direction movement is accomplished by a second cable drive independent of the y-direction drive. FIG. 4A is a plan view of the drive, similar to FIG. 3A, except y-direction cable drive 31 is not shown. Drive 29 shown is a motor driven drum cable drive similar to drive 31, but with a different cable arrangement, for moving the cross-rail assembly in the x-direction on the bearings associated with saddle carriages 17 and 19 on rail assemblies 11 and 13.

Figure 4B:
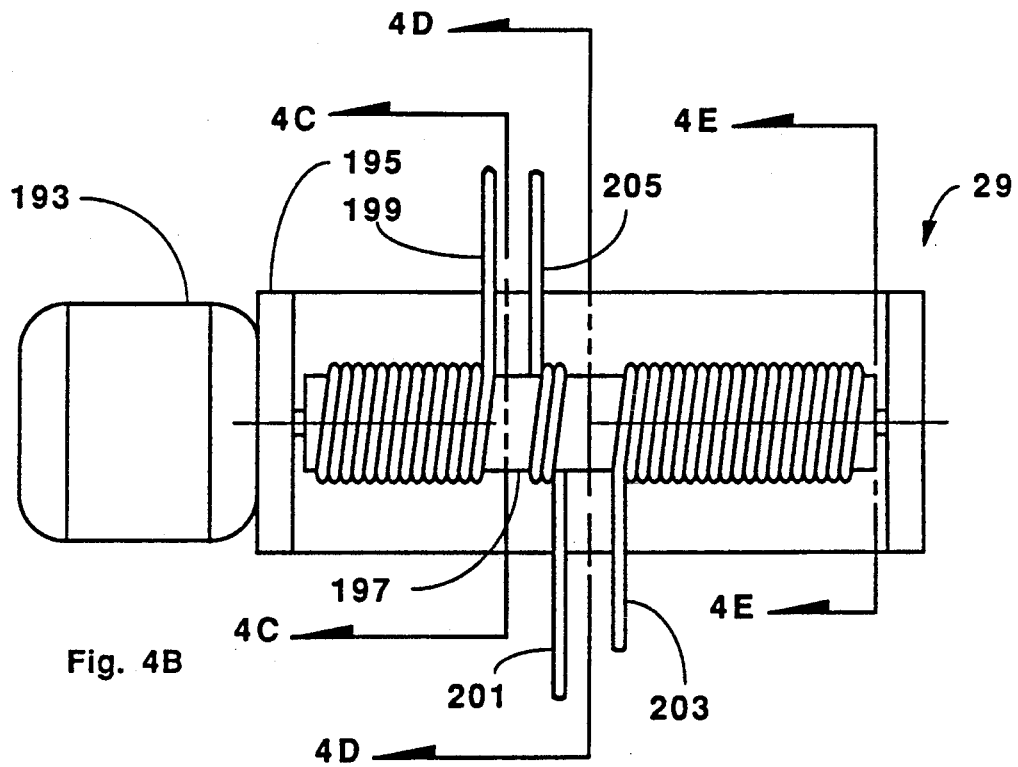
FIG. 4B shows an expanded view of a drive motor and drum used in the x-motion assembly of FIG. 4A, illustrating wrapping of cable on the drum.

There are four extensions of cable from x-drive 29 shown in FIG. 4A. These are extensions 199, 201, 203 and 205, although the plan view of the x-drive in FIG. 4A is indicative only, and does not show detail of the wrap of the cables on the drum. FIG. 4B is an enlarged plan view of x-drive 29, and shows the elements and cable arrangements in further detail. The drive has a mounting bracket 195, a cable drum 197 and a drive motor 193 for turning the drum. Cable 199 is wrapped from the mtor end of drum 197 and exits from the top of the drum to one side. Cable 203 is wrapped from the end of the drum away from the motor opposite to the wrap of cable 199 and exits from the top of the drum to the side opposite the exit direction of cable 199.

Cable 201 and 205 are seen to be a single cable wrapped on the drum between cables 199 and 203, with both end exiting from the bottom of the drum and in opposite directions. Extension 205 is in the same direction as cable 199, and extension 201 is in the same direction as cable 203. For convenience sake in description, the two extensions of the single central cable will be treated as two cables, and will be referred to as cables 205 and cable 201.

Figure 4C:
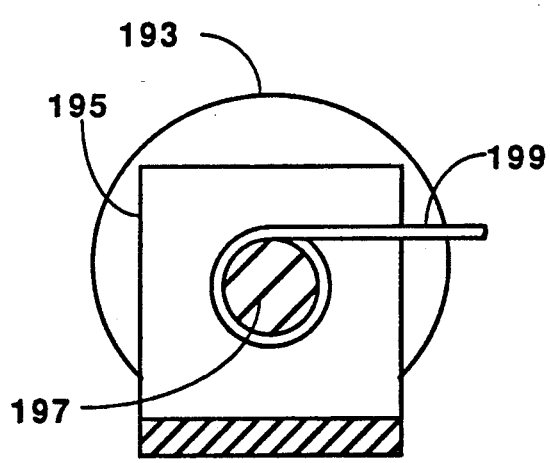
FIG. 4C shows a view through section A—A of FIG. 4B.
Figure 4D:
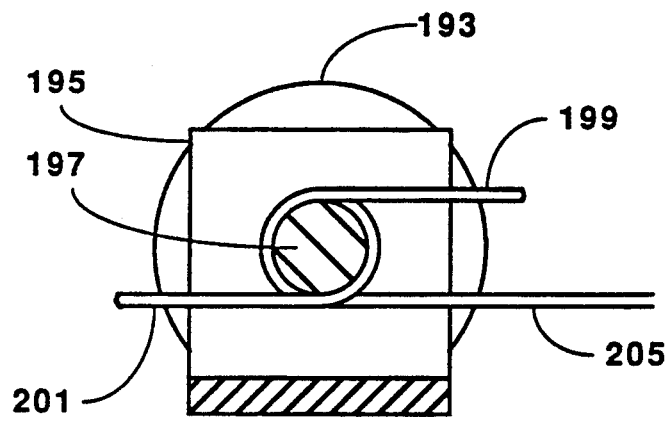
FIG. 4D shows a view through section B—B of FIG. 4B.
Figure 4E:
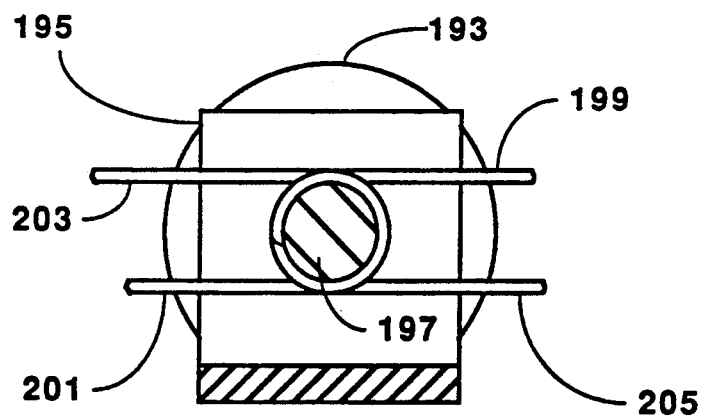
FIG. 4E shows a view through section C—C of FIG. 4B.

FIG. 4C is section A—A of FIG. 4B, and shows cable 199 extending to one side from drum 197. FIG. 4D is section B—B of FIG. 4B and shows cables 201 and 205 in addition to cable 199. FIG. 4E is section C—C of FIG. 4B and shows cable 203 in addition to the other cables. In the view of FIG. 4E clockwise rotation of drum 197 will extend cable 199 to one side and cable 201 to the other, while taking up cable 205 and cable 203.

Figure 4F:
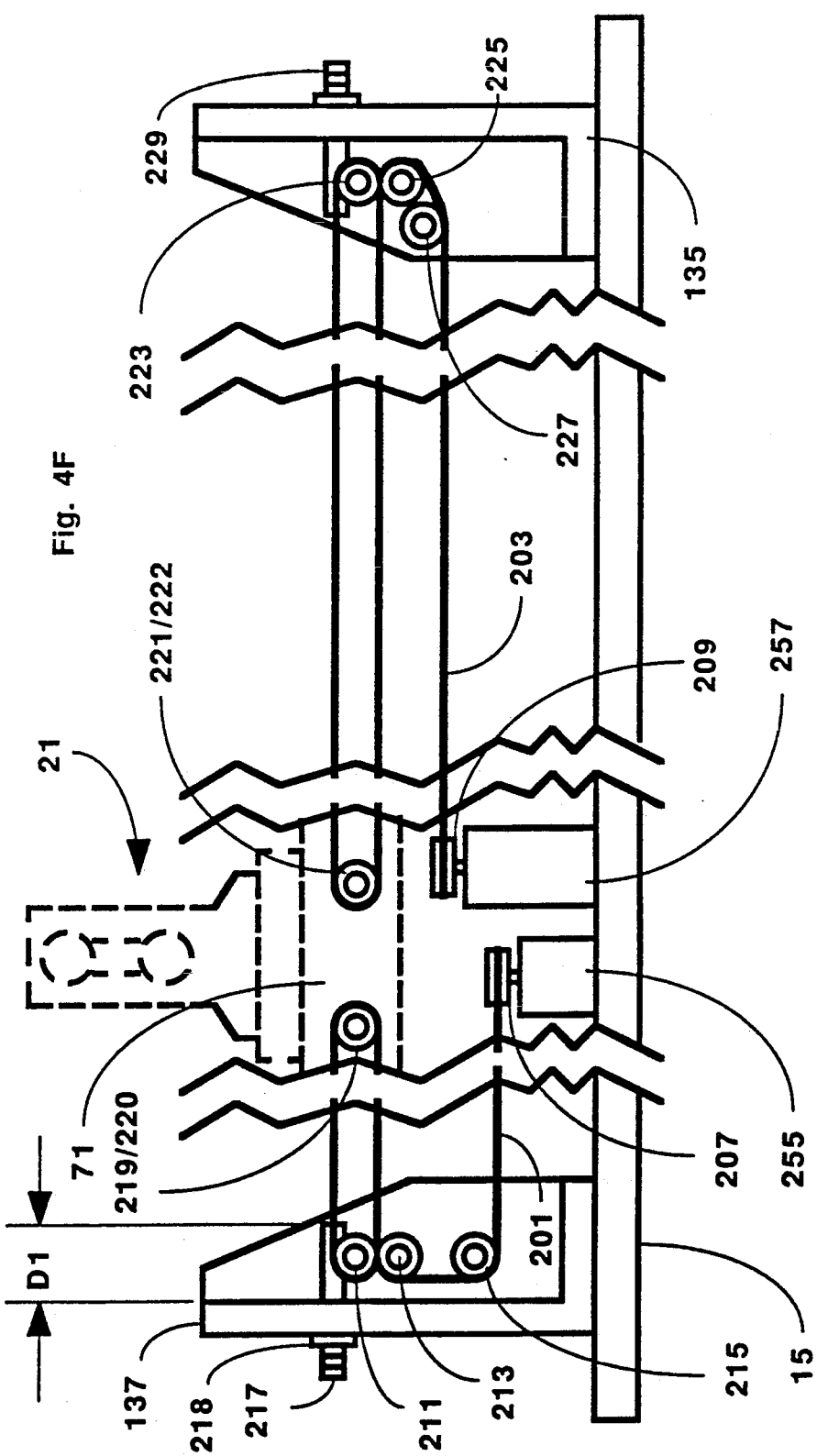
FIG. 4F shows an expanded view through section A—A of FIG. 4A.
Figure 4G:
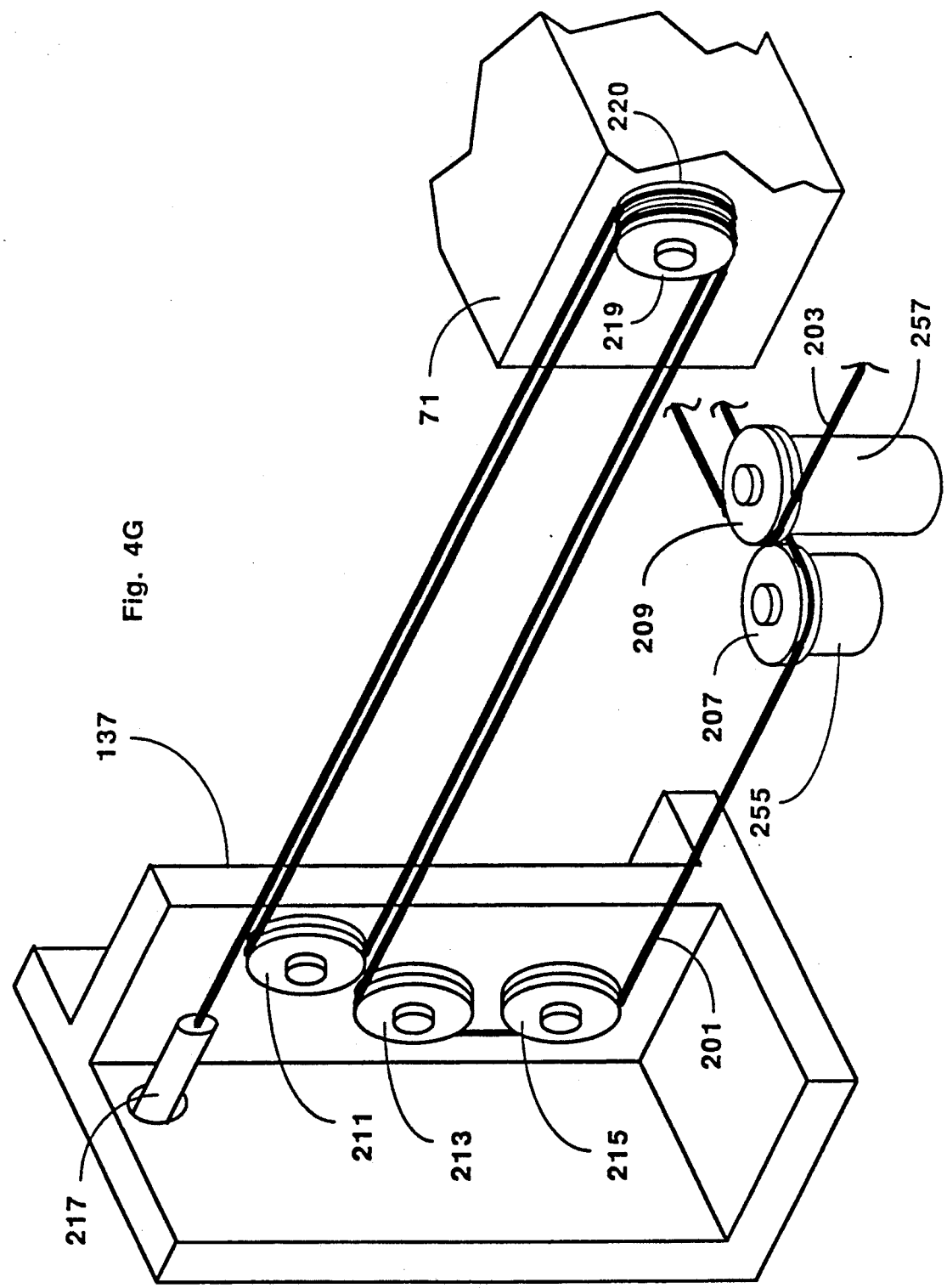
FIG. 4G shows an oblique view of a portion of one end of a preferred embodiment of the invention.

Referring to FIG. 4A, cable 201 extends to one side of the circuit writer to a pulley 207 mounted on a stanchion 255 mounted in turn to baseplate 15, then extends to corner post 137. At the corner post cable 201 passes around two pulleys 215 and 213 which change the direction and the height. Cable 201 then extends toward mounting block 71. These elements and arrangements are shown also in FIG. 4F, which is an elevation view from vantage A—A of FIG. 4A, and in FIG. 4G, which is an oblique view looking toward corner post 137. It is helpful to refer to each of these views to understand the relationships.

At mounting block 71 cable 201 turns 180 degrees around a pulley 219, extends back to corner post 137, turns around a pulley 211, and extends back toward mounting block 71. At the mounting block, cable 201 turns around another pulley 220 which is mounted adjacent to pulley 219 but turns independently. The cable then returns to corner post 137 where it is fastened to a cable anchor 217 which may be adjusted with a nut 218. There are four "passes" of cable 201 between corner post 137 and mounting block 71. As a result, taking up 4 centimeters of cable 201 onto drum 197 will move mounting block 71 by 1 centimeter.

Figure 4H:
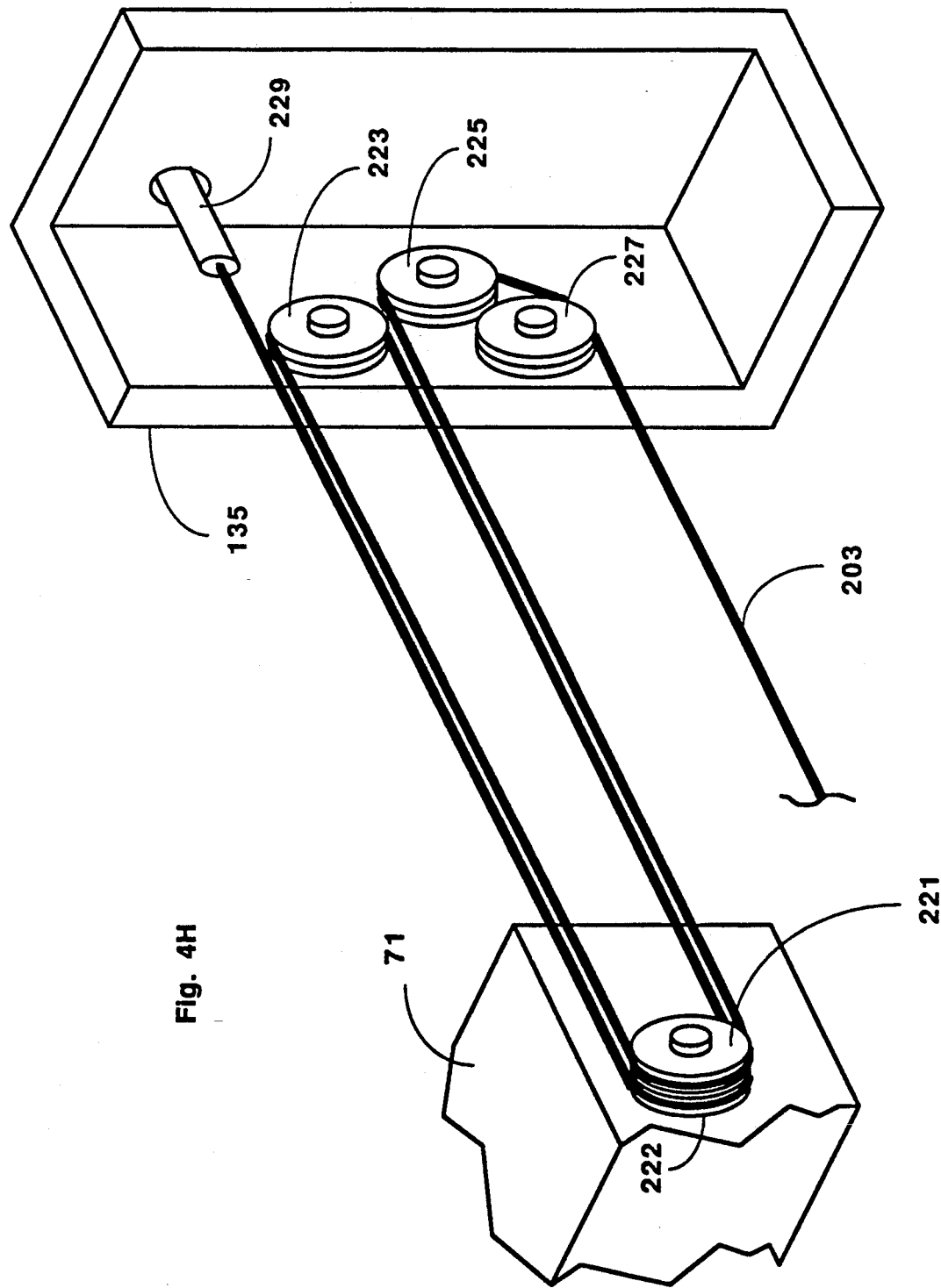
FIG. 4H shows an oblique view of a portion of the other end of the preferred embodiment illustrated in FIG. 4G.

Cable 203 extends to the same side of the circuit writer as does cable 201, turns around a pulley 209 on a stanchion 257, then goes to corner post 135 at the opposite end of the circuit writer from corner post 137. FIG. 4H is an oblique view looking toward corner post 135 showing these arrangements. At corner post 135 cable 203 turns around pulleys 227 and 225, changing height and direction, and extends toward mounting block 71. At mounting block 71 the cable turns around a pulley 221, goes back to corner post 135, around a pulley 223, goes back to mounting block 71, around a pulley 222 mounted adjacent to but separate from pulley 221, and extends back to corner post 135 again, where it anchors to cable anchor 229. As cable drum 197 turns in one direction, cable 201 is extended while cable 203 is taken up by the same amount, urging mounting block 71 in one direction. Turning the cable drum in the opposite direction has the opposite effect, moving the mounting block in the opposite direction.

Cables 199 and 205 extend to the opposite side of the circuit writer from cables 201 and 203 (FIG. 4A) and move mounting block 69 in concert with mounting block 71 so that the cross rail assembly is moved smoothly in the x-direction along the x-rail assemblies 11 and 13. Cable 199 utilizes pulleys 231, 235, 237, 243, 239, and 244, and terminates at anchor 241. Cable 205 utilizes pulleys 233, 247, 249, 245, 251 and 246, and terminates at anchor 253 at corner post 133. Rotation of drum 197 in one direction will take up cables 199 and 201 while extending cables 203 and 205 by the same amount, urging the cross rail assembly toward corner posts 131 and 137. Opposite rotation urges the cross rail assembly the other direction. The cable anchors may be adjusted to apply tension to the cables to remove any minute kinks and to pre-stretch the cables to near the elastic limit, removing discrepancies due to cable strain. In this preferred embodiment, motors 139 of the y-drive and 193 of the x-drive are each preferably DC stepper motors. Those skilled in the art will understand that one could also use a high resolution servo-motor, or other motors having high resolution. In the preferred mode, the operation of these motors is managed by computer control system 43 (FIG. 1), which is used to drive these DC stepper motors as if they were synchronous to provide quite accurate motion, without taxing the computer system as would normally occur with a microstepped operation. Such an approach also is exceedingly quiet compared to many other approaches. The two motors are operated forward, reverse, start, stop, and at various speeds from 0 to about 5 rpm, independently of one another. The motors operate in response to a computer program generated from routing information for traces on a printed circuit board to be manufactured. As indicated earlier, the cable arrangements from the drives move cross-rail assembly 21 in the x-direction along rail assemblies 11 and 13, and write carriage 23 in the y-direction along cross-rail assembly 21. The coordinated movement of the two drives moves write extension 37 with two degrees of freedom above write table 33 in a manner that patterns in two dimensions may be traced using a pencil or pen.

FIG. 5 provides an example of a simple geometry that might be required for a trace on a pcb to be written by the circuit writer. Trace 259 represents a conductive trace applied by write extension 37 (not shown). Arrow 263 designates the x-direction with a + and a − to indicate an arbitrary convention of forward and reverse movement for the x-direction. Arrow 261 designates the y-direction, also with a + and a − indicating an arbitrary convention for forward and reverse drive.

Beginning at point 265, trace 259 extends along portion 269 at an angle of about 45 degrees with the x- and y-directions. For purposes of illustrating the operations of the circuit writer, it is assumed that trace 259 is written from point 265 to point 297. Portion 267 is written as a straight line at the angle by running the x-drive to move the write carriage in the +x-direction and the y-drive in the +y-direction at the same rate. Beginning at point 269, the speed of the x-drive is slowed relative to the y-drive, until at point 273 the y-drive has stopped and only the x-drive is running. The result is a curved portion 271. The rate of curvature is controlled by controlling the relative drive speeds. Portion 275 is a straight line extending in the +x-direction, and is accomplished by running only the x-drive. At point 277 the y drive begins to operate again. For the circular portion 279 extending to point 281, the x-drive speed decreases in a harmonic function while the y-drive speed increases in the same harmonic function out of phase with the x-drive function by a phase angle of 180 degrees. The result is the generation of a circular arc of 90 degrees, and at point 281 the x-drive is stopped and the y-drive is operating in the +y-direction.

Portion 283 of the trace is generated by the y-drive running with the x-drive stationary. There is no x-direction movement for this portion of the trace. At point 285 the x-direction drive starts again, and the x-direction speed increases in a harmonic function to point 287, then decreases in the same harmonic function to stop again at point 289. During this time the y-drive speed decreases in the +y-direction to point 287, then increases in the −y-direction to point 289. The result is a 180 degree circular arc from point 285 to point 289, generated in the same manner as circular arc 279, but for an additional 90 degrees. At point 289 the y-drive is running in the −y-direction, and the x-drive is stopped, generating a vertical portion from point 289 to point 291. At point 291 another circular arc is generated in the same manner as the other circular arcs, but with x-drive speed increasing harmonically and y-drive speed decreasing in the same harmonic function for a 90 degree arc. Portion 295 is a straight portion generated with the x-drive operating in the +x-direction, and the y-drive stopped, to point 297.

Computer control of the x-drive and y-drive stepper motors in response to pre-programmed information about desired trace locations and dimensions allows the desired traces to be generated by the circuit writer. The pre-tensioned cable arrangements illustrated allow the x-y information to be transferred to a pcb accurately. Traces can be generated at any angle and with both constant and variable rates of curvature relative to the x- and y-directions.

In practice, it has been found, however, that for simplicity in process control and in automatically determining routing paths for the various traces, it is generally preferable to avoid long sweeping arcs, and to avoid long runs at angles not parallel with the x- and y- axes of the apparatus, e.g. the line running at 45 degrees. Such traces are avoided by permitting only certain kinds of motions in the computer program that determines the optimum sequence of traces to be written. The program will be discussed subsequently when describing software control of the apparatus, and hereinafter will be called the "router".

FIG. 6A is a side elevation view of write carriage 23, and is in the same direction as FIG. 2E, and shows a section through the cross-rail assembly adjacent to the write carriage. The bearing and spacer assembly elements by which base block 119 rides in the y-direction along the cross-rail assembly are not identified in FIG. 6A. Mounting plates 277, 279, 281, and 282 fasten securely to base block 119, and form a structure upon which other elements of the write carriage are mounted. The particular arrangement of plates to form a mounting structure is not important as long as the various elements can be attached in the proper physical orientations. Hence, there are many other ways a mounting structure may be formed.

Clamp bracket 283 secured to the write carriage holds a three-way rotary valve 285 in a substantially vertical orientation, and material reservoir 35 is mounted to an opening through the valve by a gas-tight seal. Reservoir 35 contains uncured PTF material suitable for forming traces on a pcb. As indicated earlier, the material is in some instances an electrically conductive material, and in other instances is an electrically insulating material. A stepper motor 287 operates rotary valve 285 to start and stop the flow of material. A semi-rigid tubing 291, such as stainless steel tubing, extends from a lower opening of valve 285 to a write tip 293. A stepper motor 295 raises and lowers write tip 293 at the beginning and end of traces on a pcb, and maintains a critical height of the write tip above the surface of a pcb during the time that a trace is being written.

Figure 6B:
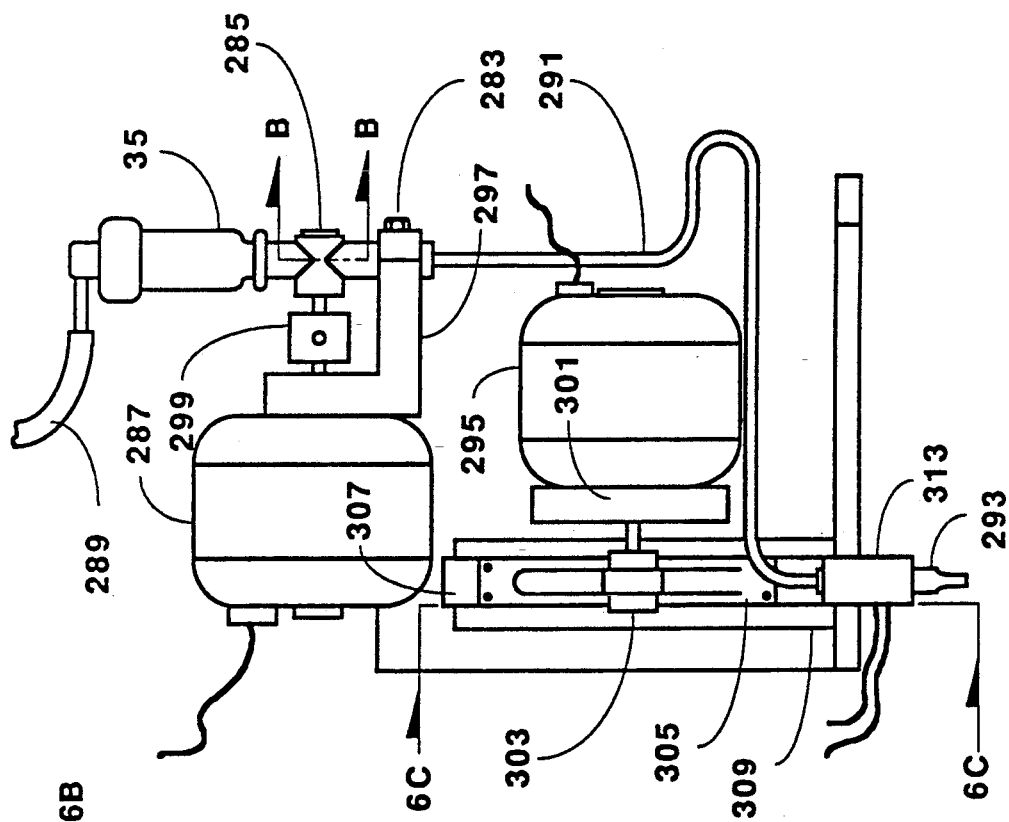
FIG. 6B shows an elevation view of the write carriage at an angle of 90 degrees relative to the view of FIG. 6A, from the vantage of line A—A of FIG. 6A.

FIG. 6B shows an elevation view of the write carriage at an orientation of 90 degrees relative to the view of FIG. 6A, from the vantage of line A—A. Clamp element 283 that holds valve 285 is part of a bracket 297 which is mounted to plate 281. Bracket 297 also serves to mount motor 287 which manipulates the rotary stem of valve 285 through coupling 299. Motor 295 mounts to the frame by means of a bracket 301. This motor provides z-direction (vertical) movement of the write tip by rotating a spindle 303 which wraps the tongue of a tongue-strip 305. The tongue-strip is bolted to a slide 307 which is guided vertically in a pair of bearing guides 309.

Tubing 291, through which uncured PTF material passes on the way to the pcb, makes several turns and broad curvature between the valve 285 and a heater block 313 through which material is forced to pass before reaching write tip 293. The purpose of the turns and curvature is to provide the necessary freedom of motion for the write tip while maintaining a steady flow of material. There are other tubing configurations, such as a loop, that could be used to provide the necessary mechanical freedom. However, it is generally desired to keep the length of the PTF path relatively short.

The purpose of the heater block 113 is to maintain uncured material at a known temperature to control viscosity. Heater block 313 is resistance heated by electric current, and measurements of the temperature of the block are fed back to computerized control system 43 (not shown in FIG. 6B) preferably by a thermocouple element in the block (also not shown in FIG. 6B). The control system maintains the temperature according to a pre-programmed set-point. The temperature of material flowing through the write tip is typically controlled to 40 degrees centigrade for the preferred PTF material used (to be described later), but can be at a different temperature depending on the physical characteristics of the particular trace material to be extruded.

Figure 6C:
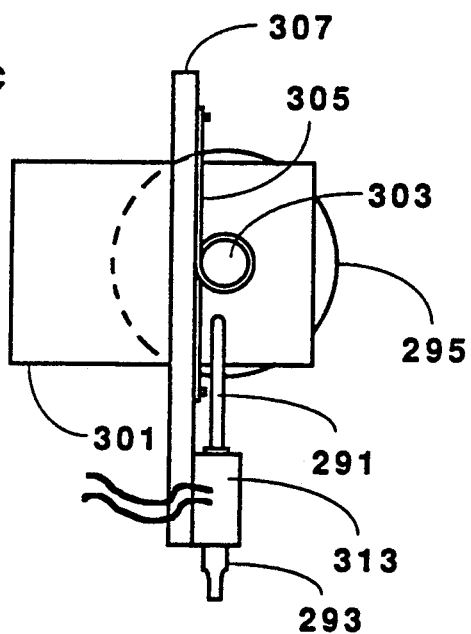
FIG. 6C shows a view through section A—A of FIG. 6B of a portion of the write carriage.
Figure 6D:
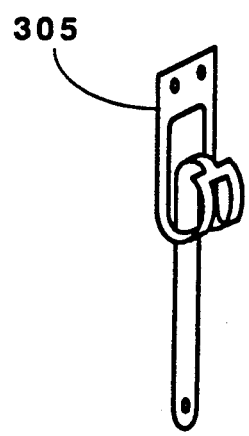
FIG. 6D shows an oblique view of a portion of a tongue strip illustrated in FIG. 6C that is used for converting rotary motion to linear motion along the z-axis of the apparatus.

FIG. 6C shows a section A—A of FIG. 6B along one edge of slide 307. Spindle 303 extends inside a loop of tongue strip 305 and the strip is fastened to slide 307. FIG. 6D is an oblique view of tongue strip 305 alone. The tongue strip is used for joining a linear motion and a rotary motion element so that rotation may be converted to linear translation without backlash. Zero backlash is also very important for the z-drive, because controlling the height of the write tip above the pcb while writing a trace is important to achieve high quality traces and to be able to provide traces that can cross over other traces.

Resistance heater 313 is fastened to slide 307 at the lowermost end of the slide, and write tip 293 is secured to the resistance heater. By this arrangement, precise rotation of spindle 303 provides precise vertical movement of write tip 293, and the movement is repeatable by repeating step positions of motor 295 without mechanical hysteresis.

Figure 6E:
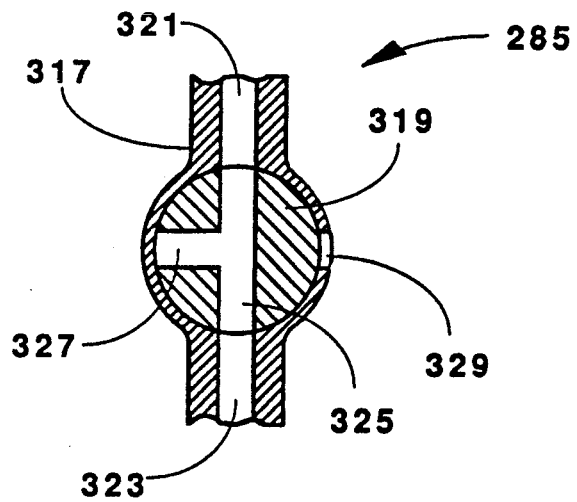
FIGS. 6E and 6F illustrate two positions of a three-way valve according to the invention that is used to control the flow of extruded material during circuit writing.

FIG. 6E shows section B—B through valve 285 of FIG. 6B. The valve has a body 317 with an upper passage 321 and a lower passage 323 that are each substantially the diameter of the inner diameter of tubing 291. The valve body has a cylindrical central opening filled with a close-fitting central drum 319. Drum 319 is rotatable within the valve body, and is rotated by motor 287 through coupling 299 (FIG. 6B). The central drum has a straight-through passage 325 and a connecting side passage 327. In the position shown in FIG. 6E, the straight-through passage of drum 319 is aligned with passages 321 and 323. This is the position maintained by the valve to feed PTF during writing of a trace.

Figure 6F:
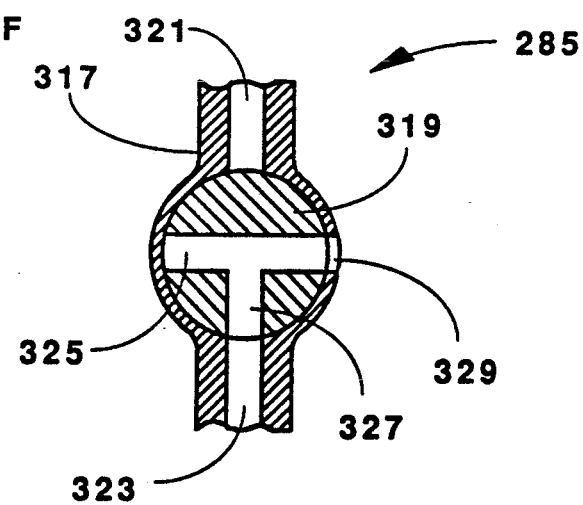

By way of illustration, from the position of FIG. 6E, rotation of drum 319 to "close" the valve is counterclockwise. Because of the small diameter of the passages relative to the diameter of the drum, and because the passageway 323 is typically over one hundred times larger in cross-sectional area than the exit orifice of the write tip, only a small rotation is necessary to completely close off the flow of material. Hence, the flow can be stopped exceedingly quickly, typically in less than 500 microseconds. As a practical matter, to obtain accurate traces, it is preferred that the flow be stopped in a time at most on the order of a millisecond. In the illustrated embodiment, the drum is rotated 90 degrees when closed, and goes to the position shown by FIG. 6F, with side passage 327 aligned with opening 329. Valve 285 is typically a bronze valve plated with stainless steel, and is a valve often used in hospital environments. An example of such a valve is part number 6011 or 6014 available from Poper & Sons.

In FIG. 6A, elements are shown with one reservoir for writing traces with a single material, which may be either a conductive or a non-conductive PTF material. FIG. 6A shows a plate 282 forming a part of the write carriage structure, extending outward from both sides of the write carriage. In practice, a second assembly of elements may be added to the side of the write carriage opposite the first assembly and attached to plates 282 and 277, and traces may be written with two different materials.

In operation, an inert gas, such as nitrogen, is introduced via line 289 to form a gas pressure over uncured PTF material in reservoir 35. The gas introduced is from a supply (not shown) outside the circuit writer, and the pressure is typically maintained in a range of from 25 to 55 psi. When writing is not being performed, valve 285 is closed, and write tip 293 is raised by the z-direction drive to a point about 1 centimeter above the surface of the pcb blank. To write a trace, the x-drive and the y-drive are operated to move the write tip over the point that a trace is to begin on the pcb. The z-direction drive then operates to move the write tip to close proximity of the surface of the pcb.

Figure 6G:
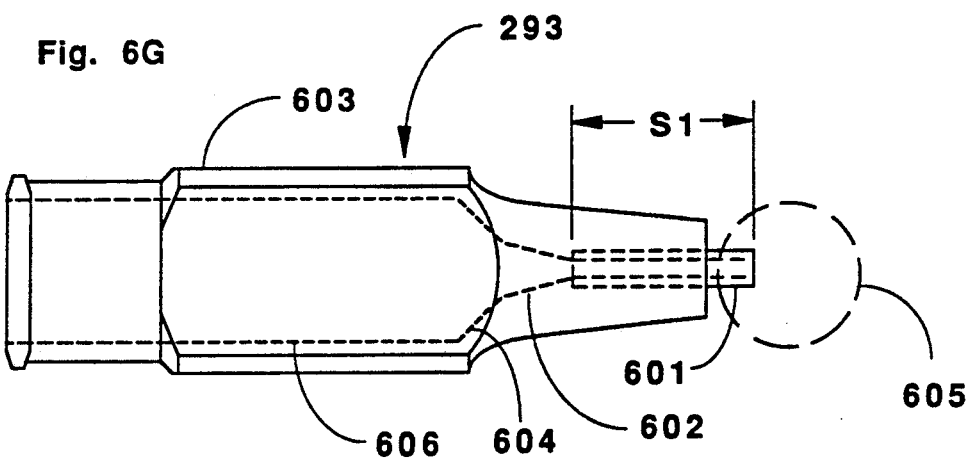
FIG. 6G shows the elements that compose a write tip according to the invention.

There are two different write tips used in the operation of the circuit writer, one for writing traces of conductive PTF and the other for writing traces of insulating PTF, which are typically, but not always, laid over traces of conductive PTF. FIG. 6G shows a typical construction of a write tip. A machined section 601 of stainless steel, regular wall, 26 gauge hypodermic tubing with 0.010 ID, is fixedly attached in a tubing fitting 603. In the preferred mode, the inside of the fitting has a bore 606 that meets a relatively steep region 604 of decreasing diameter which in turn meets a second region 602 of decreasing diameter at a relatively shallower angle than region 604. Region 602 reduces the diameter to the inside diameter of tubing 601. Tubing 601 is inserted against a shoulder such that there is no abrupt impediment to flow of material into tubing 601. Generally the length of tubing 601 is an important consideration in controlling the flow of the PTF because of its relation to the back pressure created. For a fitting 603, which by way of example, could be a Leur-Loc female fitting made by Becton-Dickson, No. 462 LNR without the stylette indexing notch, the length S1 of tubing 601 is typically 0.200 in. Clearly there are other fittings that would be suitable, and special fittings may be machined.

Figure 6H:
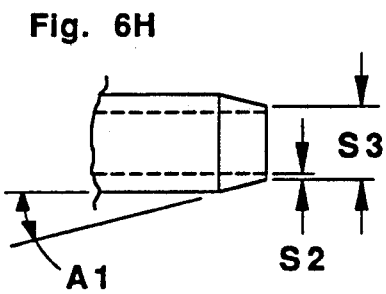
FIG. 6H shows the preferred shape of a hypodermic tubing tip for extruding traces of conductive PTF material.

FIG. 6H is an enlargement of the end of a hypodermic tubing as indicated by circle 605 in FIG. 6H. This is the treatment for a tip that is used for writing an original trace of conductive PTF material, and an outside bevel A1 of about 30 degrees is machined on the hypodermic tubing. The bevel is not machined to produce a sharp edge with the inside diameter of the tubing, as the sharp edge is fragile and subject to erosion and damage. Typically a land S2 of about 1 mil is provided. The diameter S3 is then about 12 mils. FIG. 6J shows how the outside beveled tip of FIG. 6H relates to the surface of a pcb when writing. The width S3 of FIG. 6H is a controlling factor in the formation of trace 605 of FIG. 6J, and the height H1 of the tip above the surface 607 of a pcb is maintained at about 0.5 times the width S3 of the tip. In this case H1 will be about 6 mils. It has been found in practice, however, that for the preferred range of viscosities and flow rates and the preferred PTF formulations, that trace width is nearly independent of the needle flying height, and can vary from about $-100\%$ to $+50\%$ without appreciable changes in trace width. This relative insensitivity to flying height is very important in being able to provide high density traces that are well defined.

Figure 6I:
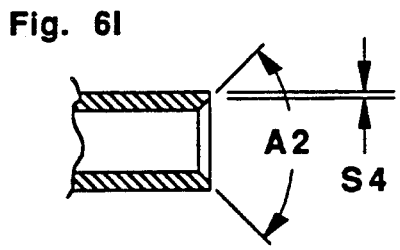
FIG. 6I shows the preferred shape of a hypodermic tubing tip for extruding traces of nonconductive PTF material.
Figure 6J:
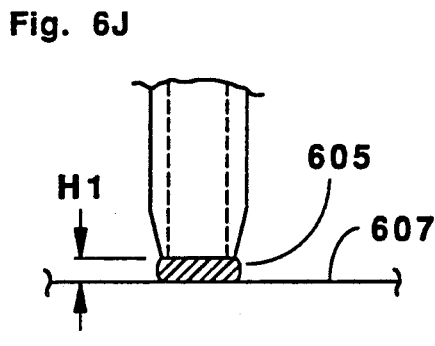
FIG. 6J illustrates the use of the tip of FIG. 6H in writing a trace.
Figure 6K:
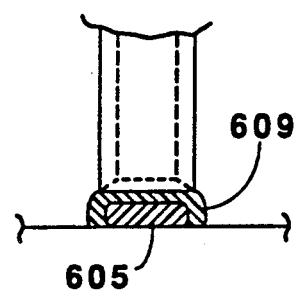
FIG. 6K illustrates the use of the tip of FIG. 6I in writing a trace.

FIG. 6I shows a different machining treatment for the end of a hypodermic tip. In this case an internal bevel has been machined on the tip of a tubing of the same original specs as the tip of FIG. 6H. The included angle A2 is about 118 degrees. Again, a land of about 1 mil is left rather than machining to a sharp edge. S4 is now the outside diameter of the 26 gauge tubing, which is about 18 mils. FIG. 6K shows how an inside beveled tip may be used to write a trace 609 of insulating PTF over an already written trace 605 of conductive PTF material. It should be appreciated that as a general rule the controlling dimension in the trace width is the effective outside diameter of the tubing, i.e. in the outside bevel, the diameter S3 is the effective outside diameter of the tubing relative to the PTF being extruded. Similarly, for the inside bevel, the diameter S4 is the effective outside diameter of the tubing relative to the PTF being extruded.

To begin writing a trace, valve 285 opens allowing PTF material to flow to the write tip, and the x-drive and the y-drive operate to move the write carriage, via the associated cable arrangements, in the desired trace pattern which has been pre-programmed into computerized control system 43. During writing of a trace, resistance heater 313 operates to maintain a constant temperature for the PTF material flowing to the write tip. The temperature is pre-programmed according to such variables as required for the particular PTF material being used, the write tip, and the width and thickness dimensions desired for the trace.

A typical "writing height" for a trace is in the range of 5 to 10 mils, depending on the particular effective diameter of the exit end of the write tip that is used. The height of a surface of a pcb upon which traces are to be written may easily vary more than this amount. As a result, if traces were to be written with the z-drive stationary and the write tip therefore at a fixed height, the height of the write tip relative to the pcb surface would vary to an unacceptable degree. To prevent this anomaly, a pcb surface is first plotted for height relative to a frame reference of the circuit writer. The pcb is divided into zones of about 3 cm. square, and a reference height for each zone is determined. The height for such a zone is known not to vary by enough to seriously effect the operation of the circuit writer. This information is entered to the computer of the control system, and is correlated with the location of traces on the pcb surface. Then during trace writing, the z-drive is operated to vary the writing height to account for the zone on the pcb where writing is currently being done.

When a trace is finished, valve 285 is closed to prevent further extrusion of PTF material at the write tip. The internal drum of the valve rotates 90 degrees in about 18 milliseconds. As indicated earlier, however, since only a few degrees of rotation are needed to completely block off the passage through the valve, the flow is effectively shut off in much less than 1 millisecond. At the point that the valve drum has rotated 90 degrees, side passage 327 is aligned with lower opening 323, and passage 325 is aligned with opening 329 through the valve body. The effect is to open the tubing passage 291 all the way to the write tip to atmospheric pressure, alleviating the pressure provided by the inert gas supply on the reservoir, so there is no continuing extrusion of PTF material from the write tip due to residual pressure after the valve has closed. At the end of writing a trace, the z-direction drive operates to raise the write tip as well.

Shown in FIG. 7A is an alternative preferred embodiment of the circuit writer, hereinafter called version2. The differences in the version2 from the first preferred embodiment described above are in the bearing rails for both the x- and the y-direction drives, the arrangement of the pulleys for the x- and the y-direction drives, and the orientation of the write carriage elements for providing two writing assemblies on the same carriage.

As illustrated in FIG. 7A, write carriage 337 rides on y-direction rail assembly 335, and the y-direction rail assembly mounts to mounting blocks 339 and 341, similar to the cross rail assembly of the previously described embodiment. Mounting block 339 rides along x-direction 341 rides along x-direction rail assembly 333. The mounting blocks and the y-direction rail assembly are a ridid assembly, so the y-direction rail assembly is constrained to travel in the x-direction along the x-direction rail pair.

Figure 7B:
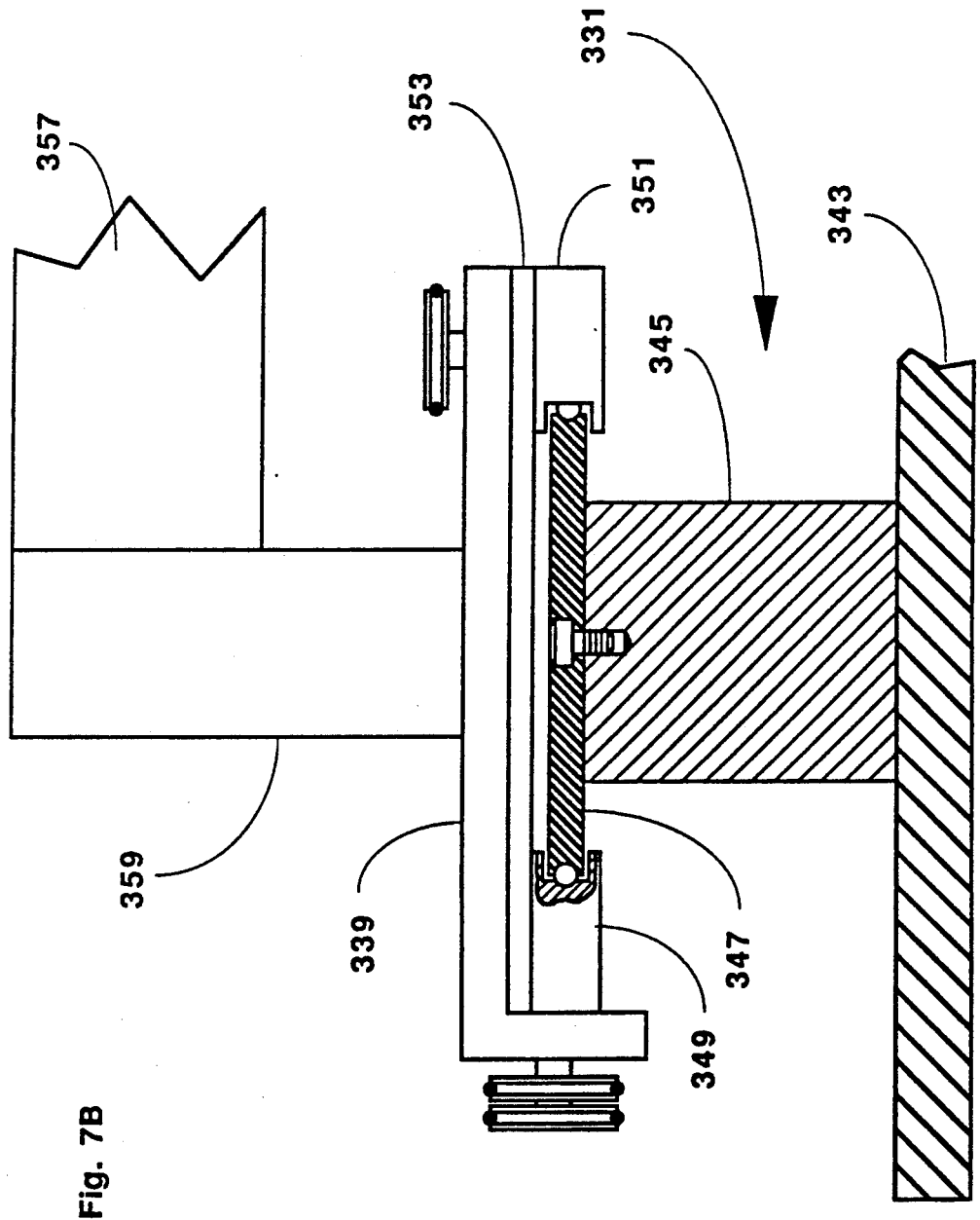
FIG. 7B shows a view of the alternative preferred embodiment through section A—A of FIG. 7A.

FIG. 7B shows section A—A of FIG. 7A, taken through x-direction rail assembly 331 adjacent to mounting block 339. The bearing arrangement for x-direction rail assembly 331 includes a rail 347, hereinafter called a Schneeburger rail after the name of the company from which such rails can be purchased. Also associated with the Schneeburger rail are two bearing blocks 349 and 351. The bearing blocks are mounted to a spacer plate 353, which serves to hold the blocks in a fixed position relative to the rail. Each bearing block has a complement of bail bearings that circulate in an endless path in a constrained track within the block, and guide also in a groove along a side of the Schneeburger rail. The resulting arrangement, well known in the art, provides a substantially backflash-free, low friction bearing rail arrangement with particular load carrying capability in the horizontal direction at right angles to the x-direction.

The Schneeburger rail is supported above base 343 on a long support block 345 and fastened to the block by conventional fasteners. Mounting block 339 is securely fastened to spacer plate 353, and support 359 fastens to the mounting block. Support 359 carries a second Schneeburger rail. Rail 357 provides the tracks for constraining the cross-rail assembly to travel in the y-direction at 90 degrees to the x-direction travel. Rail assembly 333 comprises elements equivalent to those shown for rail assembly 331.

Figure 7C:
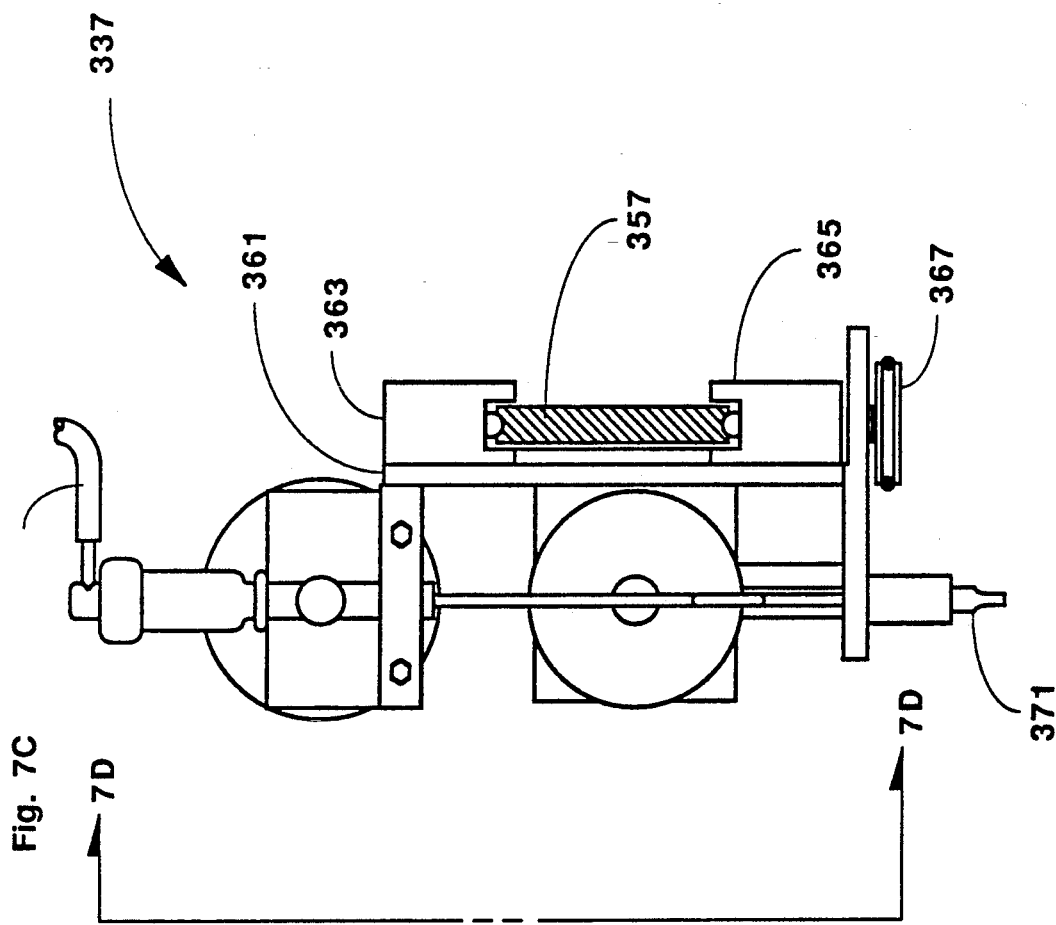
FIG. 7C shows a view of a cross rail assembly taken through section B—B of FIG. 7A.

FIG. 7C shows section B—B of FIG. 7A, through the cross rail assembly. Schneeburger rail 357 is shown in section. A spacer plate 361 is used for spacing apart bearing blocks 363 and 365 and holds them in position to constrain the write carriage to travel in the y-direction along the crossrail assembly, similar to the assembly of equivalent elements of the x-rail assemblies.

Spacer plate 361 also serves as a mounting platform for assemblies of elements to feed conductive or non-conductive PTF material, which, together with the spacer plate and bearing blocks 363 and 365 make up the write carriage 337. The feeding and write-tip positioning assemblies for the version2 embodiment are similar to the equivalent assemblies for the first described preferred embodiment. As with the first described embodiment, two such assemblies may be used, which makes it possible to feed conductive and non-conductive traces. Unlike the first embodiment, however, the two assemblies for feeding PTF material and controlling the writing height of the respective write tips are mounted side-by-side, instead of on opposite sides of the cross-rail assembly, as in the first described embodiment.

Figure 7D:
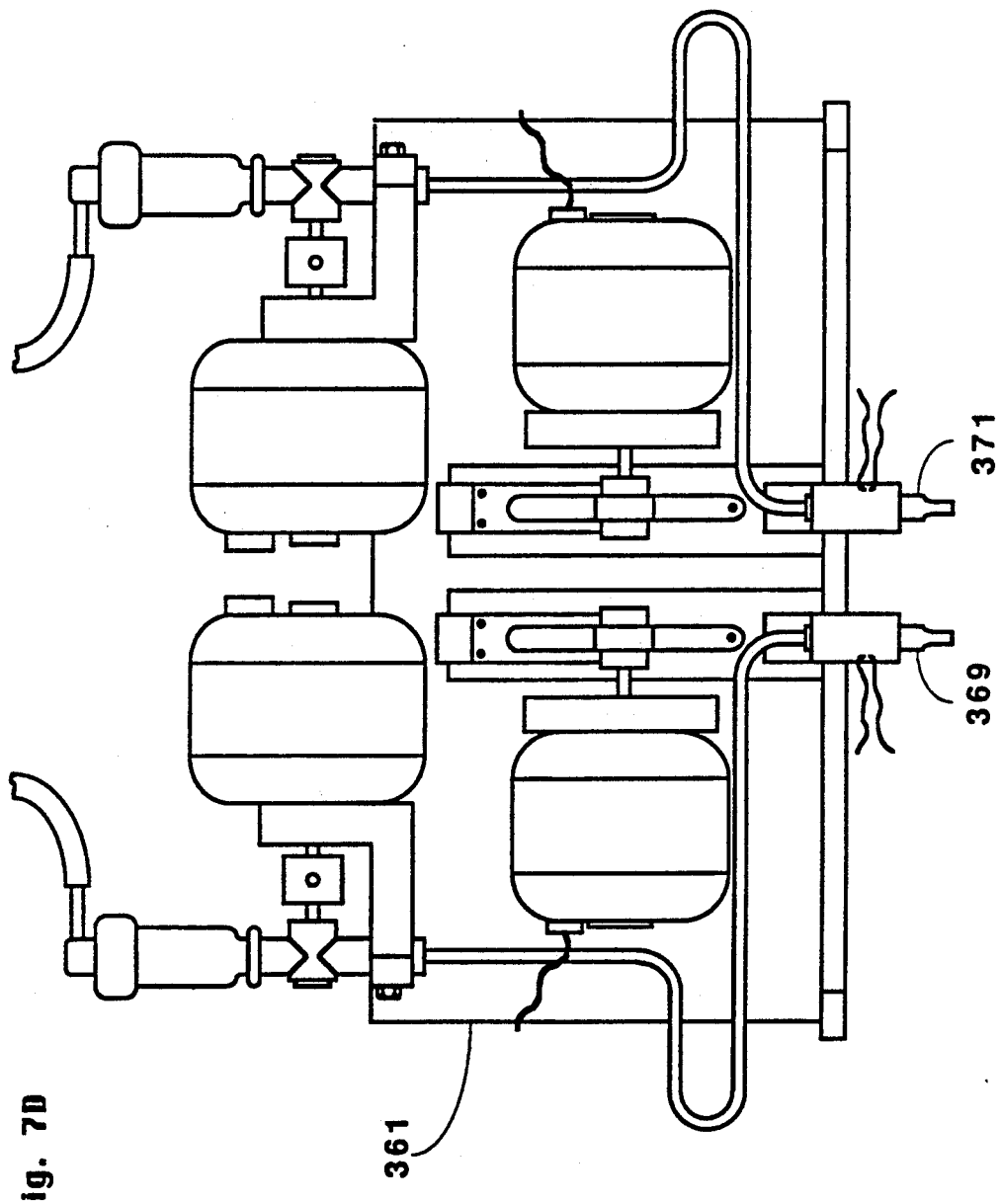
FIG. 7D shows a view of a write carriage from the vantage of line A—A of FIG. 7C.

FIG. 7D shows write carriage 337 from the vantage of line A—A of FIG. 7C, illustrating two PTF material feeding assemblies. The two assemblies are constructed and mounted as mirror images of one another, so that write tips 369 and 371 are quite close. This arrangement has the advantage that, in writing a circuit with one of the write tips, if it is desired to change to the other tip, a minimum translation of the write carriage is required to bring the second tip to the position reached by the first. A change from one tip to the other might be wanted if, for example, a circuit were to be written with traces of two widths. One tip would be designed to write one width, and the other tip the other width. Such changes would also be wanted if a circuit needed both conductive and non-conductive traces.

For the version2 embodiment there are separate cable drives for x-direction motion and y-direction motion, just as for the embodiment first described. The y-direction cable system for moving the write carriage along the cross-rail assembly is quite similar in both the embodiments. A cable drive 373 has two cables single wrapped from opposite ends of the drum. Cable 375 exits from the top of the drum and traverses a system of pulleys, going first to corner structure 377, then to a pulley on mounting block 339, then 180 degrees around a pulley under the write carriage, back to mounting block 339 and finally to an adjustable anchor point 379 at corner 381, just as in the first described embodiment. Cable 383 exits from the bottom of the drum and traverses a similar system of pulleys on the other side of the circuit writer, going to corner structure 385, then to mounting block 341, then to a pulley under the write carriage, then back to mounting block 341, and finally to adjustable anchor 387 at corner structure 389. Operation of the y-drive drum, utilizing a stepping motor, moves the write carriage back and forth along the Schneeburger rail of the cross-rail assembly.

In some cases it is desirable that the y-drive have 2 cables to each side rather than a single cable, and this is accomplished by wrapping a third cable in the center of the cable drum of drive 373 in similar fashion to the cable arrangement previously described for the x-drive of the first described preferred embodiment illustrated by FIG. 4B, 4C, 4D, and 4E. The third cable provides an additional cable extension to each side, and additional pulleys are provided so that the new cable extension on each side follows closely the path of the original single cable. An additional anchor is needed in this case at each of corners 381 and 389. With such a doubled arrangement for the y-drive, there are two passes of cable between each point where there was one before, and the arrangement is thus strengthened.

The x-direction drive for the version2 embodiment is somewhat different from the x-direction drive for the first described embodiment. X-drive 391 includes a motor driven cable drum as before. There are two cables wrapped on the drum. Cable 393 is a single wrap from one end of the drum (away from the motor end), and exits the drum from underneath extending toward corner structure 389. Cable 393 turns around a pulley 394 in a pulley mounting bridge 396, extends to corner structure 389, passes over vertically oriented pulleys, and extends toward mounting block 341. At the mounting block, cable 393 turns around pulley 397, extends back to corner structure 389, and passes around a pulley 395. The cable then extends back to mounting block 341, turns around a pulley 398, mounted adjacent to but separate from pulley 397, and extends back to corner structure 389, where it is fastened to an adjustable anchor 399. Rotation of the cable drum taking up cable 393 urges mounting block 341 toward corner structure 389.

Pulley 395 is mounted to the corner structure at an angle such that the groove at the top is offset from the groove at the bottom by an amount equal to the measurement between the grooves of pulleys 397 and 398 at mounting block 341. This mounting allows the cable to enter and exit the pulley grooves straight-on, rather than at an angle, reducing friction effects, especially with the cables strongly tensioned, as they are in the preferred modes of operation.

Figure 7E:
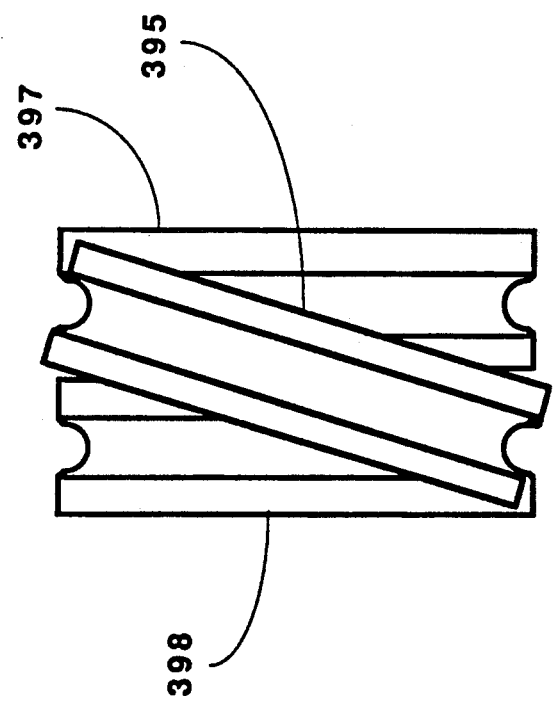
FIG. 7E shows a view from the vantage of line C—C of FIG. 7A illustrating a pulley arrangement in the alternative embodiment.

FIG. 7E, from the vantage of line C—C of FIG. 7A, illustrates the relationship between the two pulleys on the mounting block and the angle-mounted pulley at the corner structure. Only the three pulleys are shown.

Cable 401 is wrapped on the cable drum from the end closest to the motor drive, and exits from underneath the drum toward corner structure 381. Cable 401 turns around a pulley 405 mounted to a block near corner structure 381 and extends the length of the circuit writer to corner structure 377. At the corner, cable 401 turns around vertically oriented pulleys, goes to mounting block 339, around a pulley at the mounting block, back to corner 377, around a pulley mounted at an angle, back to mounting block 339, around a second independent pulley there, and extends back to corner structure 377 where it fastens to an anchor. This arrangement is similar to the arrangement of pulleys and the cabling between mounting block 341 and corner structure 389 for cable 393. When the x-drive cable drum turns taking up cable 401, mounting block 339 is urged toward corner structure 377.

Only the two cables, 393 and 401, are wrapped on the drive drum, and these two accomplish the drive. A third cable, 407, passes over the drum but is not wrapped on the drum. Cable 407 extends on one side toward corner structure 389, and passes around a pulley 409 mounted at an angle in pulley mounting bridge 396. From this point it extends the length of the circuit writer to corner structure 385. Cable 407 passes around pulleys and between corner structure 385 and mounting block 341 in a manner similar to that described for cables 393 and 401 above. On the other side of the circuit writer, cable 407 extends to corner structure 381, and around pulleys and between corner structure 381 and mounting block 339 in the manner already described for other pulleys. Cable 407 is anchored at corner structures 381 and 385, and the arrangement serves as an idler assembly balancing against the pull of the arrangement of cables 393 and 401.

Figure 7F:
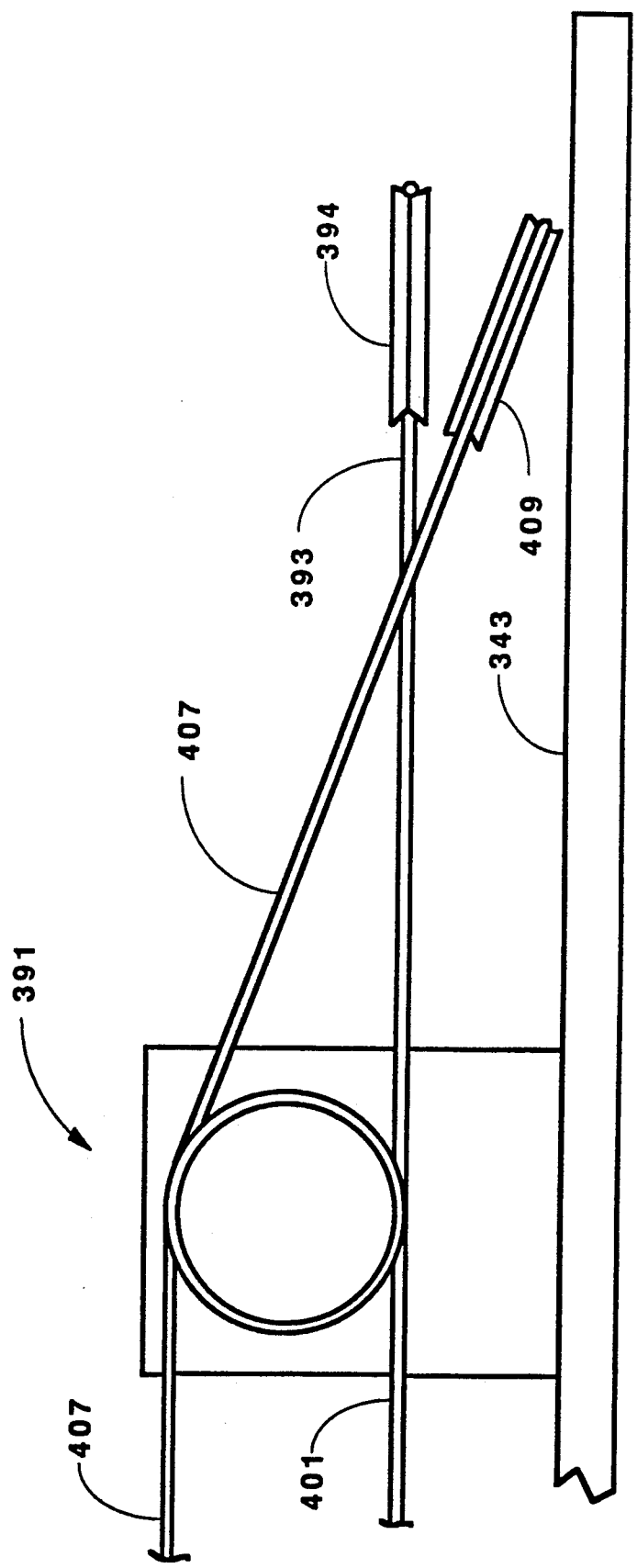
FIG. 7F shows another view from the vantage of line C—C of FIG. 7A illustrating a path for cabling in the alternative embodiment.

FIG. 7F is a view from the same end as line C—C but at the center of the circuit writer, and shows the drum of drive 391 with cable 393 extending to pulley 394, cable 401 extending to the opposite side, and cable 407 passing over the drum to angled pulley 409 on one side. Pulleys 394 and 409 are both mounted in pulley mounting bridge 396, but the bridge is not shown in FIG. 7F so that the relationship of the pulleys may better be seen.

The arrangement of pulleys and cables for x-direction movement is such that rotating the drum of drive 391 one way and the other moves the cross-rail assembly back-and-forth along the x-direction rail assemblies. Turning the drum of y-drive 373 one way and the other moves the write carriage back-and-forth along the cross-rail assembly in the y-direction. Hence, by running the two drives selectively, intricate patterns may be described by the write tips on a printed circuit board positioned on write table 411.

The height of either of the write tips in the version2 embodiment is controlled by motor driven mechanisms similar to those explained for the first described embodiment. The version2 embodiment has the advantage of being lighter than the first described embodiment, partially because the Schneeburger rail elements are lighter than the rail elements used in the first described embodiment. Moreover, the Schneeburger rails are arranged so that the forces generated by cable tension and movement are bending forces across the long dimension of the rectangular rails, providing for a very rigid structure and thus assuring dimensional stability. There need be fewer pulleys used, as well, due to the placement and wrap of the x-drive and the use of angle mounted pulleys. The use of the angle mounted pulleys provides improved cable-to-pulley alignment and lowered drive friction.

SET UP PROCEDURES

There are series of set up procedures to be followed to be ready to process a blank into a pcb by the circuit writer. The first step is to mount a blank to the write table, which may be done, as indicated earlier, by a vacuum chuck and using tape to hold the board to the chuck. In either case, the blank must conform to certain published specifications, and is mounted visually at a specific position. As the circuit writer works to very close tolerances, visually aligning and positioning a board at set up is not sufficient to ensure that traces will be written at precisely the correct positions on the board.

It was indicated previously in this specification that a blank mounted on the write table cannot be perfectly level, and that to form traces with the precision required, the write tip must travel at a closely controlled height above the surface of the pcb upon which a trace is written. Because of this, part of the set up procedure is to measure the height of the surface of the mounted blank at a number of positions in a matrix over the area of the blank, with respect to the frame of the circuit writer. This is accomplished by means of a gauging probe mounted to the write carriage of the circuit writer. Element 630 in FIG. 7A indicates an LVDT gauging probe mounted to the write carriage. After initializing the gauging probe both vertically and horizontally, an operator moves the write carriage to the positions in the matrix by keyboard commands through the computerized control system, and a relative height at a point in each of a number of small areas (each approximately 1 cm. square) over the total area of the blank is read into the computer according to the indication of the gauging probe riding on the write carriage and contacting the surface of the mounted blank. This array of data is used subsequently in process control to control the height of the write tip (z-direction) relative to the surface of the blank upon which a trace is being written.

Alignment of the blank in the x, y plane and rotationally is accomplished by means of a video camera fixedly attached to the write carriage of the circuit writer, which projects a display for the operator including crosshairs that the operator can coincide with specific marks on a blank and on the write table for input to the computerized control system. Element 629 in FIG. 7A indicates a video camera mounted to write carriage 337. An alignment block is mounted to the circuit writer for aligning and zeroing the write tips (also called the pens) and the camera crosshairs. As the control system "knows" the step position of each of the stepping motors in the x-, y-, and z-drives, the operator may develop offset information for the computer by moving the pens and the carmera crosshairs each to the "standard" position of the alignment block, which is done typically with the cursor control keys of the computer keyboard, and noting the positions (entering them to the computer database). In the preferred mode, the operator should take care to approach each reference from the same direction to mimimize hysteresis problems that might otherwise introduce errors in the data, and be careful to align to the nearest step position attainable by the write carriage, which is 1 mil increment.

Figure 4I:
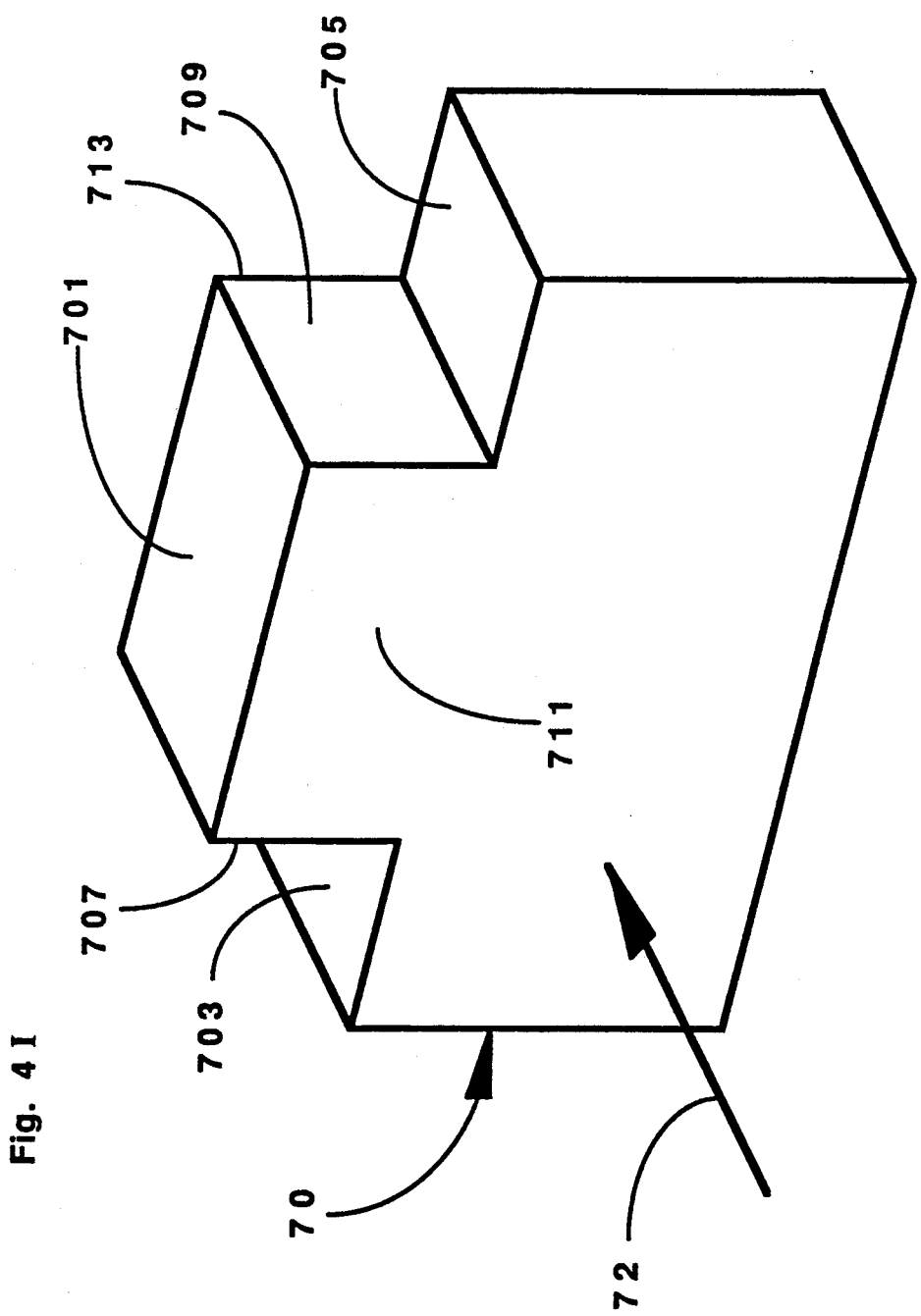
FIG. 4I shows an oblique view of a touch pad as used in a preferred embodiment for set purposes.

An alignment block, also called a touch pad, is shown as element 70 in FIG. 4A, mounted to the base frame of the circuit writer. FIG. 4I is a view of the alignment block with arrow 72 shown to indicate direction as in FIG. 4A. The alignment block is carefully machined and mounted to the circuit writer frame to provide an absolute positional reference for the moving elements. An operator would use this reference, as an example, by moving the pens to surfaces 701, 703, and 705 to develop absolute reference for the z-direction; to parallel surfaces 707 and 709 to develop absolute references in the y-direction; and to parallel surfaces 711 and 713 to develop absolute references in the x-direction.

As a part of the set up proceduce, the operator also uses the camera crosshairs to input the position of each of three reference points located in an orthogonal pattern on a pcb blank, again being careful to approach the points from the same direction and to the nearest possible step. These points are entered to the data base, and allow the computer program to compute scale factors, offsets, and rotational correction. After the computations, the write table is rotated by the computer through the rotational mechanisms shown previously by FIG. 2H, and the scale factors and the rotational angle are displayed. If the correction angle is relatively large, the operator may elect to repeat the alignment process. The alignment is typically repeated until the rotational correction is less than 0.001 degree. Illumination during the alignment process is provided by a ring light, and the goal is to provide uniform illumination which does not bias the operator's perception of the target. It is planned that machine vision techniques will be used in future to replace the operator and to automate the alignment procedure.

PROCESS CONTROL

Control of the elements to accomplish circuit writing is similar in the two described embodiments, since there are a large number of corresponding elements between the two embodiments. FIGS. 8A, 8B and 8C are block diagrams indicating the gross requirements for translating raw data pertaining to a printed circuit board (pcb) design to a board with the traces written by the circuit writer. FIG. 8A indicates the three main processes. Block 549 indicates processes of computer aided engineering (CAE), which compute such things as the width and cross section needed for traces to carry required current loads with an adequate margin of safety. Block 551 indicates the processes of computer aided design (CAD), which accomplishes such tasks as routing the traces between the various devices to be mounted on the pcb. Block 553 indicates the information from the CAD processes fed to the circuit writer to cause the x-, y-, and z-drives and the various actuators to write the traces on a pcb.

FIG. 8B expands the CAE processes to indicate the processes of schematic capture 555 and net list extraction 557, resulting in a net list (ie. a list of components) to be used as input data for the CAD processes.

FIG. 8C expands the CAD processes to show the process of feeding physical location data 559 and the net list to a routing engine 561 (router), which does the layout of traces for the pcb, resulting in a database called a route. The router operates by programmed rules, such as a number of allowed trace connections to a single connector pad where a device is mounted on a board, the minimum allowable spacing between traces on the board (to avoid shorting or other interference across the space), the minimum bend radius allowed, and more as will be described later.

Various standard computer program for performing CAE and CAD are well known in art, and can be used for producing the net list and the physical layout of the pcb. Similarly, routers are also commercially available, and can be used directly to produce the route, provided that the particular rules related to this extrusion method of providing traces are incorporated into the command set.

Figure 9:
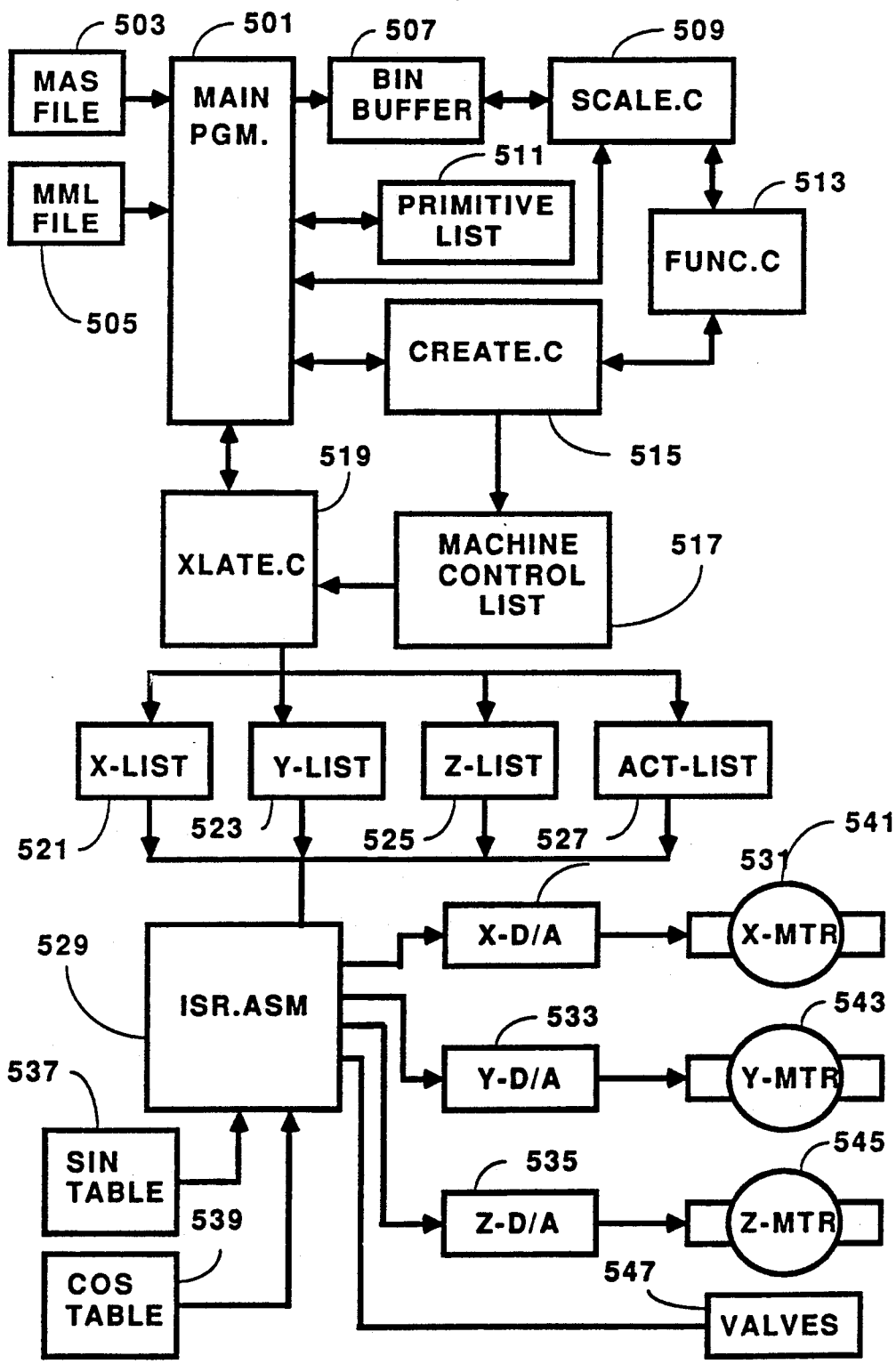
FIG. 9 shows a block diagram illustrating process control functions used in operating the invention.

FIG. 9 is a block diagram of process control for the circuit writer performed by computerized control system 43 (FIG. 1). Program element 501 is the main program, which handles overall tasks such as loading and manipulating data and calling sub-programs to convert loaded data to a form usable by the operating elements of the circuit writer. Element 503 is a machine action sequence (MAS) file, which is loaded by the main program from peripheral storage, such as a disk drive, and stored in program element 507, the binary buffer. Element 505 is a precomputed mechanial motions list (MML) which is also loaded from peripheral storage and stored internally as element 511, the primitive list. The primitive list is principally a list of acceleration vectors in a form recognizable by the driven elements (motors) for doing certain primitive actions that may be combined in sequence to cause the circuit writer to write traces corresponding to the layout developed by the routing engine and stored in the binary buffer. Sine and Cosine tables are also loaded from peripheral storage and stored internally as represented by program elements 537 and 539.

Element 509 is a sub-program, called SCALE. C in the preferred embodiments, that scales all of the addresses of current record in the binary buffer during operation, and returns the scaled results to the binary buffer. Element 513 is a preprogrammed file of various functions used by SCALE. C and another sub-program called CREATE. C, element 513, in the preferred embodiments. CREATE. C, at direction from the main program, reads trace data from the binary buffer, finds the correct set of motor primitives from the primitive list, element 511, and builds element 517, called the machine control list in the preferred embodiments.

Directed by the main program, element 519, called XLATE. C (for tranlate. C) in the preferred embodiments, translates the machine control list and builds four separate lists represented by element 521. the X-LIST; element 523, the Y-LIST; element 525, the Z-LIST; and element 527, the actuator, or ACT-LIST. Each of these lists is a sequence of actions to be taken by the corresponding control element, these being the x-drive, the y-drive, the z-drive, and the valve actuator, in the order in which they must occur to write the desired traces, and with a time reference for each.

Element 529 is a subprogram called the interrupt service routine, ISR. ASM in the preferred embodiment. This program element is activated on a repeating timed basis, 0.5 milliseconds in the preferred mode. Each time activated, it compares the current time with the times listed in the various action lists. If the time values match, it is time to update the accerleration or actuator for that control function. The ISR maintains the current position for each axis, and every 0.5 milliseconds, in the preferred embodiment, the position is updated by the formula $X=VT$, and the velocity is updated by the formula $V=AT$.

The interrupt service routine causes signals to be sent to interfaces 531 for the x-axis, 533 for the y-axis, and 535 for the z-axis, and also to the valve or valve actuators to be controlled. Elements 531, 533, and 535 are digital to analog converter modules where the digital information is converted to analog signals to control the x-motor 541, the y-motor 543, and the z-motor 545. Through the motions of the three motor drives and the actuation of at least one valve to start and stop the feeding of PTF material, the traces are written on the pcb.

BOARD REQUIREMENTS

The circuit writer, in the preferred embodiments described, is generally supplied with a blank conforming to certain specifications. This is important so that the positions of conductive pads. where component leads will be soldered or otherwise connected, can be supplied as data to the computerized control system. Preprogrammed procedures very similar to those that are commonly used in the art can then be used to "route" connecting conductive traces between the pads, the conductive traces forming the circuit connections between the pads, and hence between the component leads. It is the conductive traces written by the circuit writer that form the circuit connections. Insulative traces may also be written over the conductive traces to provide protection from the environment, to insure against shorting across traces, and to permit one to write conductive traces crossing over conductive traces previously written, increasing the density and complexity of circuits that may be accomplished by the circuit writer. The specifications of a blank, as they relate especially to sizes and positions of pads, are determined by the set of "primitives" available to the carriage and pen tip, ie. the minimum set of movements from which all desired movements can be constructed, and the "router rules", i. e. geometrical constraints typically required for traces constructed by extrusion. The primitives and router rules are software preferences, and may be changed to accommodate different needs, so blanks of many different specifications may be accommodated through program changes, without departing from the spirit and scope of the invention. (See Appendix A for a listing of software primitives.)

Figure 10:
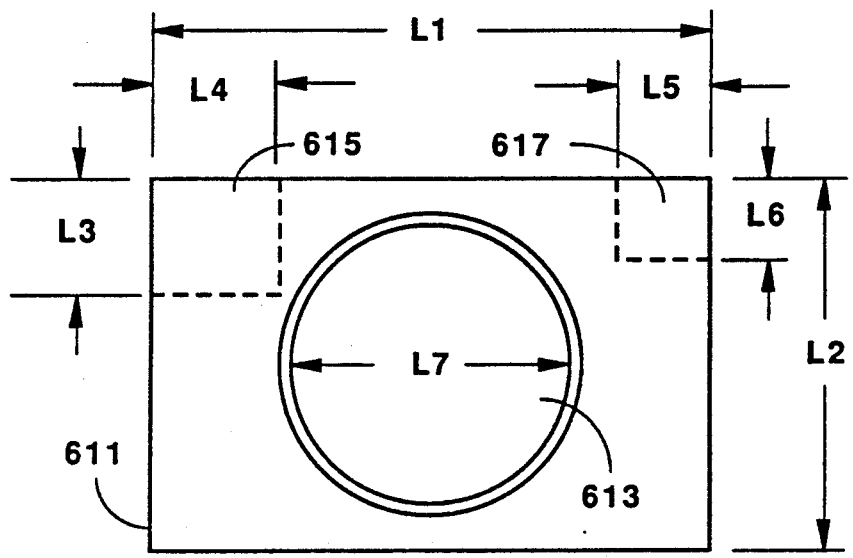
FIG. 10 shows a typical pad on a printed circuit board as used by the invention.

FIG. 10 shows the standard and preferred pad dimensions for a typical board according to a preferred embodiment. The length L1 of typical pad 611 is 60 mils with a tolerance of about 5%, and the width L2 is 40 mils, again within a tolerance of about 5%. A pad typically has a through-hole 613 with diameter L7 of 31 mils within a tolerance of about 10%, for the lead from a circuit component, such as a resistor, to fit into, where the lead will be soldered or otherwise adhered to the pad. The pad material is preferably copper with a nickel and gold plating to ensure adhesion of a trace to a pad. The hole is not required for components that are designed to be surface mounted.

A blank for use by the circuit writer typically begins as a laminated board with copper sheet adhered to one or both sides, just as in the conventional pcb process. Unwanted copper is etched away to leave isolated pads of desired size and shape where required, and often other areas of copper surface separate from pads, to be used for ground planes or power planes.

An area 615 at each of the four corners of the pad is specified as the "landing zone" with dimensions L3 of 12 mils and L4 of 14 mils in the preferred mode. This is the area of a pad that can nominally be covered by a connecting trace. One such area at one corner is shown in FIG. 10. A smaller area 617 is known as the critical landing zone, which is the minimum allowed area of a pad where a trace may attach. In the preferred construction, the dimensions of the critical landing zone are L5=9 mils and L6=8 mils. PTF traces may terminate at any of the four corners for a total of up to four trace terminations for a single pad on one side of a board. A plated through-hole may have a pad to the same specifications on the opposite side of a board, and up to four more traces may terminate there, raising the total of possible traces for a single pad to eight. Those skilled in the art will appreciate that other shapes could also be used for the pads provided they permit adequate area for trace connection. For example, a circular pad could be used, or a pad having a different number of corners could be used. In each instance, however, there is a tradeoff of board "real estate" available for traces versus the difficulty of hitting a corner very precisely at the begining and end of a trace, as well as concern for the number of traces that might be needed for a particular component.

Figure 11:
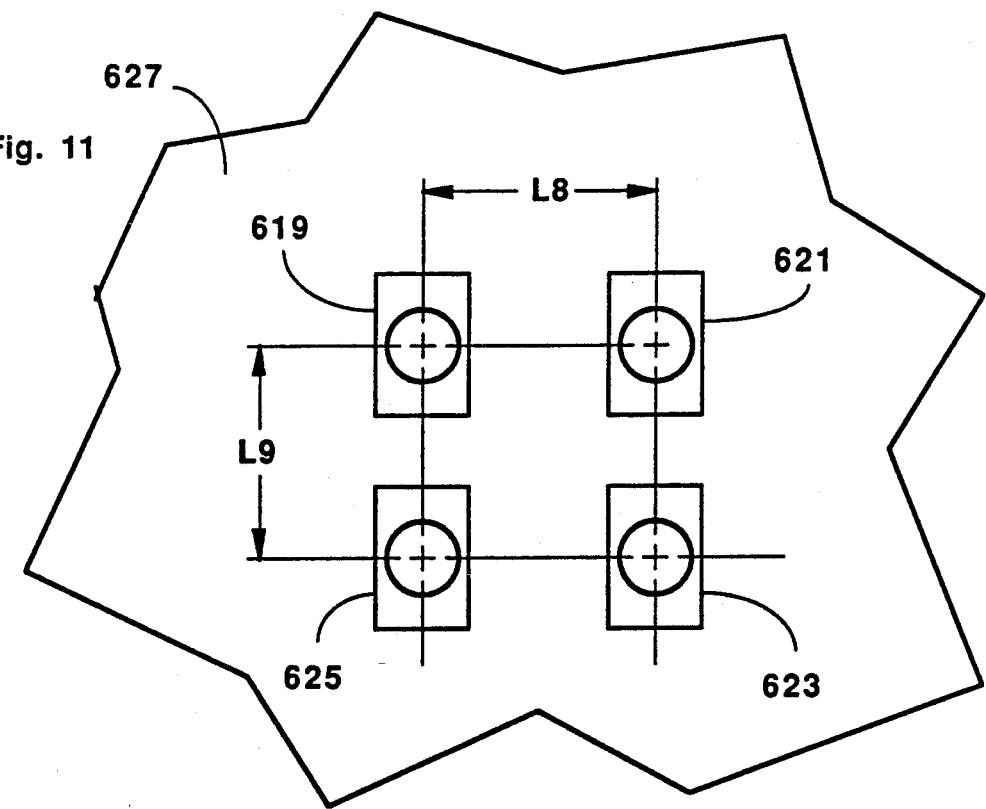
FIG. 11 shows a typical relationship between pads on a printed circuit board as used by the invention.

FIG. 11 shows four pads 619, 621, 623, and 625 on a typical board 627 according to a preferred embodiment. Only a small area representing a portion of the board is shown. The relationship, centerline-to-centerline, of the pads L8=L9=100 mils for the preferred programming of the circuit writer.

Figure 12A:
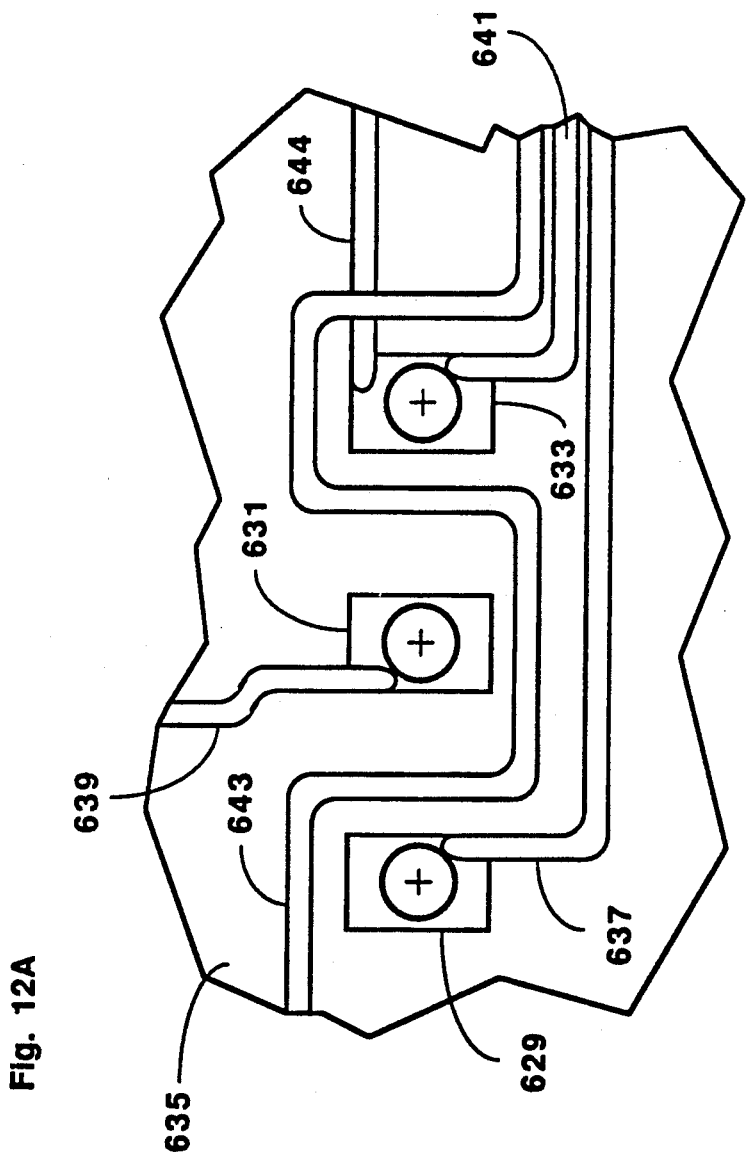
FIG. 12A shows a portion of a printed circuit board with pads and with traces written by a circuit writer according to the invnention.

FIG. 12A shows three pads 629, 631, and 633 according to the preferred dimensions and placement with connecting traces on a portion of one side of a board 635. Trace 637 contacts one corner of pad 629, trace 639 contacts one corners of pad 631, and trace 641 contacts one corner of pad 633. Trace 643 passes through the area of the three pads, but doesn's make contact with any of the three pads shown. Trace 644 contacts a corner of pad 633 and crosses under trace 643. By covering conductive traces with insulative material, another layer of traces may be added crossing over a first layer of traces, without causing shorts or other interference.

In writing a board with multiple leave layers of traces, multiple writing passes are typically made. A pass is the procedure of writing a series of traces with one PTF material without crossing patterns. After a first pass making a number of connections between pads, a second pass may be made covering all or part of the first pass traces with insulative PTF material, then a third pass may be made, and conductive PTF traces may be allowed to cross over conductive traces from the first pass where the first pass traces are protected by an overlayer of insulative PTF material. The number of layers that can be formed is theoretically limited by the use of landing zones on the pads, and as a practical matter by complicated topography that results requiring careful control of position of extruder tip height.

Figure 12B:
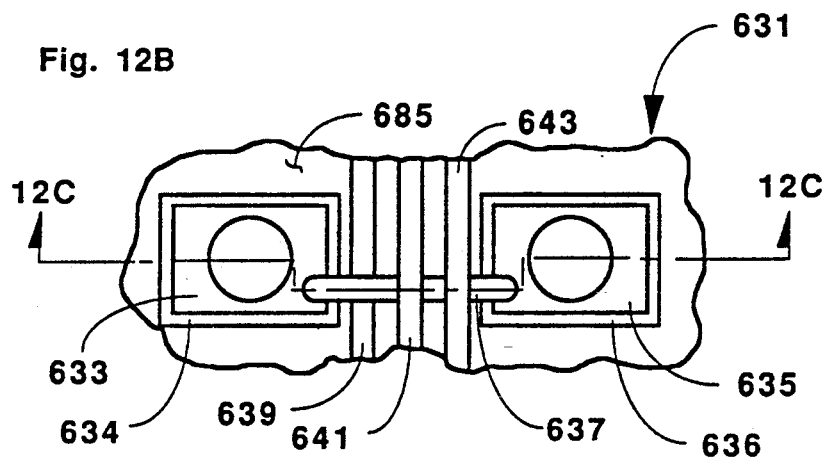
FIG. 12B shows two pads and extruded traces on one side of a two-layer printed circuit board according to the invention.

FIGS. 12B, C, and D show different views of portions of a 2-layer board as prepared by a circuit writer in which crossing patterns are used. FIG. 12B shows a portion 631 of the surface of one side of the board, showing two rectangular pads 633 and 635. The pads are separated from a power plane area 685 by etched channels 634 and 636. A trace 637 is written between the pads. Three more traces 639, 641, and 643 written by the circuit writer are shown passing through the area between pads 633 and 635, but not contacting either pad.

Figure 12D:
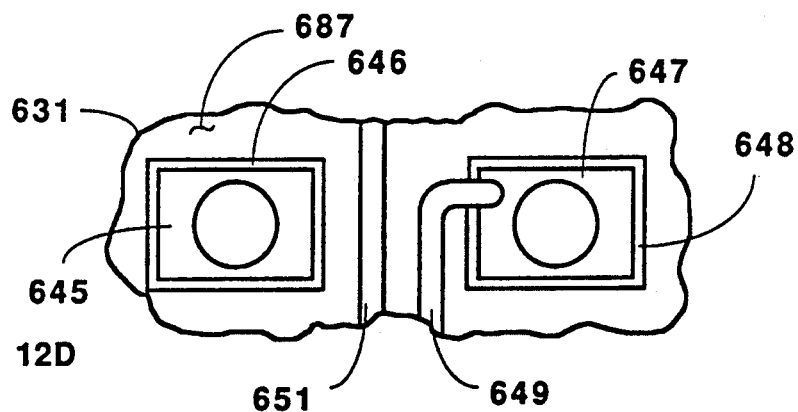
FIG. 12D shows two pads and traces on the opposite side of the printed circuit board from FIG. 12B.

FIG. 12D is a view of a portion of the other side of the pcb showing two additional pads 645 and 647, a trace 649 contacting pad 647 and a trace 651 passing through the area between the pads without contacting either pad or crossing over or under trace 649. Pads 645 and 647 are closely aligned with pads 633 and 635 on opposite sides of the pcb.

Figure 12C:
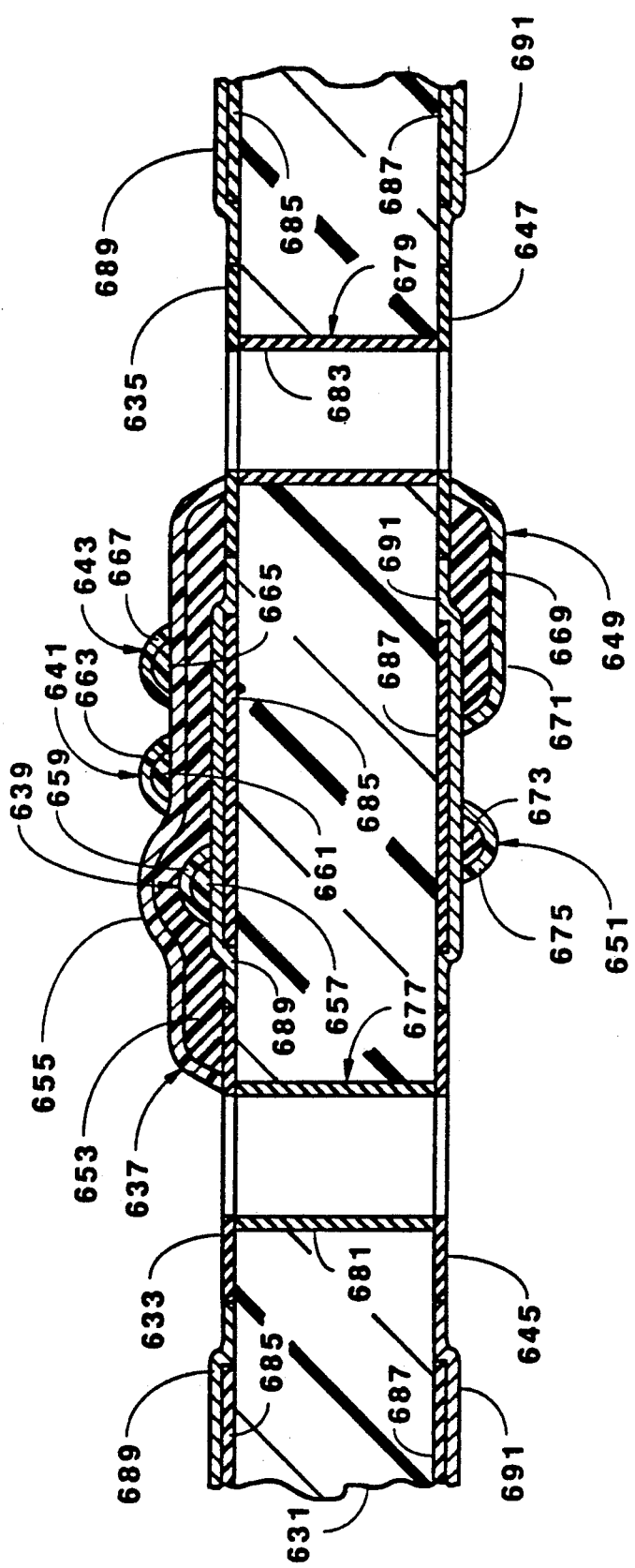
FIG. 12C shows a section along line A—A of FIG. 12B.

FIG. 12C is a section of the pcb taken along line A—A of FIG. 12B. All of the elements of FIG. 12B and FIG. 12D are shown. It is clear in FIG. 12B that trace 637 passes over trace 639, but both traces 641 and 643 pass over trace 637. This relationship is more clearly seen in section view FIG. 12C. Moreover, the traces are compound traces formed of two materials. Trace 637 is formed of a trace 653 of electrically conductive material and a covering trace 655 of insulative material. Similarly, trace 639 has a conductive trace 657 and an insulative covering trace 659, trace 641 has an electrically conductive trace 661 and an insulative covering trace 663, and trace 643 has an electrically conductive trace 665 and an insulative covering trace 667. It is the insulative covering of the traces that allow crossovers to be made without electrical shorting between conductive traces.

On the opposite side of the pcb, trace 651 has a conductive trace 673 and an insulative covering trace 675 while trace 649 has a conductive trace 669 and an insulative covering trace 671. This is true even though no crossovers are shown for these traces. Elsewhere on the pcb there may well be crossovers involving these two traces, and even in the absence of crossovers, the insulative covering has a protective effect for the conductive traces and prevents shorting between traces by intrusion of a foreign object or material.

In FIG. 12C a hole 677 through the pcb is shown between pads 633 and 645 on opposite sides of the pcb, and a hole 679 connects pads 635 and 647. Hole 677 is lined with copper material 681 and hole 679 is lined with copper material 683. The copper material is applied in the fabrication of the pcb blank typically by electroless plating, and typically in the preparation of the blank before writing of traces by the circuit writer. It is the conductive lining of the holes that establishes electrical contact between the pads on opposite sides of the pcb.

Also shown in FIG. 12C are surface power planes 685 and 687, which are copper sheet formed in the fabrication of the blank at the same time that the pads are formed, typically by etching away portions of copper cladding adhered to the nonconductive board. There are also dry film solder masks 689 and 691 that are formed by conventional techniques, typically before circuit writing.

Figure 12E:
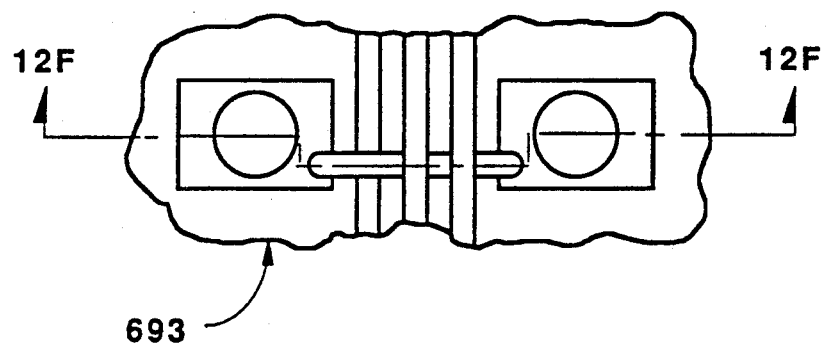
FIG. 12E shows two pads and extruded traces on one side of a four-layer printed circuit board according to the invention.
Figure 12G:
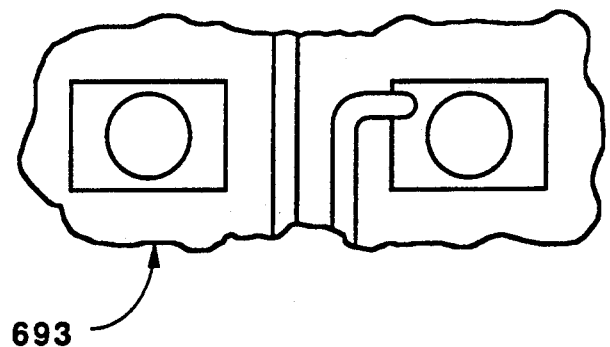
FIG. 12G shows two pads and traces on the opposite side of the four layer board from FIG. 12E.
Figure 12F:
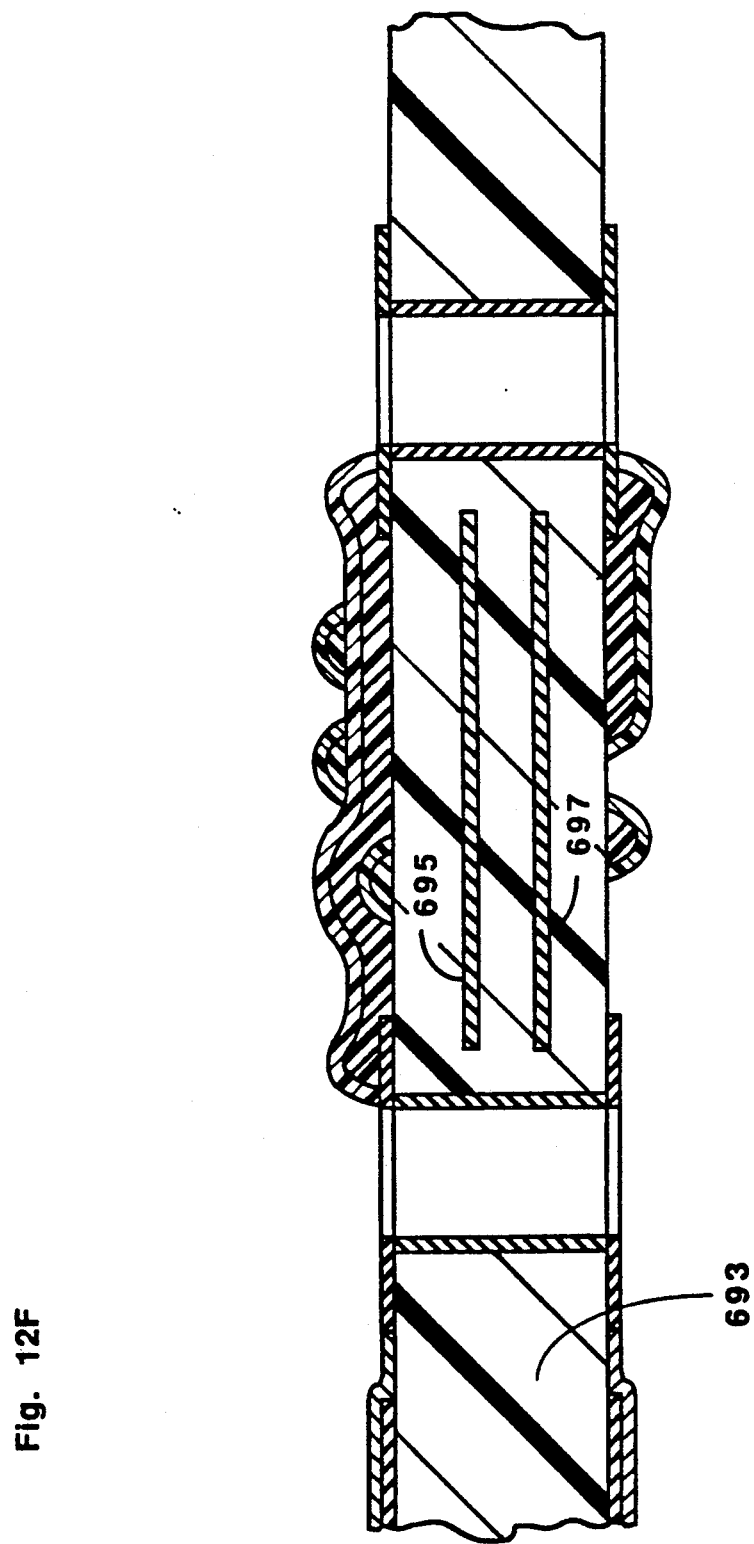
FIG. 12F shows a section along line A—A of FIG. 12E.

FIGS. 12E, F, and G show different views of a portion 693 of a printed circuit board similar to the board shown in FIGS. 12B, C, and D. The main difference between the two boards is that in the board of FIGS. 12B, C, and D, which is known in the art as a two-layer board, all elements are on one surface or the other of the board, the two board surfaces constituting the two layers. In the board of FIGS. 12E, F, and G there are conductive elements internal to the board. Power planes 695 and 697 are copper conductive traces formed on the surface of thinner boards that are subsequently laminated together so that the power planes are buried in the resulting board at two different levels. The elements on each surface, including traces written by the circuit writer, and the power planes within, comprise the four layers of this four-layer pcb.

One prior art method of preparing circuit boards, particularly prototype boards, is by connecting fine wire between electrically conductive through holes on a board. Such a board is called in the art a "wire wound" or "wire wrap" board, or pwb, and this practice is a typical method in the prior art of prototyping boards. A board prepared by the circuit writer can achieve a circuit density equivalent to the density of a wire wound board of at least 6 layers and in some cases 8 or 10 layers.

As indicated earlier, the use of extruded polymer thick film for traces results in a few changes in the router rules from what would normally be used in a wet process manufacture. In the preferred embodiment, since boards in the industry do not typically have landing pads for connecting component leads, one new router rule is that the extruded PTF must end on a corner of a pad, and that there can be only one trace on a corner. Similarly, when a trace enters or leaves a pad, it generally is constrained to extend a given distance before turning, in order to leave room for attachment to the other pads. A typical distance is to use the sum of the trace spacing and half the width of the trace. Another rule is to avoid a sequence of turns that are too close together. This is typically done by requiring that once a turn has been made, that the trace continue some minimum distance before another turn is made. A typical example of such a requirement would be to require the distance before a second turn could be made to be half of the sum of the trace width and the trace spacing. Another rule is that crossovers are permitted. However, for convenience in the presently implemented apparatus, only one crossover is allowed at a particular point. An additional rule is that the traces should cross at right angles. This latter rule, and all of the above rules are predicated on the convenience of having each line segment of a trace lying along the directions of the x- and y-axes. Clearly many of these rules can be relaxed or completely eliminated if one is willing to lose the convenience of the x-y orientation of the line segments making up the traces. An additional rule that is presently used for convenience, is that there are no traces on top of, and along the same direction as, another trace. As will be described subsequently, however, this rule can be relaxed when higher densities are very important. With the above changes in router rules, it is possible to take convenient advantage of the x-y nature of the stage assembly and still simulate the routing of a wet process board or wire wrap construction.

Figure 12H:
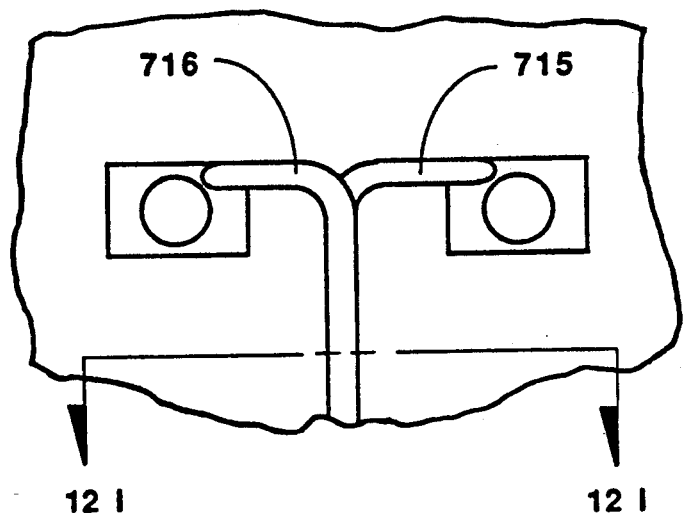
FIG. 12H shows a plan view of two pads and a compound trace.
Figure 12:
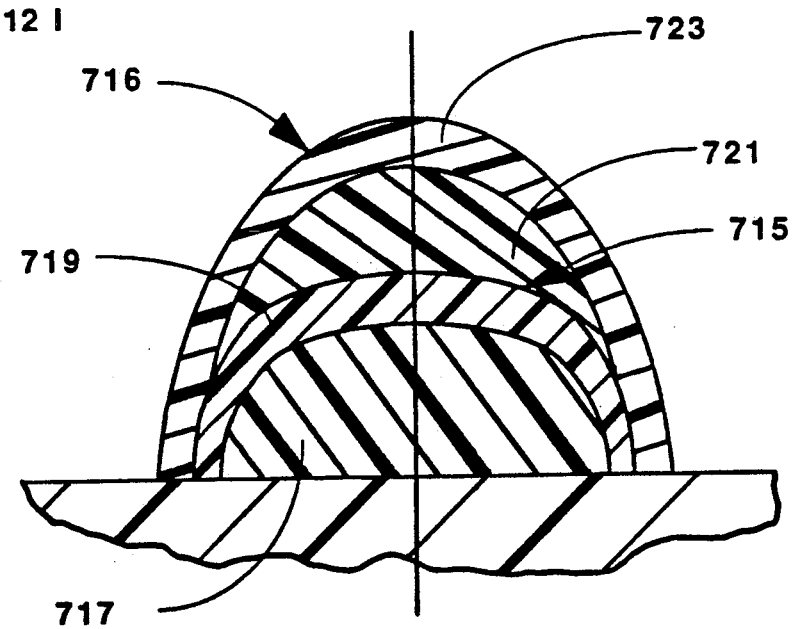
FIG. 12I shows a section of the compound trace from FIG. 12H along line A—A.

As indicated above, there are instances in which it is desirable to have one trace along the top of another trace. By relaxing the router rules, this arrangement conserves board space by increasing the number of traces that can pass by between adjacent pads. FIG. 12H shows two pads, each with a trace contacting one corner. Trace 715 extends from one pad and turns ninety degrees, and trace 716 extends from the other pad and turns in the same direction as trace 715 and lays over the top of trace 715. FIG. 12I is a view of section A—A of FIG. 12H, and shows the two traces. Trace 715 has two portions, a conductive portion 717 and an insulative portion 719. At the position of section A—A where the two traces are superimposed, one above the other, trace 716 lies directly over trace 715. Trace 716 also has two portions, a conductive portion 721 and an insulative portion 723. Typically each portion of each trace is written in a separate pass of the write carriage. The conductive portions of the two traces do not contact, and there is therefore no electrical interference between the traces.

ALTERNATIVE POLYMER DELIVERY SYSTEMS

Figure 13A:
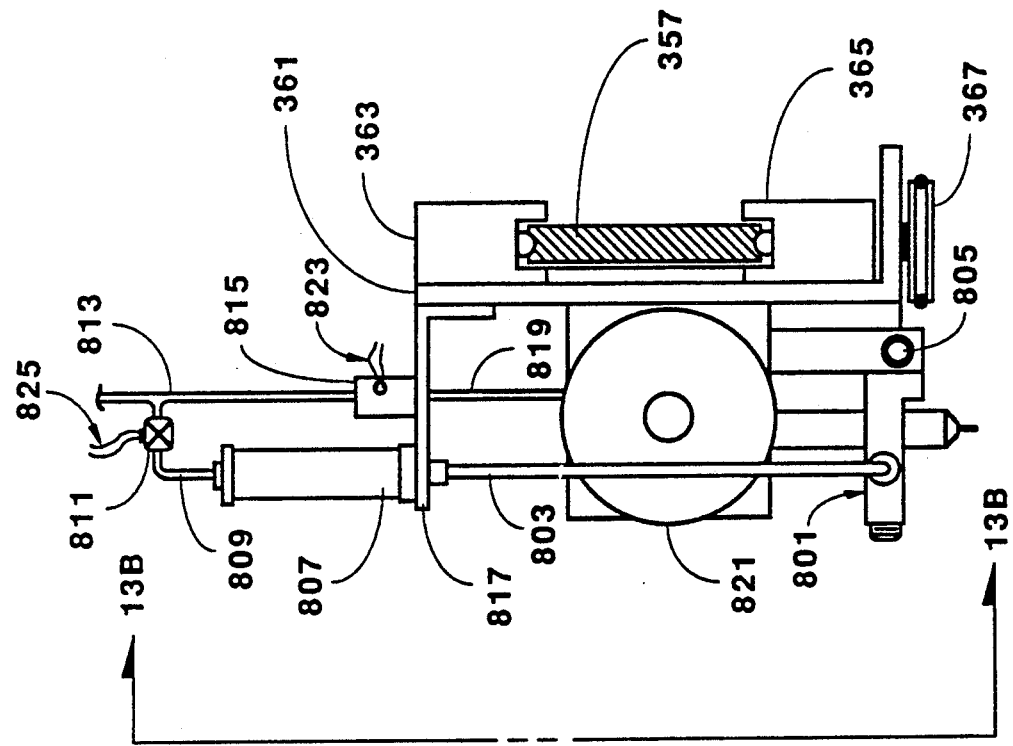
FIG. 13A is a side elevation view of a write carriage according to an alternative embodiment of the invention called the Minibung embodiment.

In addition to the standard valving system described above, a number of alternative preferred embodiments and approaches have been used for the polymer delivery and supply which have some operational and manufacturing benefits over the standard valving system. FIG. 13A is a side elevation view of a write carriage 800 in an alternative preferred embodiment, hereinafter called the Minibung embodiment, which uses some elements that are different from those of the embodiment shown in FIG. 6A. The direction of observation in FIG. 13A is the same as in FIG. 2E, which shows a section through the cross-rail assembly adjacent to the write carriage. Bearing blocks 363 and 365 are attached to spacer plate 361, and the assembly travels on Schneeberger rail 357, just as in the before-described embodiment shown in FIG. 6A. The z-direction drives for the Minibung embodiment are substantially the same as for the other described preferred embodiments.

Figure 13B:
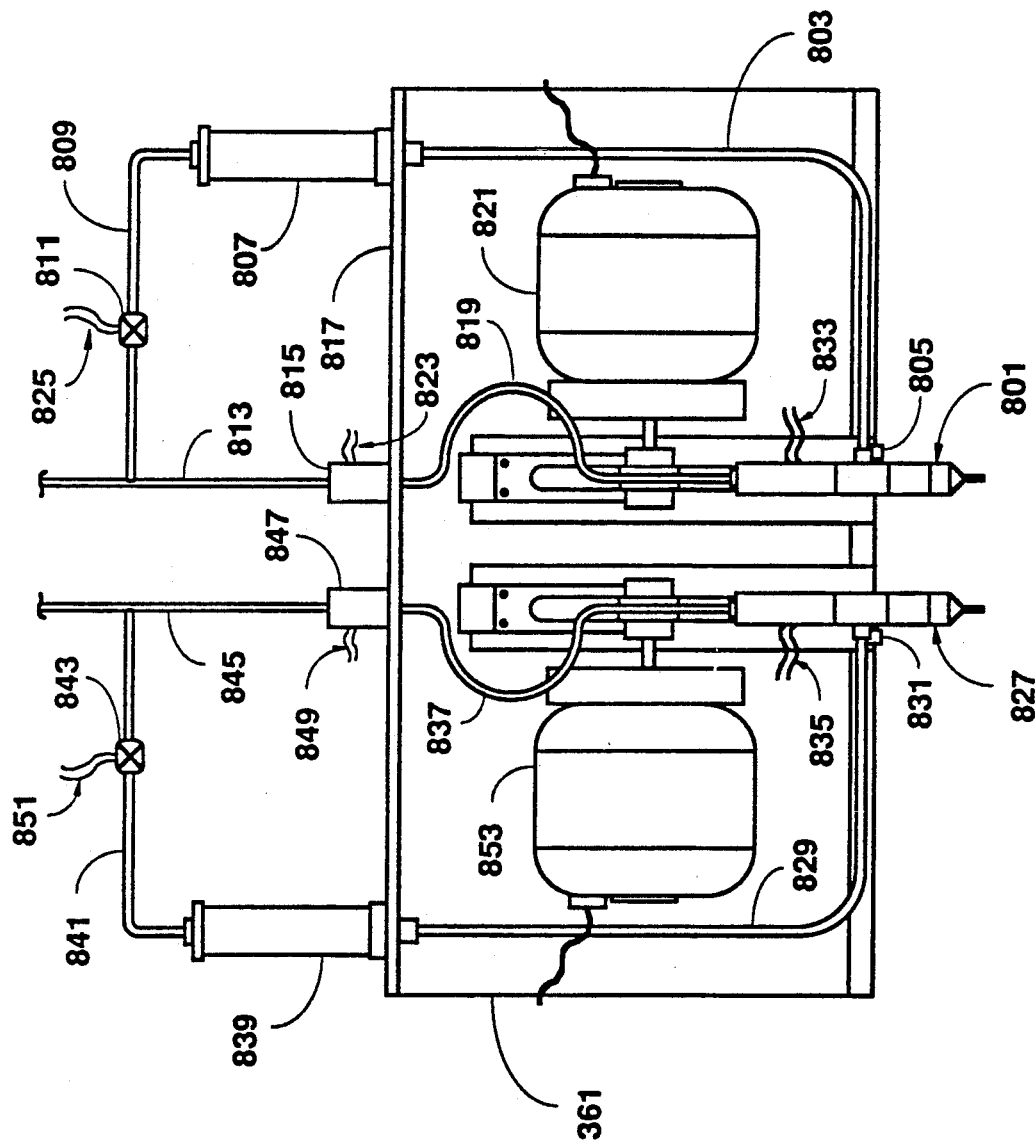
FIG. 13B is view of the write carriage shown in FIG. 13A from the cut A—A.

FIG. 13B is a view of the write carriage of FIG. 13A in the direction of the arrows A—A, and shows two z-direction drives, one driven by motor 821 and the other by motor 853. Each of the z-direction drives carries a Minibung polymer extrusion unit. Minibung 801 is carried by the assembly driven by motor 821 and Minibung 827 is carried by the assembly driven by motor 853.

Minibung 801 is secured into the vertical slide of one z-direction drive by a thumbscrew 805, and Minibung 827 is secured in the vertical slide of the other z-direction drive by thumb screw 831. Each Minibung stores a quantity of polymer and meters it through a write tip to write a circuit trace. Typically one Minibung meters insulating material and the other meters conductive polymer.

Each of the two circuit writing assemblies on the write carriage has a polymer reservoir that is driven by gas pressure and supplies polymer to each respective Minibung. Polymer reservoir 807 supplies Minibung 801 through supply line 803, and gas is provided to reservoir 807 through gas line 809. Remotely actuated valve 811, controlled by electrical signals from control system 43 through control lines 825, turns the gas supply to reservoir 807 off and on. Polymer reservoir 839 supplies Minibung 827 through supply line 829, and gas under pressure is supplied to reservoir 839 through gas line 841. Remotely actuated valve 843, controlled by electrical signal from control system 43 through control lines 851, turns the gas supply to reservoir 839 off and on.

Each polymer reservoir is a modular unit that may be quickly removed and replaced by another polymer reservoir. The tubings are attached to the reservoir by fittings that may be quickly disconnected, and each reservoir is held in place on shelf 817 in the preferred embodiment by clamps not shown. The ability to quickly replace reservoirs allows a fresh polymer supply to be inserted at the start of an operation, and a new supply to be quickly added as needed or as the previous supply is deleted. Polymer materials are typically stored in a refrigerated storage to retard premature polymerization, and heat may be added in the Minibung near the write tip to bring the polymer to a desired working temperature.

Each Minibung unit has a storage volume that stores a smaller supply of polymer than the volume available in a replacable reservoir. The volume of storage in a Minibung is calculated to be at least the amount needed to write a typical trace in a single pass. Minibungs are recharged from the respective reservoir between writing passes through a unique valving and metering arrangement built into each Minibung, and driven by gas pressure applied to the reservoir through the gas line attached to each reservoir.

Once polymer is supplied to a Minibung storage volume, the gas supply valve is closed to the reservoir and writing may begin. Polymer is urged from a Minibung by gas pressure supplied from the same source as the gas to each polymer reservoir. Gas to Minibung 827 is supplied through line 837, and gas is turned off and on, and pressure is controlled by gas control unit 847, actuated through control lines 849. Gas to Minibung 801 is supplied through line 819, and gas is turned on and off and pressure is controlled by gas control unit 815, actuated through control lines 823. Each Minibung has a gas-activated piston to urge polymer from the write tip, and the rate at which polymer is metered from a Minibung is remotely monitored by sensing the position and movement of the piston by an LVDT device (not shown in FIG. 13A or 13B). The sensing device for Minibung 801 is controlled through control lines 833, and the device for Minibung 827 is controlled through control lines 835.

FIG. 14A is a cutaway view of Minibung 801. FIG. 14A is typical of Minibung 827 as well. There are three principle portions: Body portion 855, metering portion 857, and write-tip portion 859. A central passage 861 vertically through body portion 855 connects metering portion 857 and write tip portion 859. A second passage 865 through body 855 connects to passage 861 at substantially a right angle. Passage 865 has a threaded portion 867 and a portion 869 of smaller diameter than the rest of the passage.

A movable shut-off piston 863 in passage 865 controls polymer inflow from supply line 803. Incoming polymer from line 803 passes through passage 897 into passage 865. Passage 897 is shown 90 degrees out of position in body 855 for convenience only. Piston 863 is sealed in passage 865 by o-ring 871 in a groove in the piston, and the piston is urged in the direction of vertical passage 861 by a coil spring 873. An adjustable stop 875 in threaded portion 867 of passage 865 limits the travel of shut-off piston 863 and controls the pressure exerted on piston 863 by spring 873.

Figure 14B:
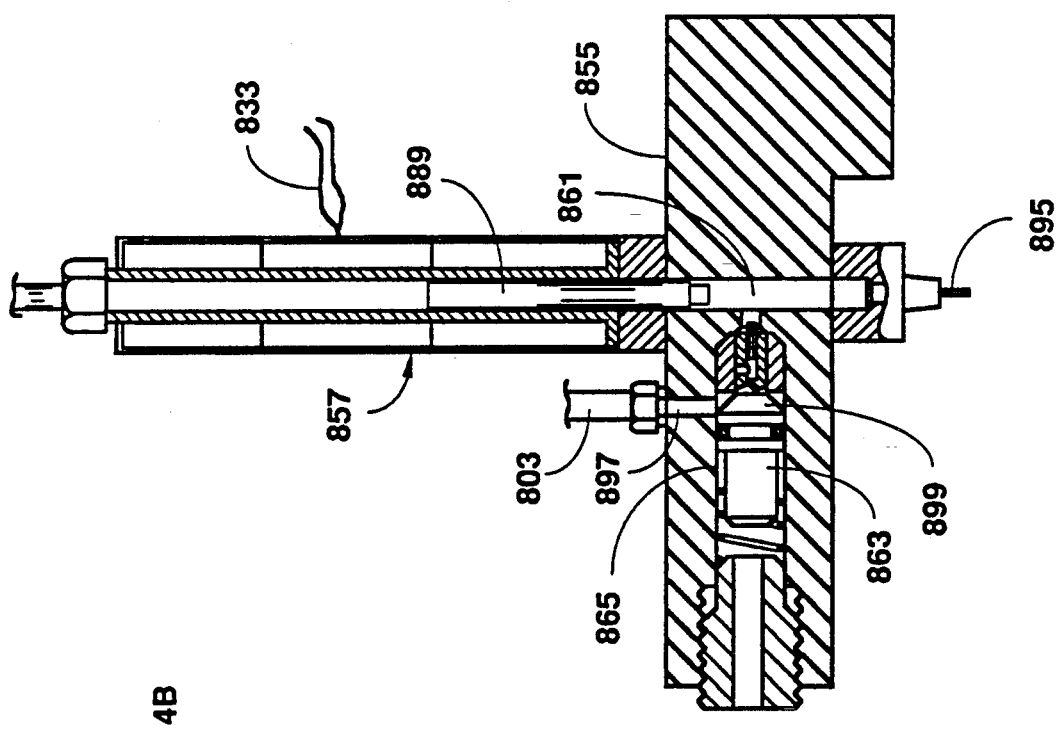
FIG. 14B is a cutaway view as in FIG. 14A, but with a different position for the operable parts.

An insert 877 in passage 865 provides a guide passage 879, and shut-off piston 863 has an extension 881 that fits closely in the guide passage. A passage 883 is fashioned into extension 881 to provide a conduit for polymer between passage 865 and passage 861 in body 855. This passage is open to pass material when piston 863 is in the retracted position shown in FIG. 14A. FIG. 14B shows the same cutaway view as FIG. 14A, except piston 863 is shown in a forward position, closing the passage for polymer. Extension 885 is a replaceable tubing to adjust the diameter and length of the polymer passage.

Metering portion 857 of the Minibung has a central cylindrical volume 887 of substantially the diameter of passage 861 with a close-fitting metering piston 889. The metering piston is fashioned of magnetically permeable material, which in the preferred embodiment is magnetic stainless steel. Metering piston 889 is free to slide vertically in the diameter of volume 887. An LVDT device 891 surrounds passage 887 and magnetic piston 889, and through electrical leads 833 to control system 43, the position and rate of movement of piston 889 is monitored.

Write-tip portion 859 of the Minibung is attached to body 855 at the opposite end of passage 861 from the metering portion, and has an internal passage 893 through which polymer passes during a circuit writing operation. Passage 893 ends in a write-tip 895, which writes a trace on a PCB during a circuit writing operation.

Operation of the refill and extrusion system in the Minibung embodiment is best described with reference to FIGS. 13B, 14A, and 14B. When a circuit writing operation is complete, and the supply of polymer in volume 887 is largely depleted, the volume is refilled from reservoir 807. Gas control unit 815 is operated by the control system to relieve gas pressure on gas line 819 and valve 811 is opened to apply gas pressure from a pressure regulated external supply to reservoir 807. Supply pressure is typically about 50 psi. The gas pressure over the polymer supply is communicated to face 899 (FIG. 14B) of piston 863 and the differential to atmospheric pressure on the other side of the piston over the area of face 899 provides a sufficient force to move piston 863 in passage 865 from the closed position shown in FIG. 14B to the open position shown in FIG. 14A.

With passage 883 exposed to passage 865 polymer from reservoir 807 flows through extension tube 885 into passage 861. Gas pressure has been relieved on tube 819, so piston 889 is urged upward, and volume 887 fills with polymer. The position of piston 889 is monitored through the LVDT device, and filling is terminated at a preset position with cavity 887, passage 861, and passage 893 filled with polymer. The rheology of the polymer material is such that the filling pressure does not result in sufficient pressure in the write tip to cause flow to commence, so there is no flow from the write tip during filling. Closing valve 811 vents line 809 removing gas pressure from the reservoir, hence from face 899 of piston 863, and spring 873 urges piston 863 to the closed position as shown in FIG. 14B.

To write a trace with write tip 895 it is necessary to operate the x-, y-, and z-drives according to the descriptions above for other preferred embodiments, and to control the flow of polymer. Polymer flow is controlled by the control system through gas control unit 815, which controls both the flow rate and pressure of gas into line 819. In the preferred embodiment control unit 815 incorporates a Norgren Reedex model number NC-V321P3-2BNN pressure control valve and a pressure sensitive transducer. Gas pressure above piston 889 urges the piston downward against the polymer in volume 887 and causes polymer to extrude from the write tip. The position and rate of travel of piston 889 is monitored by the control system as is the gas pressure in line 819, and a preprogrammed flow rate of polymer is achieved by operating control unit 815 in response to the sensed parameters. When the position of piston 889 again indicates that the Minibung storage volume needs refilled, the refill operation is again performed.

The second circuit writing assembly on the write carriage, utilizing Minibung 827, is operated in substantially the same manner as described above for the first Minibung assembly. Typically one assembly is for extruding conductive polymer and the other is for extruding insulating material.

MILLING, MACHINING, AND ALTERNATIVE CONSTRUCTION OF BOARDS

Figure 15:
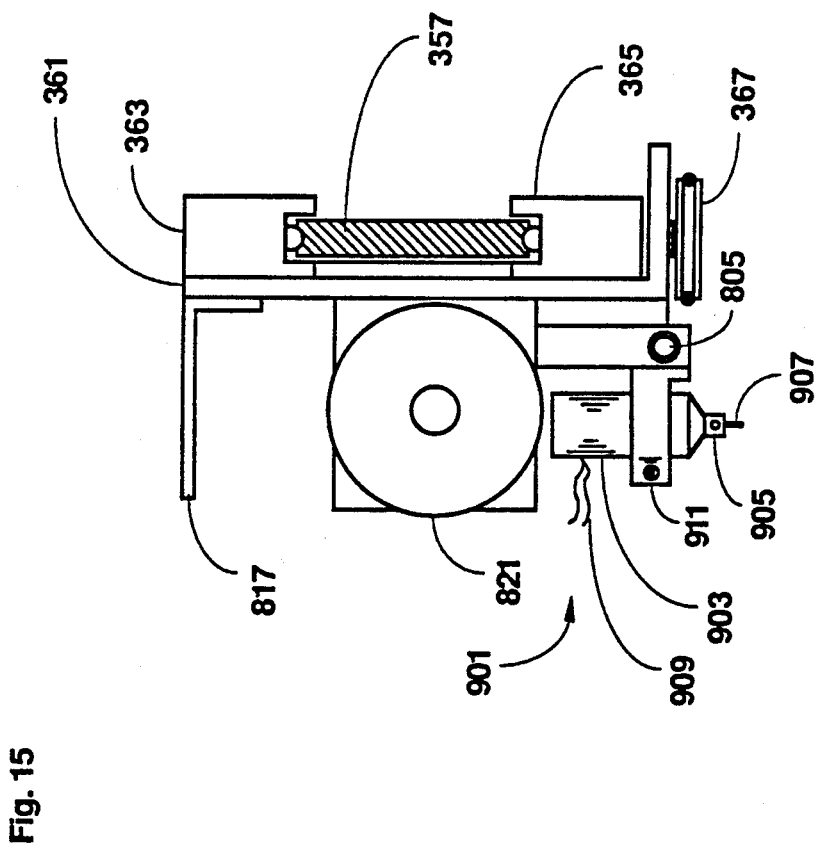
FIG. 15 shows a side view of a carriage for holding a machining head.

The ability of the Circuit Writer to move circuit writing assemblies in three dimensions and to follow programmed and calculated paths to create precise and complex patterns provides a further capability in prototyping, manufacturing, and repairing printed circuit boards that has not been previously discussed in detail. FIG. 15 is a side elevation view of a carriage similar to the carriage shown by FIG. 13A, except the carriage of FIG. 15 supports and manipulates a machining head instead of an extrusion assembly.

In FIG. 15 a machining head 901 is held in a z-drive slide in a saddle 911 with a clamp screw 805. With a machining head mounted, there is no need for a polymer reservoir or gas control elements to operate the reservoir or a Minibung, so such elements are not shown in FIG. 15. A variable speed electric motor 903, a tool chuck 905, and a machining tool 907 are important elements of machining head 901 to be used in applications where machining is required. The electric motor is controlled by control system 43 through electrical leads 909.

In the preferred embodiment tool chuck 905 is a clamping device for small diameter mills and drills, and exchange of tools is accomplished manually by an operator with the machining head moved to a position away from the area where a PCB blank would be mounted for processing. In an alternative embodiment, various tools are maintained in a rack in an exchange area, each having a position known by the control system, and the chuck is electrically operated by the control system. In the alternative embodiment, exchanges of the available machining tools may be programmed and accomplished automatically.

Machining tools in the preferred embodiment are one or another of various mills and drills designed for performing specific types of operations on PCBs. For example, a drill of about 0.028 in. (0.71 mm) diameter may be mounted in the tool chuck, and a precise and complex pattern of holes of about 0.028 in. (0.71 mm) diameter may then be machined into and through a printed circuit board blank. Such a hole pattern is useful in a prototyping operation, for example, to mount electrical leads from discrete components to a board. Alternatively, a milling tool may be mounted, and specific areas of copper cladding on a PCB blank may then be milled away under programmed control, leaving isolated areas of conductive copper cladding as conductive pads to be used in a circuit to be written. Cured polymer materials on a blank may also be machined to form useful structures. There are a large variety of useful operations that may be performed relative to prototyping, manufacture and repair of PCBs by the circuit writer apparatus with machine tools mounted on the carriage.

A general requirement in the construction of many prototype PCBs is to create conductive pads and to connect the pads with conductive traces. The pads are mounting points for leads from discrete components to be added to the board to complete a circuit, and the conductive traces between pads become the conductive circuit paths between discrete components. In the creation of PCB structures such as pads and traces, there are many alternative schemes that may be employed, using clad or unclad PCB blanks and combinations of machining and circuit writing techniques with the circuit writer apparatus. Several application examples are described in the following paragraphs, and the examples are numbered for future reference. Dimensions of traces and other structures in the examples are of the same order as dimensions described above for similar structures. Such dimensions vary with design rules.

1. FIG. 16A shows a partial section in elevation through a clad blank used as a starting point in a prototyping operation. The blank is a non-conductive, reinforced epoxy material 913 clad on both sides with a copper layer 915, and an insulating layer of polymer material 917 overlays the copper layer. Although not required, for improved ohmic contact such clad boards can be gold flashed before depositing polymer materials. In an initial step pads are created using the circuit writer in the machining mode and milling through both outside layers of material to the non-conductive blank. FIG. 16B is a plan view in reduced scale of a channel 919 milled through the two outer layers on one side to create a substantially rectangular pad 921. The substantially rectangular shape is arbitrary. Pads of any desirable shape can be milled. Also, during machining operations holes may be drilled through the board connecting pads on opposite sides of the board if the component mounting scheme to be used requires holes. Holes are not shown in FIGS. 16A through 16D.

FIG. 16C is a partial section through pad 921 and channel 919 on one side of the blank. In FIG. 16C the insulating overlayer is still present on the newly created pad, and would interfere with mounting of discrete components.

FIG. 16D shows the section of FIG. 16C after additional steps. The insulating overlayer on the pad has been milled away using the circuit writer in the machining mode, leaving the copper layer exposed for mounting to leads of discrete components. Channel 919 has been filled with insulating polymer 923 using the circuit writer in the writing mode with insulating polymer, and a conductive trace 925 has been written from the newly formed pad leading to another point on the PCB. Conductive trace 925 is insulated from the underlayer of copper in the non-pad areas of the PCB both by channel insulator 923 and by the insulating overlayer 917, and on top by an insulator extrusion 926. This procedure can be used to create a large number of mounting pads on a board and to connect the pads in a circuit pattern with conductive traces. Those skilled in the art will appreciate that the balance of the cladded surface not used for pads may be used for a ground plane or for a power plane.

2. FIGS. 17A, 17B, 17C and 17D illustrate an application beginning with a bare clad board. The starting board, shown in FIG. 17A in partial section, is a non-conductive, reinforced material 927 with copper cladding 929. In a first step a channel is milled through the clad layer to form isolated copper pads, as in procedure #1 above. Holes may be drilled to connect pads on opposite sides if required, although not shown. Insulative material 931 is written between pads in the desired circuit pattern to form an insulative roadbed, then conductive material 933 is written over the insulative material to provide the conductive trace. The insulative roadbed insulates the conductive trace from the areas of copper cladding between pads. A single layer circuit may be formed in the manner described. If a further protection of conductive trace 933 is desired, an insulative overtrace 935 may be written over the conductive trace, then traces may cross, and more than a single layer of circuitry may be written.

Figure 17B:
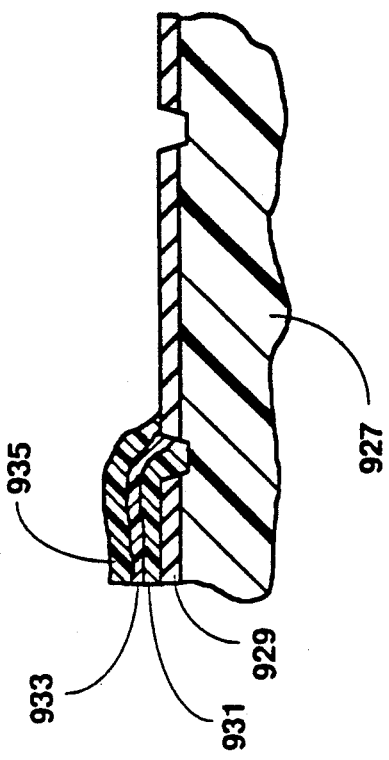
FIG. 17B shows a cross-section of the circuit board of FIG. 17A after additional steps.
Figure 17D:
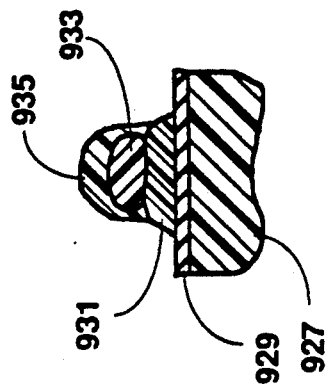
FIG. 17D shows a cross-section of an insulative trace over the conductive trace of FIG. 17C.
Figure 17A:
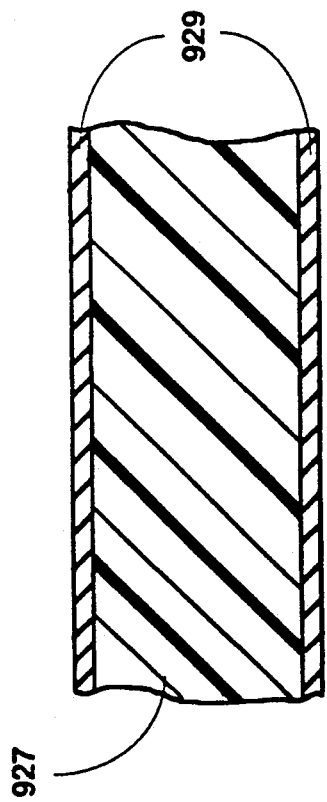
FIG. 17A shows a cross-section of a circuit board blank.
Figure 17C:
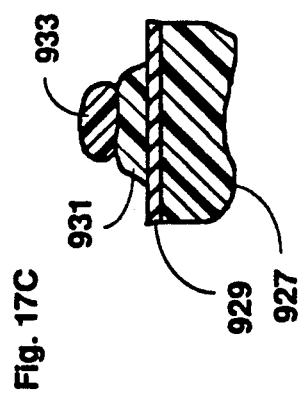
FIG. 17C shows a cross-section of a conductive trace shown in FIG. 17B.

FIG. 17C is a cross-section of a conductive trace on an insulative roadbed. FIG. 17D is a cross-section of the trace of FIG. 17C with an insulative overtrace added. The addition of the overtrace provides complete enclosure of the conductive trace between pads. The relative shaping of the insulative roadbed, the conductive trace and the insulative overtrace is controlled by controlling the rheology of the polymeric materials, both conductive and insulative, and by choice of writing tip, z-height, and pressure used to extrude the respective materials.

3. Another alternative for traces between pads formed by milling channels in a copper clad board, as in procedure #2 above, is illustrated in FIGS. 18A, 18B, and 18C. FIG. 18A is a plan view showing two substantially rectangular pads 937 and 939 formed by milling channels 941 and 943 through the copper cladding 949 of a clad board blank. An additional channel 945 has been milled through the copper cladding connecting channels 941 and 943. Milled channel 945 performs the purpose of the insulative roadbed of procedure #2 above. A conductive trace 947 is written between pads 937 and 939 within the boundaries of channel 945, and at a width substantially less than the width of channel 945, so the conductive trace does not touch the copper cladding at either edge of the channel. FIG. 18B is section 18B—18B of FIG. 18A, and shows the conductive trace within the channel between pads. As shown in FIG. 18C, an additional insulative overlayer 948 may be applied to the conductive trace.

4. FIGS. 19A, 19B and 19C show a procedure using the circuit writer apparatus in its various modes for creating polymer pads on non-conductive, unclad boards. FIG. 19A is a plan view showing five traces written side by side. Traces 951, 955, and 959 are insulative polymer, and traces 953 and 957 are conductive polymer. FIG. 19B is section 19B—19B of FIG. 19A, and shows that the three insulative traces in the side-by-side array have more height above the board surface than the conductive traces. Traces 961 and 963 are insulative traces, and are written over the five side-by-side traces at about 90 degrees. Once the traces and pads are formed, the board is cured and components are attached using an attachment means such as conductive adhesive or solder, as is standard in the art. FIG. 19C is section 19C—19C of FIG. 19A, and shows the relationship of one conductive trace to the two insulative cross traces. The arrangement of the insulative traces relative to the conductive traces forms two pockets where component leads 965 and 967 register, and rest upon conductive pads. The use of two conductive trace pads is arbitrary. As many pads as desired may be traced side-by-side or in other relationships. After polymer pads are formed, traces from one pad to another using conductive polymer may be written as described above.

5. Many PCBs are produced with an inner conductive plane, often used as a ground plane. In the process of prototyping PCBs of this sort a special problem is the ability to connect from a pad on one side of a clad board to a pad on the other side, while avoiding shorting to the inner conductive plane. Paths from one side of such a board to and through inner planes are sometimes called vias.

Figure 20:
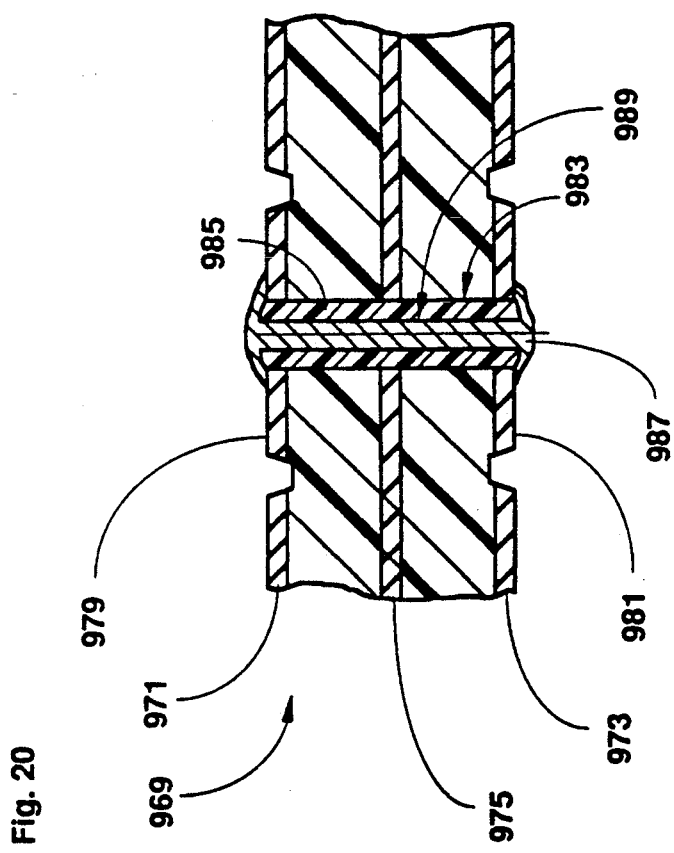
FIG. 20 shows a cross-section of a clad board with electrical connections from one face to an opposite face using extruded polymer according to the invention.

FIG. 20 is a section of a board 969 with copper cladding 971 on one side and 973 on the other, and an inner conductive plane 975. Two pads 979 and 981 are created by channeling as described in above procedures. A hole 983 is drilled in a next step, piercing pads 979 and 981 and inner plane 975. After the hole is drilled, polymer extrusion with the circuit writer fills the hole with insulative material. The hole filling process can be accomplished either by bringing a write tip of the circuit writer very nearly in contact with the board at the position of the hole, and extruding material into the hole, or by inserting the tip into the hole, beginning extrusion, and withdrawing the tip.

The insulative polymer is cured, typically requiring that the board be removed from the circuit writer. After curing, the board is remounted, and a hole 989, smaller in diameter than hole 983, is drilled substantially on the centerline of hole 983. As an example, hole 983 is typically 0.020 in. (5 mm) in diameter, and hole 989 is 0.010 in. (0.025 mm) in diameter. The circuit writer is again used to extrude into a hole, this time extruding conductive polymer into hole 989, and overlapping the insulative polymer on each end to make contact with both pads 979 and 981. The result is an insulative annulus 985 effectively shielding an inner core 987 of conductive polymer from inner plane 975 while the inner conductive core connects the two pads on opposite sides of the board.

6. FIGS. 21A and 21B illustrate a second procedure for connecting pads on opposite sides of a board with an inner conductive plane. Board 991 has exterior cladding 993 and 995 and an inner conductive plane 997. Pads 999 and 1001 are created by milling channels as described above.

A slot 1009 of width D is milled through the board between the two pads. The slot is tapered with a length L on one side and a length S on the other. The longer dimension is on the side from which machining is accomplished. Dimensions can vary considerably with differing board designs and design rules. A typical length L is 3 mm and a typical length S is 1 mm.

A first bed 1003 of insulative polymer is extruded using the circuit writer. Bed 1003 is the full width D of the slot. Dimension D is typically about 1 mm. Next a trace 1005 of conductive polymer, less than the width of bed 1003, is extruded onto bed 1003. Trace 1005 contacts both pads 999 and 1001. Next the slot is filled with insulative polymer 1007, completely enclosing the conductive trace, so that there is no possibility of contact with inner plane 997. As a final step in the procedure, the board is removed and the polymer extrusions are cured. An advantage of the procedure is that there is no intermediate curing operation required, as there is in the via procedure with a hole drilled between pads.

7. The ability afforded by the variety of operating modes of the circuit writer offers other possibilities for creating structures for PCBs. The extruded and cured polymer materials, both conductive and insulative, may, for example, be machined. FIGS. 22A and 22B illustrate a procedure for creating extruded polymer pads with registration for leads of discrete components, somewhat different than the polymer pad procedure described above.

FIGS. 22A is a plan view of a procedure for preparing a polymer pad with registration for leads of a discrete device. FIG. 22B is an elevation view of FIG. 22A from the vantage of line A—A in the direction of the arrows. Two insulative traces 1011 and 1013 are extruded side-by-side and cured. After curing, the circuit writer is utilized to mill three slots 1015, 1017 and 1019.

Figure 23B:
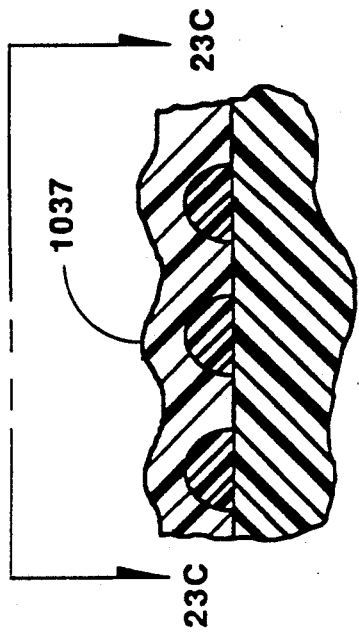
FIGS. 23A–23B show a cross-section of a board illustrating a succession of steps in producing a polymer pad with lead registration according to an alternative embodiment.
Figure 23D:
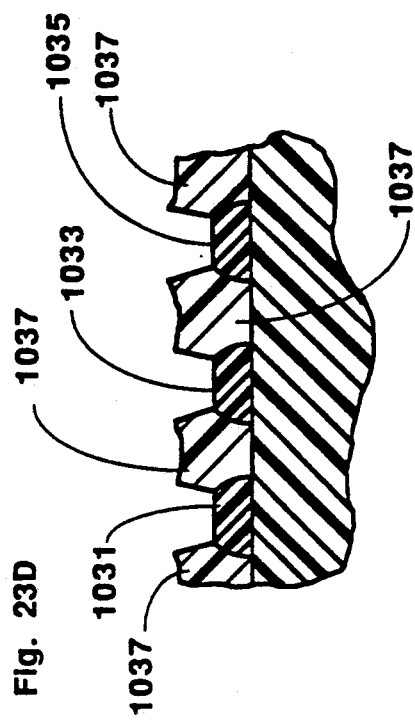
FIG. 23D shows a cross-section of the pad of FIGS. 23A–23C on completion.
Figure 23A:
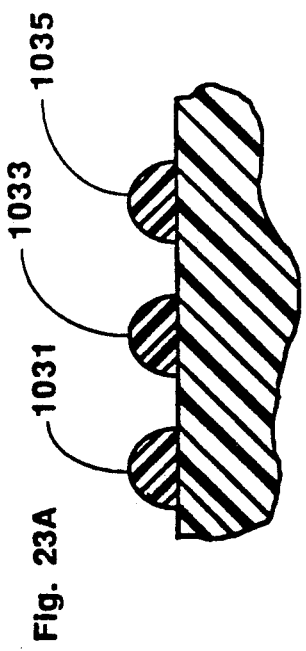
Figure 23C:
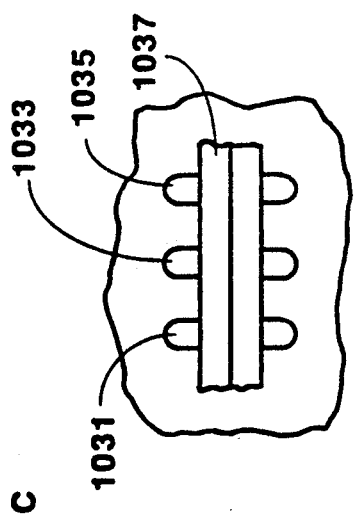
FIG. 23C shows a plan view of a pad according to the method of FIGS. 23A–23B at an intermediate stage.

Conductive polymer traces 1021, 1023 and 1025 are then extruded across the path of the two original insulative traces and in the milled slots. The conductive traces are extruded to be at a lower height above the board surface than the insulative traces. After the conductive traces are cured, they serve as mounting pads for leads of discrete devices, and the difference in height of the conductive versus the insulative traces provides registration for the leads of devices to be mounted. The use of two insulative and three conductive traces is arbitrary. As an alternative, it should be appreciated that one could also put down the conductive traces first. This is illustrated in FIGS. 23A–23C. The conductor traces 1031, 1033, and 1035 are extruded on the substrate first. Then a layer of insulator 1017 is extruded over the conductors as in FIGS. 23B and 23C, usually with more than one pass of the insulator. Then the board is cured and milled leaving the conductive traces 1031, 1033, and 1035 with accurately flat tops, and clean sidewalls for the insulator layer 1037 as illustrated in FIG. 23D.

POLYMER MATERIALS CONSIDERATIONS

The first and second materials, i.e. the materials used for forming the conductive and insulative traces, are formulated to have certain preferred characteristics to operate satisfactorily with the apparatus of the invention. In particular, the rheological properties of the first and second materials are adapted to the particular embodiment of the apparatus employed, e.g. the particular system of reservoirs, tubing, means for delivering the polymer solutions, and the like, and place constraints on the rheological properties of the first and second materials. Preferably, the first and second materials possess the following rheological characteristics: (i) They exhibit little or no thixotropic hysteresis with increases and decreases in stress, e.g. as would occur during a deposition, or extrusion, step. (ii) They are psuedoplastic. (iii) They undergo an increase in viscosity immediately after extrusion so that, at most, only negligible mechanical deformation takes place whenever crossover traces are laid over an existing trace during the circuit writing process, so that curing is not required between different layers of traces. With regard to the mechanical characteristics, the materials must flow conveniently out of the write tip, but once applied to the surface of the pcb should not flow, but instead have enough mechanical stability to maintain a relatively narrow trace width and adequate thickness to provide good current carrying capacity, or insulating capability, as the case may be. As a practical matter, in the preferred embodiments, these mechanical characteristics correspond to a having practical a range of viscosities for the first (conductive) material of between 15,000 and 30,000 centipoise at a static shear rate of 20/sec., while at a low shear rate of less than about 0.01/sec., the practical range of viscosities should be between one million and five million centipoise, which is quite stiff. As a general rule, however, a somewhat reduced range of viscosities between 20,000 and 27,000 is more preferred at the higher shear rate, and the most preferred range is between 22,000 and 25,000 centipoise. For the second (insulator) materials, the practical range of viscosities for a high shear rate of 20/sec., appears to be about 15,000 centipoise to about 30,000 centipoise, with a more preferred range of about 20,000 to 22,000 centipoise. For the low shear rate, below about 0.01/sec., the practical range appears again to be about one million to five million centipoise, with a preferred operating point of 2.5 million centipoise, as it is also for the conductive material. It should be appreciated, however, that for some formulations, the viscosity is dependent on temperature, and, using the preferred materials and apparatus, it is sometimes useful to control the temperature of the write tip to achieve the desired flow characteristics. For example, in EXAMPLE 2 discussed below, a write tip temperature of 40 degrees C.±1 degree C. is preferred. For that formulation, the viscosity is a strong function of temperature. Hence, it is useful if the temperature is well controlled during circuit writing in order that the shape and repeatability of the traces be adequately controlled. Higher temperatures could be used, for example 60 degrees C., which would relieve somewhat the temperature constraints. However, as the temperature is raised, the operating temperature more closely approaches the polymerization temperature. For the EXAMPLE 1 to be discussed below, no temperature control is typically used.

In accordance with the invention, control of the rheological properties of the first and second materials can be achieved in several ways, including selection of resins or polymers of an appropriate molecular weight as components of the first or second materials, selection of the type and quantity of solvents, selection of the reactive functionalities which contribute to polymerization, selection of catalysts, and the like. Guidance in making such selections can be found in many standard references in polymer science, e.g. Mark et al, *Physical Properties of Polymers* (American Chemical Society, Washington, D.C., 1984); Miller, *Solid State Technology* (October, 1974); Kaufman, ed. *Introduction to Polymer Science and Technology* (John Wiley & Sons, New York, 1977); and Tess et al, eds. *Applied Polymer Science* (American Chemical Society, Washington, D.C., 1985).

The post-extrusion hardening, or viscosity increase, in the first and second materials can be brought about in several ways depending on the polymer system selected, e.g. partial curing by light energy or heating, drying, or the like. In the preferred groups of first and second materials, hardening is brought about prior to curing by drying, i.e. solvent evaporation. Such pre-cure drying is conveniently achieved by mixing the polymer precursor materials, catalysts, conductive particles, and the like, in a solvent mixture, at least one component of which is a solvent with a high evaporation rate. Solvents with suitably high evaporation rates include acetone, tetrahydrofuran, ethyl acetate, methylethylketone, and the like. Although it is not required, it is preferable that drying be enhanced by passing a stream of heated air over freshly deposited traces.

It is also preferable that the first and second materials (1) be capable of low temperature curing, most preferably less than 150° C., (2) possess low ionic contamination, and (3), in the case of the first material, possess high conductivity after curing. Low temperature curing is desirable so that the substrates on which the traces are deposited will not decompose during the curing process. The substrate usually comprises standard circuit board materials, e.g. composites of epoxy/fiberglass, epoxy/fiberglass/paper, phenolic-based plastics/paper, polyimide/fiberglass, teflon/fiberglass, and the like.

Ionic contamination is undesirable because it can lead to unpredictable polymerization in some polymer systems, such as the preferred ones described below. Such contaminant-induced polymerization can severely reduce the shelf lives of the first and second materials, can render their rheological properties unpredictable, and can contribute to premature failure of electrical circuits in high humidity environments.

Curing transforms the first material into a polymer thick film which is electrically conductive. Conductivity is preferably achieved by having conductive particles as one constituent in the first material. Upon curing, the polymer brings the conductive particles into contact with one another, thereby rendering the bulk composite, that is, the polymer thick film, conductive. In some cases, however, the filling is sufficient that some moderate conductivity is exhibited even before curing. Formulation of such conductive polymers is well known in the art of polymer thick films. Generally, good conductivity in polymer thick films requires a trade off against good mechanical strength. Increases in conductivity are achieved by using larger fractions, e.g. by weight, of conductive particles in the polymer thick film. Likewise, greater mechanical strength is brought about by using a larger fraction of polymer in the polymer thick film. Thus, greater conductivity is typically achieved by some loss of mechanical strength. An important feature of the present invention is that the conductive traces have higher conductivity than that available in commonly used polymer thick films, without loss of mechanical strength. The higher conductivity is achieved by including a higher fraction of conductive particles in the first material, but the concomitant loss is mechanical strength of the overall structure, i.e. the insulated trace, is avoided by using an insulative polymer (1) which has a high degree of mechanical strength and adhesiveness to the substrate, and (2) which encapsulates and forms an exoskeleton around the conductive trace. That is, with the present invention it is possible to achieve higher conductivity because only a minimal amount of mechanical strength is needed in the conductive polymer when it is encapsulated by the insulative polymer. Such encapsulation is possible because the conductive material is applied in narrow width traces, rather than in layers by screening. Preferably, sufficient conductive material is included in the first material so that a 12 mil (0.30 mm) wide trace has at most a resistivity of 0.6 Ohms/in. Suitable conductive particles for use in the first material include, but are not limited to, silver, silver coated nickel, gold, silver coated gold, copper, gold coated nickel, and the like. Such particles are commercially available in several forms suitable for use with the invention, e.g. flakes, powders, and the like.

The second material can be applied on the conductive trace in several ways, e.g. spraying, extrusion, or the like. Preferably, the second material is extruded on the freshly laid conductive trace by a second extrusion means under programmed control of the trace routing engine. More preferably, the second material is extruded onto the conductive trace after a drying step.

Preferably, the polymer thick film formed by the second material has a low dielectric constant. Selection of dielectric constant is largely dependent on the selection of the polymer system employed, e.g. Ku et al, *Electrical Properties of Polymers: Chemical Principles* (Hamser, Munich, 1986). Generally, polymers that have fewer polar bonds in their chains have lower dielectric constants.

It is believed that whenever the first and second materials are brought into contact, components of the first material react with components of the second material to form a hydrophobic polymeric layer at the points, or surfaces, of contact between the two materials. This hydrophobic polymeric layer is referred to herein as the interfacial layer. The formation of the interfacial layer should proceed rapidly at room temperature. Such rapid formation of an interfacial layer is believed to take place in the following preferred polymer systems:

| First Material | | |
|---|---|---|
| Resin | Hardener | Second Material |
| epoxy | diamine | dicyanate |
| epoxy | diamine | epoxy |
| epoxy | diamine | isocyanate |
| isocyanate | diol | epoxy amine |
| epoxy | diol | polyamide |
| polyamide | — | dicyanate |
| polyamide | — | epoxy diol |

General guidance for selecting particular fractional compositions, catalysts, solvents, resins, hardeners, and the like, for use in the above polymer systems in accordance with the present invention can be found in the literature.

Most preferably, the first material comprises an epoxy/diamine polymer system and the second material comprises an aryl dicyanate polymer system or an aryl dicyanate/epoxy polymer system. Exemplary compositions of such first and second materials are listed below:

| FIRST MATERIAL | |
|---|---|
| Component | Weight/weight % |
| Epoxy resin (monomer to high molecular weight prepolymer) | 4 to 10 |
| diamine/polyamine hardener | 0.25 to 3.5 |
| Low evaporation rate aprotic solvent | 1 to 4 |
| High evaporation rate aprotic solvent | 2 to 10 |
| conductive particulates | 75 to 90 |

Selection of the epoxy resin to be used is largely based on the desired glass transition temperature in the cured conductor. Most commercially available epoxies can be used. The preferred epoxy resin is a monomer or (B-staged) prepolymer based on the condensation of bisphenol A (4,4'-isopropylidenediphenol) and epichlorohydrin. Other suitable epoxy resins include expoxy novolac, multifunctional amine- based epoxy resins, and multifunctional epoxy resins. Manufacturers of such resins include Shell Chemical, Dow Chemical, and Ciba-Geigy.

Preferably the amines of the diamine and polyamine hardeners are hindered for latent curing properties. Anhydrides, polyamides, and reactive imide-containing compounds may also be used as hardeners. When anhydrides are employed, one must also use an appropriate catalyst, such as boron-trifluoride-ethyl amine complex to activate the anhydride at elevated temperatures. Most preferably, aromatic amines are employed because they impart high temperature resistant properties and can be latently cured. These compounds include di- and triamine substituted toluene and other single and polyaromatics.

Preferable high evaporation rate aprotic solvents include 2-butanone, 4-methyl-2-pentanone, tetrahydrofuran, dioxane, ethyl acetate, and ethoxytetrahydrofuran. More preferably, 2-butanone is employed as the high evaporation rate solvent in the preferred first material. The high evaporation rate solvent of the first material will be referred to as the first high evaporation rate solvent. The first high evaporation rate solvent may be the same or different than the second high evaporation rate solvent used in the second material described below. Preferable low evaporation rate aprotic solvents include 2-butoxyethyl acetate, 2-methoxyethyl ether (diglyme), ethoxy ethyl acetate, propylene glycol methyl ether acetate, and 1-methyl-2-pyrrollidinone. More preferably, propylene glycol methyl ether acetate or 1-methyl-2-pyrrollidinone is employed as the low evaporation rate solvent in the preferred first material.

| SECOND MATERIAL (aryl dicyanate) | |
|---|---|
| Component | Weight/weight % (unless otherwise noted) |
| aryl dicyanate | 50 to 70 |
| thickening agent | 1 to 8 |
| aprotic solvent (high evap. rate) | 1 to 10 |
| aprotic solvent (low evap. rate) | 20 to 30 |
| hydroxyl accelerator | 1 to 6 |
| metal catalyst | 25-500 ppm |

Preferably the aryl dicyanates are dicyanate esters of bisphenol A, bisphenol F, or bisthiophenol. These materials are commercially available, e.g. as AroCy-B, AroCy-M, and AroCy-T from Hi-Tek Polymers (Jeffersontown, Ky.). Whenever cure temperatures less than or equal to about 150° C. are required AroCy B is most preferred, and whenever cure temperatures in the range of about 150°-250° C. are required AroCy M is preferred.

The thickening agent is employed to ensure that the above second material is pseudoplastic. Many basic or modified inorganic microparticulates may be used, for example fumed silica, alumina, titanium dioxide, glass microspheres, and the like.

The hydroxyl accelerators can be alkylphenols or high boiling point alcohols, such as nonylphenol, 4-hexylphenol, 4-ethylphenol, 4-sec-butylphenol, 4-tert-butylphenol, 2,6-di-tert-butyl-4-methylphenol, 2-methylimidazole, 2,4,6-trimethylphenol, and the like. Most preferably, the hydroxyl accelerator is nonylphenol.

A variety of metal catalysts can be used in combination with soluble coordination metal carboxylates or chelates. Preferred metal species include zinc, copper, nickel, iron, platinum, cobalt, manganese, and the like. More preferably, zinc is employed in combination with an acetylacetonate chelator. The metal catalyst must be dissolved in the hydroxyl accelerator before combining with the aryl dicyanates to avoid an uncontrolled reaction at sites of high catalyst concentrations. The concentration of the metal catalyst is given in ppm with respect to the concentration of aryl dicyanate only. Preferably, the high and low evaporation rate solvents are the same as those listed above for the first material, except that the most preferred high evaporation rate solvent is ethoxytetrahydrofuran and the most preferred low evaporation rate solvent is diglyme. The high evaporation rate solvent used in the second material will be referred to as the second high evaporation rate solvent.

| SECOND MATERIAL (aryl dicyanate/epoxy) | |
|---|---|
| Component | Percent by weight (unless otherwise noted) |
| epoxy | 5 to 40 |
| aryl dicyanate | 40 to 70 |
| aprotic solvent (high evap. rate) | 1 to 10 |
| aprotic solvent (low evap. rate) | 15 to 30 |
| hydroxyl accelerator | 1 to 6 |
| metal catalyst | 25-500 ppm |

Preferably, the aryl dicyanates, epoxies, thickening agents, solvents, hydroxyl accelerator, and metal catalysts are the same as described above for the aryl dicyanate second material.

EXAMPLE 1

A first material was prepared consisting (in weight/weight percentages) of 10.4% high molecular weight epoxy mixture (Dow Chemical 684 EK40, which is a solution of methylethylketone containing 40% by weight an epoxide of average molecular weight of 10,000), 2.97% 3,5-diethyl-2,4-diaminotoluene (Ethacure 100 from Ethyl Corp.), 5.6% 1-methyl-2-pyrrollidinone, 1.22% cyclohexanone, 1.31% tetrahydrofuran, and 78.4% silver particulate (in a ratio 4:1 silver flake, e.g. Silflake 282, to silver powder, e.g. Silpowder, available from Handy and Harman). Silflake 282 and Silpowder, Handy and Harman) (All percents are weight/weight percentages). A second material was prepared consisting of (in weight/weight percentages) 65.15% AroCy-B-30 (Hi-Tek Polymers), 6.02% silica particulate (Aerosil 972, Degussa Corp.), 26.88% diglyme, and 1.95% nonylphenol containing 300 ppm (with respect to the AroCy-B-30) zinc acetylacetonate. A test trace was written on blake FR-4 circuit board substrate using the apparatus of the invention. After the circuit was completed the board was placed in an oven for 1 hour at 125° C. to remove the volatile solvent, after which the temperature was raised to 150° C. for 2-4 hours to complete the curing. The cured trace exhibited a resistivity of 0.5 ohms per inch for a 12 mil (0.30 mm) wide trace that is 4 mil (1.3 mm), and the insulative coating had a breakdown voltage of greater than 1000 volts.

A similar experiment, but using a Kapton polyimide board substrate was able to achieve 0.1 Ohms/in. using a higher curing temperature and a long duration cure.

EXAMPLE 2

A first material was prepared by the following formula: To a mixture of silver flake (96 parts, Handy and Harman Silflake 282), silver clusters (24 parts, Handy and Harman Silpowder 228) and silver spheres (5 parts) was added acetone (15 parts), N-methylpyrrolidone (10 parts) and the dimethyl ether of diethyleneglycol (diglyme, 3 parts). The resultant paste was passed through a 150 mesh screen. A part of the paste (containing 65 parts of silver) was mixed with an epoxy resin (Ciba-Geigy Corp., Araldite GZ 488 N-40, 6 parts) and a curing agent (m-phenylene diamine, 1.8 parts) and stirred to obtain a uniform blend. To this mixture acetone was added (10 ml) with stirring to obtain a uniform mixture. The mixture was then subjected to a reduced pressure (29 inches of mercury vacuum) for 30 minutes to obtain a pseudoplastic paste that could be applied to a board by extrusion under pressure (5-100 psi) through a small aperture having a diameter of from 5 to 29 mils. This extrudate subjected to a stream of hot air for 5 minutes dried to a firm line upon which a layer of insulating PTF could be applied without damage to the performance of either layer. It was found that this conductive layer could be cured in a heated oven along with the applied insulative layer to form an insulated conductive trace of low resistivity. Those skilled in the art will appreciate that each layer could have been separately cured, but that this one step curing process saves considerable time and avoids realignment problems if curing is attempted between a conductive layer and its corresponding insulative layer.

The second material (the insulative PTF) was prepared by the following formula: To an epoxy resin (Araldite GZ 488 N-40, 20 parts) was added dioxan (5 parts) and bisphenol A dicyanate (Interez RDX 80352, 16 parts). Into the solution obtained, erogenic silica (Silanox 101, Cabot Corp., 1.6 parts) was dispersed. The dispersion was then blended with acetone (15 mL) and subjected to a reduced pressure (29 inches of mercury vacuum) to obtain an insulative paste having characteristics similar to the rheological and drying characteristics described above for a conductive PTF.

It will be evident to those skilled in the art that there are many changes that may be made in the circuit writer without departing from the spirit and scope of the invention. Materials may be substituted for those specified, dimensions may be altered, positions of elements may be changed, and much more. As an example, although stepping motors are used in the preferred embodiments described there are other kinds of motors, such as synchronous motors, that might be used with appropriate sensors. Stepping motors are preferred because the computer can sense positions without the use of external sensors. Similarly, the pad materials may be different from those of the preferred mode, and in the case of surface mount components would not be required at all. Also, the pads could themselves be constructed of PTF. It will also be apparent to those skilled in the art that different drive systems completely could be used, for example a system of lead screws could be used to provide the x-, y-motions. As another example, although specific sizes are provided for elements of the circuit writers described, and pcb blanks are restricted to a certain maximum size to mount on the write table, circuit writers may be built to do larger or smaller boards without departing from the spirit or scope of the invention. It would be possible, too, to mount more than two writing assemblies on the write carriage, each applying a different material, or all applying the same material. Also, although the system has been described as producing boards that are via-less, in some instances vias may be desired, so that using this extruded PTF approach preserves the option of using vias or not using vias. Also, in some instances, it may be desirable to mix various methods, for example it may prove useful to provide the conductive traces by extrusion, but to provide an insulative layer over the whole board, rather than only over the conductive traces. In addition, although the circuit writer has been described in the context of a flat circuit board, there is no inherent limitation restricting the method of the invention to such two dimensional substrates, and in fact three dimensional structures could be constructed according to the method as well. There are different computer platforms and data storage devices that might be used, and there are many variations that might be made in the programming and data handling elements, all without departing from the spirit and scope of the invention as outlined in the appended claims.

APPENDIX A

```
;********************************************************************
;*                    ARIEL ELECTRONICS INC.                        *
;********************************************************************
;*   PRIMITIVE MOTIONS LIST used on the CIRCUIT WRITER PROTO SYSTEM  *
;********************************************************************
;
;********************************************************************
;********************************************************************
;  Printed name of the motion file follows. This line should state
;     the version of the motion file and/or explain any special features.
;     It is displayed on the screen when the file is loaded by PCMX.
file_name Motion V10.06   5/10/89   fixed hop angles
;********************************************************************
;                          MOTION PRIMITIVES
;
;        Valid commands are "primitive", and "mcitem".
;        Describe a primitive in the following format:
;
;     | primitive
;     | mcitem x_acceleration   y_acceleration   z_acceleration   actuator   time
;     |   ...
;     | mcitem x_acceleration   y_acceleration   z_acceleration   actuator   time
;
;     All acceleration values are in inches/sec^2, and may be floating point.
;
; The actuator byte (must be an integer) has the following values:
;     | bit 7 | bit 6 | bit 5 | bit 4 | bit 3 | bit 2 | bit 1 | bit 0 |
;     | V2 ON | V1 ON |RESERVED|RESERVED|RESERVED|RESERVED|RESERVED|RESERVED|
;
;     V1 = conductor pen valve
```

```
;    V2 = insulator pen valve
;    Bits 0, 1, 2, 3, 4 & 5 are currently RESERVED for diagnostics, etc.
;
;    THE PRIMITIVES LISTED IN THE FILE *MUST* BE IN THE FOLLOWING ORDER:
;        Insulator --(START, +,-ARC 90(inner), +,-ARC 90(outer),
;                    HOP UP, HOP DOWN, STOP)
;        Conductor --(START, +,-ARC 90(inner), +,-ARC 90(outer),
;                    HOP UP, HOP DOWN, STOP)
;
;***************************************************************************
; INSULATOR PRIMITIVES
;***********************
;
; START_TRACE
;
; Accelerates at 50 inches/sec^2 for 10 msec until vel = .5 inch/sec.
; Valve opens 40mS before motion.
;
primitive
mcitem 0,   0,           0, 128,   1
mcitem 0,   0,           0, 128,  79
mcitem 0,   0,  39.948735, 128,  10
mcitem 0,   0, -39.948735, 128,  10
mcitem 0,  50,           0, 128,  20
mcitem 0,   0, -39.948735, 128,  10
mcitem 0,   0,  39.948735, 128,  10
mcitem 0,   0,           0, 128,   1
;
;
; ARC_90_POS_INNER
; arc radius of 8 mils; this number is 2(.008)/(0.032*0.032) = 125/8.
primitive
mcitem  15.625, -15.625, 0, 128, 64
;
; ARC_90_NEG_INNER
; arc radius of 8 mils, same profile as above.
primitive
mcitem -15.625, -15.625, 0, 128, 64
;
;
; ARC_90_POS_OUTER
; arc radius of 8 mils, with 8 mils of straight trace on each end of the arc.
primitive
mcitem       0,       0, 0, 128, 32
mcitem  15.625, -15.625, 0, 128, 64
mcitem       0,       0, 0, 128, 32
;
; ARC_90_NEG_OUTER
; arc radius of 8 mils, with 8 mils of straight trace on each end of the arc.
primitive
mcitem       0,       0, 0, 128, 32
mcitem -15.625, -15.625, 0, 128, 64
mcitem       0,       0, 0, 128, 32
;
; HOP_UP
; changed acceleration values from 62.5818063 to
;           .006 delta height   -6.9535341 to -8.31697208
primitive
mcitem 0,  0, 74.8527487, 128,  8
mcitem 0,  0, -8.31697208, 128, 72
mcitem 0,  0,          0, 128, 12
;
; HOP_DOWN
; changed acceleration values from
;
primitive
mcitem 0,  0,          0, 128, 14
mcitem 0,  0, -8.31697208, 128, 72
mcitem 0,  0, 74.8527487, 128,  8
mcitem 0,  0,          0, 128,  1
;
;
; STOP_TRACE
```

; Decelerates at 50 inches/sec^2 until velocity = 0
; Look to bottom of file for valve off control. (insulator_off_delay)
primitive
mcitem 0,   0, 0, 128, 70
mcitem 0, -50, 0, 128, 20
mcitem 0, -25, 0, 128, 56
mcitem 0,  25, 0, 128, 56
mcitem 0,   0, 0,   0,  1
;
;
;
;**********************************************************************
; CONDUCTOR PRIMITIVES
;**********************
;
; START_TRACE
;
;
;accelerates at 50 inches/sec^2 for 10 milliseconds until vel = .5 inch/sec
; move out .01, open valve, move back while extruding, then take off
primitive
mcitem 0,  50, 0,  0, 28
mcitem 0, -50, 0,  0, 28
mcitem 0, -50, 0, 64, 28
mcitem 0,  50, 0, 64, 28
mcitem 0,  50, 0, 64, 20
mcitem 0,   0, 0, 64,  1
;
;
; ARC_90_POS_INNER
; arc radius of 8 mils, with 4 mils of straight trace on each end of the arc.
primitive
mcitem        0,        0, 0, 64, 16
mcitem   15.625,  -15.625, 0, 64, 64
mcitem        0,        0, 0, 64, 16
;
; ARC_90_NEG_INNER
primitive
mcitem        0,        0, 0, 64, 16
mcitem  -15.625,  -15.625, 0, 64, 64
mcitem        0,        0, 0, 64, 16
;
;
; ARC_90_POS_OUTER
primitive
mcitem        0,        0, 0, 64, 16
mcitem   15.625,  -15.625, 0, 64, 64
mcitem        0,        0, 0, 64, 16
;
; ARC_90_NEG_OUTER
primitive
mcitem        0,        0, 0, 64, 16
mcitem  -15.625,  -15.625, 0, 64, 64
mcitem        0,        0, 0, 64, 16
;
;
; HOP_UP
; New Conductor Hop Up leaves y velocity at (.5"/sec * sqrt(2)) = 0.3536"/sec
;    All z accelerations are   n*2 /(2.56*5.73) where n is an integer
;    plus a little bit (.0001) to make sure that they don't shrink
;    z accel was  34.7676702 -6.9535341
;           now   40.2214224 -8.04428447   4/28/89 --GDB
;
primitive
mcitem 0, -18.3,    40.2214224, 64, 16
mcitem 0,     0,   -8.04428447, 64, 80
mcitem 0,     0,             0, 64,  1
;
; HOP_DOWN
; New Conductor Hop Down expects velocity at (.5"/sec * sqrt(2)) = 0.3536"/s
;
primitive
mcitem 0,     0,             0, 64, 33

```
mcitem 0,     0,   -8.04428447, 64, 80
mcitem 0,  18.3,   40.2214224,  64, 16
mcitem 0,     0,    0,          64,  1
;
;
; STOP_TRACE
; Decelerates at 50 inches/sec^2 until velocity = 0.
; Valve turned off by structure near the end of this file. (conductor_off_del
primitive
mcitem 0,    0,       0, 64, 70
mcitem 0,  -50,       0, 64, 20
mcitem 0,  -25,       0, 64, 28
mcitem 0,   25,       0, 64, 28
.mcitem 0,   0,       0,  0,  1
;
;
;**************************************************************
; FAST MOVE CONTROL FIELDS
;**************************
;
; Maximum acceleration (velocity) to be used when moving the head from
; one point of the stage to another.  Units are in in/sec^2 (in/sec).
;     Values may be floating point.
fast_move_acceleration  50.0
fast_move_velocity       4.0
;
;
;**************************************************************
;   This token MUST follow the end of the primitive information.
;
stop_primitives
;**************************************************************
;
;
;
;
;
;
;
;**************************************************************
;::::::::::::::::::::::::::::::::::::::::::::::::::::::::::::::
;::: This section of the motion file is used for various position and timing
;::: constants which may change during the development of the machine.::::::::
;::::::::::::::::::::::::::::::::::::::::::::::::::::::::::::::
;**************************************************************
;
; The following parameter is the distance from the center of the conductor
;   trace to the center of either of the two insulator traces.
; NOTE that the Insulator INNER and OUTER Arcs must be adjusted accordingly!
;     ((Units = MILS; may be floating point))
two_pass_insulator offset 6.00
;
;
; The following parameter is the number of ticks from the END of the
;   stop primitive that the approprate valve is turned off.
; The minimum value here is 1.
;     ((Entries must be INTEGERS))
conductor_off_delay  85
insulator_off_delay 170
;
;
; This is the deceleration value in inches/sec^2 that is used when a stop
;   command is issued to the isr. For example, in the homing process when
;   the head is moving toward the home sensor, a stop command is issued
;   when the sensor is activated.
;     ((Entries must be INTEGERS))
; ---- old values were 100 ----
x_stop_decel 250
y_stop_decel 250
;
;
```

```
; The following parameters are the PTF pen OUTER diameters.
;   These values are used in the TOUCH module to correct for side touches.
;     ((Units = MILS; may be floating point))
conductor_pen_diameter 18.0
insulator_pen_diameter 18.0
;
;
; The following parameter is the head delay after a trace has been completed
;   The value is in ticks so a delay of 2000 ticks is 1 second.
;   NOTE: The PCHX code to use this feature has been DELETED.  -DPW
z_move_delay 10
;
;
; The following parameter is the number of elements in the kernal_shape arra
;     ((Entry must be an INTEGER))
kernal_size 7
;
; The following array is the filter kernal value used by the kernal module
; This data is convolved with the input sample heights  to form the surface
; in the z correction table. The values here are percent * 1000.
;     For example 75% is 750  100% is 1000  ect.
;     ((Entries must be INTEGERS))
kernal_shape 0 333 667 1000 667 333 0
;
;
; The Bridge Trigger Distance is the distance in mils such that when
; intersects are closer than this amount, a straight trace will be inserted.
;     ((Entry must be an INTEGER))
bridge_trig_dist 30
;
;
;
;
;
;
;**************************************************************************
;::::::::::::::::::::::::::::::::::::::::::::::::::::::::::::::::::::::::::
;:::                       FLOW CONTROL VARIABLES                       :
;::::::::::::::::::::::::::::::::::::::::::::::::::::::::::::::::::::::::::
;**************************************************************************
;
;   **************************************************************************
;   *******( These fudge factors MUST be first in the flow section )*******
;   **************************************************************************
;
;   Fudge factor for the autobung goo volume.
;   This constant is (microliters of goo) per (volt) of LVDT position.
ul_per_volt      5.76
; 9.06
;
;   Fudge factor for the autobung goo flowrate.
;   This constant is (microliters of goo per minute) per (volt).
ul_per_min_per_volt   10
;12.35
;
;   Fudge factor for the autobung pressure setpoint.
;   This constant is (pounds of pressure) per (volt).
lbs_per_volt         10.00
;
;
;
;
;   These constants control the exponential filter used on the flow signal.
;   Each value must be a number between 0 and 1, and are used as follows:
;      a/d[n] = (constant)*(new a/d reading) + (1 - constant)*( a/d[n-1] )
conductor_flow_filter_constant    .025
insulator_flow_filter_constant    .015
;
;
;   Initial pressure setpoints upon startup. (pounds)
conductor_startup_pressure       15.0
insulator_startup_pressure        3.0
;
```

```
;
;   This is the amount of conductor goo (in microliters) extruded per minute.
;   Note that the conductor has a density of 4;
;       The "proper" amount is 100 ul/minute, but we must use 100/4
;       or 25 ul of "ideal liquid" per minute.
conductor_flowrate   30.0
;
;   This is the amount of insulator goo (in microliters) extruded per minute.
;   The insulator has a density of 1, so this figure IS the actual amount.
insulator_flowrate   30.0
;
;
;   Maximum legal setpoints for extrusion. (pounds)
;   These numbers *MUST* be GREATER than zero and LESS THAN 50.0!
conductor_max_extrude_pressure    35.0
insulator_max_extrude_pressure    20.0
;
;
;   Pressure setpoints for fill operation. (pounds)
;   These numbers *MUST* be GREATER than zero and LESS THAN 50.0!
;      *( these constants are not currently used in PCMX )*  2/2/89
conductor_fill_pressure   45.0
insulator_fill_pressure   30.0
;
;   These constants control the gain on the FLOW error signal, which is
;   added to the pressure setpoint to control the flow; as follows:
;      pressure[n] = (constant)*(flow error) + pressure[n-1]
;   These numbers *MUST* be GREATER than ZERO and LESS THAN 1.0!
conductor_flow_error_gain   0.002
insulator_flow_error_gain   0.0012
;
;
;   These constants control the gain on the POSITION error, which is
;   added to the pressure setpoint to control the bung position;
;   this is used during the purge operation, as follows:
;      pressure[n] = (constant)*(position error) + pressure[n-1]
;   These numbers *MUST* be GREATER than ZERO and LESS THAN 1.0!
conductor_position_error_gain   0.400
insulator_position_error_gain   0.300
;
;
;   This delay (in ISR ticks, MUST be an INTEGER) controls the amount of
;   time the ISR waits after the valve is opened before controlling the flow.
conductor_flow_loop_delay   2000
insulator_flow_loop_delay   2000
;
;
;   This delay (in ISR ticks, MUST be an INTEGER) controls the amount of
;   time the fill procedure waits after closing the fill valve.
conductor_fill_valve_delay 10000
;7000
;                          v980x2 was 5000
insulator_fill_valve_delay 10000
;
;
;   The following constants are expressed in microliters of goo measured
;   relative to a HALF-FILLED autobung, which is considered to be ZERO.
;    |                      |
;   Absolute volume to be reached after filling
bung_top_of_tank_position   15.0
;    |                      |
;   Absolute volume setpoint which triggers filling
bung_bottom_of_tank_position   -15.0
;    |                      |
;   Absolute position where the bung is to be held during purge operation
bung_purge_position    -25.0
;
;   Volume at which the fill procedure stops, RELATIVE to "top_of_tank_positi
;   This constant must follow the above (absolute) bung position constants.
bung_stop_fill_delta   -20.0
;
;
;
```

```
;****************************************************************
;   This flags the END of the motion file.
end
;****************************************************************
```

What is claimed is:

1. An apparatus for forming traces between pads on a printed circuit board comprising:

first extrusion means for extruding a first extrudable material that is conductive after curing to form conductive traces;

carriage means for carrying said first extrusion means;

a write tip associated with said first extrusion means, for ejecting and forming the first extrudable material onto the printed circuit board;

a first guide means for constraining the movement of said carriage means in a first linear direction;

a base frame for mounting said first guide means;

a write table for positioning and holding said printed circuit board during forming of said traces, said write table mounted to said base frame;

means for holding said printed circuit board against said write table during forming of traces;

second guide means for constraining the movement of said carriage means in a second linear direction orthogonal to said first direction;

third guide means for constraining the movement of said write tip orthogonal to said first and second directions;

first drive means for moving said carriage means along said second guide means;

second drive means for moving said carriage means along said second guide means;

third drive means for moving said write tip along said third guide means; and computerized control means for controlling said first, second and third drive means, and for starting and stopping extrusion of material by said first extrusion means, thereby controlling the start point, end point, and the shape of traces extruded onto said printed circuit board.

2. An apparatus for forming traces as in claim 1 wherein said first guide means comprises:

a pair of substantially parallel rails;

first saddle means slidably mounted to one of said pair of rails;

second saddle means slidably mounted to the other of said pair of rails; and said second guide means being fixedly attached to each of said first and said second saddle means such that said second guide means and said first and said second saddle means travel together along said pair of rails.

3. An apparatus for forming traces as in claim 2 wherein said parallel rails are smooth steel shafts and said first and second saddle means mount to said rails by linear shaft bearings.

4. An apparatus as in claim 1 wherein said means for holding said printed circuit board against said write table comprises vacuum means for creating a pressure differential to urge a printed circuit board against said write table.

5. An apparatus for forming traces as in claim 2 wherein said second guide means comprises a pair of substantially parallel rails, said carriage means spans said pair of rails, and said carriage means is slidably mounted to each of said pair of rails.

6. An apparatus as in claim 5 wherein said rails of said second guide means are smooth steel shafts and said carriage means mounts to said rails by linear shaft bearings.

7. An apparatus as in claim 1 further comprising second extrusion means for extruding a second extrudable material over said first extrudable material, said second extrudable material being an electrically insulative material.

8. An apparatus as in claim 5 further comprising:

four frame posts arranged in a substantially rectangular pattern;

a plurality of cable pulleys attached to said frame posts, to said first and second saddle means, and to said carriage means;

at least one adjustable cable anchor at each of said four frame posts;

wherein said first and second drive means each comprises a system of cables arranged through said plurality of pulleys and anchored at said adjustable cable anchors such that, operating said first and second drive means moves said carriage in a horizontal plane with two degrees of freedom.

9. An apparatus as in claim 8 wherein said first drive means comprises:

a first electric drive motor mounted to said base frame;

a first cable drum attached to and turned by said first electric drive motor;

a first cable and a second cable wrapped on said cable drum in opposite rotary directions and extending from said cable drum toward one side of said apparatus; and a third cable and a fourth cable wrapped on said cable drum in opposite rotary directions and extending from said cable drum toward the opposite side of said apparatus.

10. An apparatus as in claim 9 wherein;

said first cable passes around said cable pulleys attached to a first of said frame posts and said pulleys attached to said first saddle means and anchors to a first of said adjustable cable anchors attached to said first frame post;

said second cable passes around said cable pulleys attached to a second of said frame posts and said cable pulleys attached to said first saddle means and anchors to a second of said adjustable cable anchors attached to said second frame post;

said third cable passes around said cable pulleys attached to a third of said frame posts and said cable pulleys attached to said second saddle means and anchors to a third of said adjustable cable anchors attached to said third frame post; and said fourth cable passes around said cable pulleys attached to a fourth of said frame posts and said cable pulleys attached to said second saddle means and anchors to a fourth of said adjustable cable anchors attached to said fourth frame post;

such that rotation of said first cable drum in one rotary direction urges said first and second saddle means together along said first guide means in one direction, and rotation of said first cable drum in the opposite rotary direction urges said first and second saddle means together along said first guide means in the opposite direction.

11. An apparatus as in claim 10 wherein said adjustable anchors are adjusted to exert substantially equal tensile stress on each of said cables to avoid movement during operation due to strain of said cables.

12. An apparatus as in claim 10 wherein said first and said third cables are wrapped side by side from one end of said first cable drum and said second and said fourth cables are wrapped side by side from the opposite end of said first cable drum, so that as said first and said second saddle means are moved along said first guide means, the angles formed by each of said cables with the longitudinal axis of said first cable drum remain substantially the same, tending to equalize force exerted by each cable and friction drag experienced by each cable.

13. An apparatus as in claim 8 wherein said second drive means comprises:
a second electric drive motor mounted to said base frame;
a second cable drum attached to and turned by said second electric drive motor;
a first cable wrapped on said cable drum and extending toward one side of said apparatus; and
a second cable wrapped in the same rotary direction as said first cable on said second cable drum and extending toward the other side of said apparatus.

14. An apparatus as in claim 13 wherein:
said first cable passes around one of said cable pulleys attached to a first of said frame posts, around one of said pulleys attached to said first saddle means, around one of said pulleys attached to said carriage means, around another of said pulleys attached to said first saddle means, and anchors to one of said adjustable anchors attached to a second of said frame posts; and
said second cable passes around one of said cable pulleys attached to a third of said frame posts, around one of said pulleys attached to said second saddle means, around one of said pulleys attached to said carriage means, around another of said pulleys attached to said second saddle means, and anchors to one of said adjustable anchors attached to a fourth of said frame posts;
such that rotation of said second cable drum in one rotary direction urges said carriage means along said second guide means in one direction and rotation of said second cable drum in the opposite rotary direction urges said carriage along said second guide means in the opposite direction, and operation of said first drive means does not move said carriage along said second guide means.

15. An apparatus as in claim 14 wherein said cables are wrapped side by side from one end of said second cable drum so that as said carriage is moved along said first guide means, the angles formed by each of said cables with the longitudinal axis of said second cable drum remain substantially the same, tending to equalize force exerted by each cable and friction drag experienced by each cable.

16. An apparatus as in claim 1 wherein said first extrusion means comprises:
reservoir means for containing a supply of said first extrudable material;
gas supply means connected to said reservoir means for applying pressure to said first extrudable material in said reservoir means to extrude said first extrudable material from said extrusion means;;
flexible tube connecting means between said reservoir means and said write tip; and
valve means in said flexible tube connecting means for stopping the flow of said first extrudable material between said reservoir means and said write tip.

17. An apparatus as in claim 16 wherein said gas supply means further comprises pressure control means for controlling said pressure thereby controlling the rate of extrusion of said first extrudable material from said first extrusion means, and said pressure control means is controllable by said computerized control means in response to programmed information.

18. An apparatus as in claim 16 wherein said valve means comprises:
a rotary valve having an inlet, a flow-through passage, and a side passage from said flow-through passage;
an third electric motor for rotating said rotary valve; and
an overflow container connected to said side outlet;
such that in one position said flow-through passage passes said first extrudable material substantially unimpeded through said rotary valve to said write tip, said first extrudable material being urged along by said pressure;
such that a small rotation of said rotary valve by said third drive motor completely disconnects said flow-through passage from said reservoir means, quickly stopping flow of extrudable material to said write-tip;
and such that a larger rotation connects said reservoir means through said side passage with said overflow container, relieving pressure across said valve from said reservoir means to said write tip, completely removing any tendency for extrudable material to continue to be urged through said write tip.

19. An apparatus as in claim 16 further comprising:
a fourth electric drive motor for raising and lowering said write tip, said fourth electric motor mounted to said carriage;
slide means engaged in said third guide means and fastened to said write tip so that said slide means and said write tip move vertically together in said guide means;
a shaft driven by said fourth electric motor;
a thin tongue of material wrapped on said shaft and fastened to said slide means such that rotation of said shaft by said fourth electric motor causes said slide with said write tip to move in the z-direction in said third guide means; and
said fourth electric motor being controllable by said computerized control means so that said write tip may be moved in the z-direction in response to preselected instructions.

20. An apparatus as in claim 16 further comprising an electrically powered heater block connected to said write tip, said heater block controllable by said computerized control means in response to preselected instructions, for controlling the temperature of said extrudable material during extrusion, thereby exercising control over such heat responsive characteristics as thixotropy and viscosity.

21. An apparatus as in claim 16 wherein said write tip further comprises:
a fitting connected to said flexible tube connecting means; and
hypodermic-type tubing engaged in said fitting.

22. An apparatus as in claim 21 wherein said hypodermic-type tubing has an outside bevel making the outside diameter of said tubing smaller at the outlet end, where extrudable material exits onto said printed circuit board, than the nominal outside diameter of said tubing, thereby controlling the width of the trace extruded to be less than the width would be without said bevel.

23. An apparatus as in claim 21 wherein said hypodermic-type tubing has an inside bevel making the inside diameter of said tubing larger at the outlet end, where extrudable material exits onto said printed circuit board, than the nominal inside diameter of said tubing, thereby controlling the width of the trace extruded by said tubing to be more than the width would be without said bevel.

24. An apparatus as in claim 1 wherein said write table is pivotally mounted to said base frame such that the pivot axis is substantially in the z-direction, and further comprising:
pivot drive means for rotating said write table about said pivot axis, said pivot drive means controllable by said computerized control means; and
video camera means mounted to said carriage, focusable onto said circuit board, said video camera means supplying an image with alignment means for use by an operator to align a printed circuit board prior to traces being written.

25. Apparatus for producing electrically conductive traces on a circuit board comprising:
extrusion means for extruding a material that is electrically conductive after curing, hereinafter called the electrically conductive material;
said extrusion means comprising an extrusion housing in which extrudable polymer is contained, means for applying a force to said extrudable polymer from said housing and onto a circuit board, means for monitoring rate of extrusion information, and first control means for controlling the application of force in response to said rate of extrusion information supplied by said monitoring means;
stage means for holding said extrusion means and said circuit board in relative proximity and for producing relative motion of said extrusion means and said circuit board; and
second control means for controlling said extrusion means and said stage means to cause said electrically conductive material to be extruded onto a surface of said circuit board along preselected paths to produce said traces.

26. Apparatus as in claim 25 further comprising:
second extrusion means for extruding an electrically insulating material; wherein
said stage means comprises means for holding said second extrusion means in proximity of said circuit board and for moving said second extrusion means relative to said circuit board, and wherein said second extrusion means further comprises;
means for controlling said second extrusion means to cause said electrically insulating material to be extruded onto said surface of said circuit board along said traces formed by said first extrusion means to produce electrically conductive traces that are insulated.

27. Apparatus as in claim 26 wherein said extrusion means comprises first heating means for heating the electrically conductive material.

28. Apparatus as in claim 27 wherein said second extrusion means comprises second heating means for heating the electrically insulative material.

29. Apparatus as in claim 25 wherein said extrusion means comprises first heating means for heating the electrically conductive material.

30. Apparatus as in claim 25 further comprising:
second extrusion means for extruding an electrically insulating material;
said stage means comprising means for holding said second extrusion means and the circuit board in relative proximity and for producing relative motion of said extrusion means and the circuit board;
said control means for controlling said second extrusion means and said stage means to cause said electrically insulating material to be extruded onto the surface of the circuit board at a plurality of points along said traces produced by said first extrusion means to produce electrically conductive traces that are insulated at said plurality of points.

31. Apparatus for producing traces on a circuit board comprising:
extrusion means for extruding a first extrudable polymeric material;
said extrusion means comprising an extrusion housing in which extrudable polymer is contained, means for applying a force to said extrudable polymer from said housing and onto a circuit board, means for monitoring rate of extrusion information, and control means for controlling the application of force via said force applying means in response to said rate of extrusion information supplied by said monitoring means;
stage means for holding said extrusion means and a circuit board in relative proximity and for producing relative motion between said extrusion means and said circuit board to extrude said first material onto a surface of said circuit board along preselected paths.

32. A method of producing electrically conductive traces on a circuit substrate support comprising the steps of:
extruding a first polymerizable material onto a circuit substrate support along preselected paths to form traces;
polymerizing said first polymerizable material, said first polymerizable material being conductive after polymerization;
applying a second polymerizable material over said support at a plurality of points along said preselected paths overlying said first polymerizable material; and
polymerizing said second polymerizable material, said second polymerizable material being electrically insulative after polymerization.

33. The method of claim 32 wherein said steps of polymerizing said first and second polymerizable materials overlap in time.

34. The method of claim 33 wherein the steps of polymerizing said first and second polymerizable materials comprise heating said support after said first and second polymerizable materials have been applied thereto.

35. The method of claim 32 wherein the steps of polymerizing said first and second polymerizable materials comprises providing an environment for polymerization to occur and waiting till polymerization occurs.

36. The method of claim 32 further comprising the step of applying to said support a third material along preselected paths overlying said first polymerizable material and intersecting said traces formed by said first polymerizable material at least a subset of said points that are insulated by said second polymerizable material, wherein said third material is electrically conductive after being applied to said support.

37. The method of claim 36 wherein said third material is the same as said first polymerizable material, and the step of applying said third material includes polymerizing said third material.

38. The method of claim 37 wherein the steps of polymerizing said first polymerizable material, said second polymerizable material, and said third material overlap in time.

39. A circuit board for holding electrical components comprising:
  a circuit substrate support;
  a plurality of electrically conductive traces adhered to said circuit substrate support between locations for electrical components, said traces being formed of a polymer thick film by extrusion from an orifice onto said support along paths defining the location of said traces wherein said traces are coated with an electrically insulating material formed by extrusion of said insulating material along said paths.

40. A circuit board as in claim 39 wherein said traces have a maximum thickness that is at least 25% of their minimum width.

41. A circuit board as in claim 39 wherein said traces have a maximum thickness at one or more locations of at least 50% of the minimum width of said traces.

42. A method of forming a circuit of insulated conductive traces on a substrate, the method comprising the steps of:
  (a) calibrating a stage so that positions on a substrate correspond to positions pre-programmed into a trace routing engine, the trace routing engine containing a programmed representation of the circuit;
  (b) extruding a trace onto said substrate by a first extrusion means under programmed control of the trace routing engine, said trace consisting of a first material;
  (c) hardening said trace;
  (d) layering a second material onto said hardened trace, the second material encapsulating said hardened trace;
  (e) hardening said second material;
  (f) repeating steps (b) through (e) until a cricuit determined by the trace routing engine is complete; and
  (g) curing the first and second materials to form the circuit of insulated conductive traces.

43. The method of claim 42 wherein said step of layering includes extruding said second material onto said hardened trace by a second extrusion means under programmed control of said trace routing engine.

44. The method of claim 43 wherein said first material and said second material are pseudoplastic.

45. The method of claim 43 wherein said step of layering further includes forming an interfacial layer between said second material and said first material, the interfacial layer consisting of a hydrophobic polymer.

46. The method of claim 45 wherein said first material is a polymer solution comprising an epoxy resin or prepolymer, a diamine or polyamine hardener, a first high evaporation rate solvent, and conductive particulates, and wherein said second material is a polymer solution comprising an aryl dicyanate, a second high evaporation rate solvent, a hydroxyl accelerator, and a metal catalyst.

47. The method of claim 46 wherein said step of hardening said trace includes evaporating said first high evaporation rate solvent from said trace, and wherein said step of hardening said second material includes evaporating said second high evaporation rate solvent from said second material.

48. The method of claim 47 wherein said first extrusion means extrudes said first material through a write tip having a width in the range of 3 to 20 mils.

49. An insulated conductive trace on a surface of a substrate, the insulated conductive trace comprising:
  a core consisting of an extruded conductive polymer thick film, the core having a width in the range of 3 to 20 mils and a resistivity in the range of 0.1 to 0.6 ohms per inch;
  a sheath consisting of an extruded insulative polymer thick film, the sheath encapsulating the core and binding the core to said surface of said substrate; and
  an interfacial layer between the core and the sheath, the interfacial layer consisting of an impermeable hydrophobic polymer.

50. The insulated conductive trace of claim 49 wherein said conductive polymer thick film comprises a crosslinked epoxy polymer filled with conductive particulates, the crosslinked epoxy polymer being crosslinked by a diamine or polyamine hardener, and wherein said insulative polymer thick film comprises a polycyanurate.

51. The insulated conductive trace of claim 50 wherein said conductive polymer thick film further comprises 75 to 90 percent by weight conductive particulates, and wherein said conductive particulates are silver.

52. A device for extruding an extrudable material comprising:
  a storage volume for storing a quantity of an extrudable material;
  a write tip with an opening to said storage volume, said write tip for ejecting and forming said extrudable material;
  a fill passage connecting to said storage volume for supplying said extrudable material to said storage volume;
  a valve passage with an opening into said fill passage;
  a valve piston in said said valve passage urged by a spring to tend to close said opening into said fill passage;
  a supply port opening into said valve passage such that said extrudable material under pressure introduced to said supply port moved said valve piston against said spring to open said valve passage to said fill passage allowing said extrudable material to flow from said supply port through said fill passage into said storage volume; and
  a pressure port into said storage volume for introducing a gas under pressure to cause said extrudable material to extrude from said write tip.

53. A device as in claim 52 further comprising:
  a metering piston in said storage volume such that as said extrudable material is extruded from said storage volume, said metering piston moves in said storage volume; and piston sensing means for sensing the position of said piston in said storage volume to determine the relative fill level of said storage volume and the rate of extrusion of said extrudable material from said storage volume.

54. A device as in claim 53 wherein said metering piston is made of magnetically permeable material and said sensing means comprises an LVDT coil for sensing the position and relative movement of said piston.

55. A device as in claim 52 wherein said valve passage and said fill passage are colinear and said valve piston comprises:
a first portion having a first diameter fitting closely within said valve passage; and
a second portion having a second diameter smaller than said first diameter fitting closely within said fill passage;
said second portion having a connecting passage starting from the end of said second portion away from said first portion, proceeding toward said first portion, and turning and opening through the outer diameter wall of said second portion, such that said connecting passage is closed when said second portion is fully inserted into said fill passage, urged by said spring, and said connecting passage forms an open passageway from said valve passage to said fill passage when said valve piston is urged against said spring, partially withdrawing said second portion from said fill passage.

56. A device as in claim 52 further comprising:
a modular supply reservoir connecting to said supply port for supplying a fixed quantity of said extrudable material for supply to said storage volume of said device, said supply reservoir having a pressure port for supplying gas under pressure to urge said extrudable material from said modular supply reservoir.

57. A device as in claim 56 wherein said modular supply reservoir further comprises a first quick-connect fitting for connecting to said supply port and a second quick connect fitting for connecting at said pressure port.

58. A device as in claim 56 further comprising valve means connecting to said pressure port for supplying gas under pressure to and for venting of said supply reservoir.

59. A device as in claim 52 further comprising gas valve means connecting to said pressure port and to said storage volume for supplying gas under pressure to and venting of said storage volume.

60. A device as in claim 52 further comprising said extrudable material being stored in said storage volume, wherein said extrudable material comprises a pseudoplastic material having a yield point that is sufficiently high to support the weight of said metering piston.

61. A circuit board for holding electrical components comprising:
a circuit substrate support having an electrically non-conductive surface;
a plurality of electrically conductive mounting pads on said non-conductive surface, said mounting pads being formed of an extruded polymer thick film;
a plurality of electrically conductive traces between and connecting to said mounting pads, said electrically conductive traces being formed of an extruded polymer thick film along paths defining the location of said traces, wherein said traces are covered with a coating of electrically insulating material formed by extrusion of said insulating material along said paths.

62. A circuit board as in claim 61 having a plurality of layers of electrically conductive traces, at least some layers having a plurality of said traces that cross over said traces from a previous layer, and are electrically connected to said pads without vias.

63. A method of building a precise geometric shape on a circuit board comprising:
extruding a polymerizable material on to board;
curing said polymerizable material;
machining portions of said material after polymerization to form said precise geometric shape.

64. A method of forming an electrical connection between two otherwise electrically isolated mounting pads, said pads having been constructed on a circuit substrate support having an electrically conductive clad layer over an electrically non-conductive support material by removing trenches through said clad layer to form said pads, comprising the steps of:
forming an insulative roadbed between mounting pads on a circuit substrate support by extruding insulative polymerizable thick film from an orifice, said roadbed overlying a conductive clad layer between said mounting pads;
forming a conductive trace between said mounting pads by extruding polymerizable thick film between said mounting pads, said conductive trace touching each of said conductive pads and following and overlying said insulative roadbed, said conductive trace being narrower in breadth than said insulative roadbed;
polymerizing said polymerizable thick films, said thick film for said conductive trace being electrically conductive after polymerization; and
extruding an insulative cover of polymerizable thick film over said extruded conductive trace before said polymerization step, said insulative cover together with said insulative roadbed encapsulating said conductive trace.

65. A method of forming a conductive trace between two otherwise electrically isolated mounting pads as in claim 64 comprising the step of:
extruding an insulative cover of polymerizable thick film over said extruded conductive trace before said polymerization step, said insulative cover together with said insulative roadbed encapsulating said conductive trace.

66. A circuit board for holding electrical components comprising:
a circuit substrate support having an electrically conductive clad surface layer over a non-conductive support material;
a plurality of conductive mounting pads on said non-conductive support material, said mounting pads being constructed by forming trenches through said electrically conductive clad surface layer to form said mounting pads;
a plurality of extruded electrical traces between said mounting pads, said electrical traces formed of polymerizable thick film material, which becomes conductive after polymerization, over insulative roadbeds of extruded insulative polymerizable thick film material between said mounting pads and wherein said electrical traces are encapsulated in extruded insulative material along said roadbeds.

67. A circuit board for holding electrical components as in claim 66 having a plurality of layers of electrically conductive traces, at least some layers having a plurality of said traces that cross over said traces from a previous layer, and are electrically connected to said pads without vias.

68. A method of forming an electrical connection between two otherwise electrically isolated mounting pads, said mounting pads constructed on a circuit substrate support having an electrically conductive clad layer over an electrically non-conducting support material by forming trenches through said clad layer to form said pads, comprising the steps of:

forming a connection trench through an electrically conductive layer between trenches forming isolated mounting pads;

extruding a trace of polymerizable material from one of said electrically isolated mounting pads to the other of said isolated mounting pads, following the path of said connecting trench, said trace being of narrower width than the width of said connecting trench, such that said trace nowhere touches said clad layer except at said isolated mounting pads; and polymerizing said polymerizable material, said polymerizable material being electrically conductive after polymerization.

69. A method of forming an electrical connection between two otherwise electrically isolated mounting pads as in claim 68 further comprising the steps of:

extruding a trace of insulative material over said trace of conductive material; and polymerizing said trace of insulative material;

said trace of insulative material forming a protective covering over said trace of conductive material.

70. A method of forming an electrical connection between two otherwise electrically isolated mounting pads formed on a circuit substrate support comprising:

forming an electrically conductive clad layer over an electrically non-conducting support material and a non-conductive layer over said electrically conductive clad layer, forming trenches through said clad layer and said non-conductive layer filling said trenches with insulative materials by extruding insulative polymerizable thick film from an orifice into said trenches;

extruding a trace of a second polymerizable material, which becomes conductive after polymerizing, from one of said electrically isolated mounting pads to the other of said isolated mounting pads, said trace touching the conductive materials of each of said mounting pads and overlying said non-conductive layer between said mounting pads and said insulative material filling said trenches; and polymerizing said polymerizable materials.

71. A method of forming an electrical connection between two otherwise isolated mounting pads as in claim 70 further comprising the steps of:

extruding an encapsulating trace of insulative material over said trace of conductive material; and polymerizing said encapsulating trace of insulative material.

72. A circuit board for holding electrical components comprising:

a circuit substrate support having an electrically conductive clad layer over a non-conductive support material and a non-conductive layer over said electrically conductive clad layer;

a plurality of conductive mounting pads on said non-conductive support material, said mounting pads being formed by forming trenches through said electrically conductive clad layer and said non-conductive layer and removing said non-conductive layer from said mounting pads, said trenches filled with an extruded insulative material; and a plurality of extruded electrically conductive traces between and connecting to said mounting pads, said electrically conductive traces being formed of a polymer thick film and positioned along paths overlying said insulative material filling said trenches and overlying said non-conductive layer wherein said conductive traces are covered with a coating of extruded electrically insulative material onto said conductive traces along said paths.

73. A circuit board as in claim 72 having a plurality of layers of electrically conductive traces, at least some layers having a plurality of said traces that cross over said traces from a previous layer, and are electrically connected to said pads without vias.

74. A method of forming a mounting pad for registering and attaching leads of discrete devices on a circuit substrate support comprising the steps of:

extruding adjacent lines of polymerizable thick film materials onto a circuit substrate support, alternating lines of said material being insulative material and the other lines being material electrically conductive after polymerization, said insulative lines extending further above said circuit substrate support than said lines which are conductive after polymerization with said lines which are conductive after polymerization being substantially the width of said leads of discrete devices, such that the spaces between said insulative lines become registration trenches for said loads of said discrete devices; and polymerizing said extruded lines of material.

75. A method of forming a mounting pad for registering and attaching leads of discrete devices as in claim 74 further comprising the step of extruding a line of insulative material crossing said adjacent lines of polymerizable thick film material at substantially a right angle prior to said polymerization step;

said crossing line being an additional constraint for registration of leads of said discrete devices.

76. A circuit board for holding electrical components comprising:

a circuit substrate support; and a mounting pad for registering and attaching leads of discrete devices, said mounting pad formed of extruded adjacent lines of polymerizable thick film material on said circuit substrate support, alternating lines of said material being insulative material and the other lines being material electrically conductive after polymerization, said insulative lines extending further above said circuit substrate support than said lines which are conductive after polymerization with said lines which are conductive after polymerization being substantially the width of said leads of said discrete devices, such that the spaces between said insulative lines become registration trenches for said leads of said discrete devices.

77. A method of electrically connecting a conductive pad on one side of a circuit board having an inner conductive layer with a conductive pad on the other side of said circuit board without said electrical connection contacting said inner conductive layer, comprising the steps of:

drilling a first hole through a circuit board, said hole penetrating conductive pads on both sides of said board and penetrating an inner conductive layer;

extruding insulative polymerizable thick film material into said first hole from an orifice;

drilling a second hole through said insulative plug, said second hole leaving an annulus of insulative material within said first hole;

extruding a second polymerizable thick film material, said material being conductive after polymerization, into said second hole from an orifice such that said second material overlaps said insulative material on each side of said circuit board making contact with each said conductive pad, said second material being electrically isolated from said inner conductive layer by said annulus of insulative material; and polymerizing said second polymerizable thick film material forming an electrical connection between said pads, said second material being electrically isolated from said inner conductive layer.

78. A circuit board for holding electrical components comprising;

a circuit substrate support having an inner conductive layer and a conductive pad on each side;

a connection between said pads on opposite sides of said circuit board, said connection comprising:

an insulative plug formed in a first hole drilled through said circuit board, said first hole penetrating conductive pads on each side of said circuit board and penetrating said inner conductive layer;

said insulative plug formed of extruded insulative polymerizable material from an orifice into said first hole;

a second hole drilled through said insulative plug leaving an annulus of insulative material through said circuit board; and a conductive trace through said second hole, said conductive trace formed of extruded polymerizable material which is conductive after polymerization through said second hole, making contact with said pads on opposite faces of said circuit board, said conductive trace isolated from said inner conductive layer by said annulus of insulative material.

79. A method of electrically connecting a conductive pad on one side of a circuit board having an inner conductive layer with a conductive pad on the other side of said circuit board without said electrical connection contacting said inner conductive layer, comprising the steps of:

forming a slot through a circuit board, said slot penetrating conductive pads on both faces of said circuit board and penetrating an inner conductive layer;

extruding a roadbed of insulative polymerizable thick film material along a portion of said slot from an orifice, said roadbed crossing said inner conductive layer;

extruding a first trace of polymerizable thick film material into said slot from an orifice, said polymerizable material being conductive after polymerization, said first trace of polymerizable material having a lesser width than said roadbed for insulative material and overlying said insulative roadbed such that said first trace does not touch said inner conductive layer, said first trace touching each of said conductive pads on opposite faces of said circuit board; and polymerizing said polymerizable materials.

80. The method of claim 79 comprising the additional step of extruding a covering trace of insulative polymerizable thick film material over said first trace, covering said first trace at the level of said inner conductive layer of said circuit board, prior to the step of polymerizing said polymerizable thick films.

81. The method of claim 80 wherein said covering trace of insulative polymerizable thick film material is extruded to fill said slot.

82. A circuit board for holding electrical components comprising:

a circuit substrate support having an inner conductive layer and a conductive pad on each side; and a connection between said pad on opposite sides of said circuit board, said connection comprising;

a slot formed through said circuit board, said slot penetrating conductive pads on each side of said circuit board and penetrating said inner conductive layer;

an insulative roadbed in said slot, said insulative roadbed formed of extruded insulative polymerizable material, said insulative roadbed crossing said inner conductive layer of said circuit board; and an extruded trace within said slot, said trace formed of extruded polymerizable material which is conductive after polymerization in said slot, said trace making contact with said pads on opposite sides of said circuit board, said trace being isolated from said inner conductive layer of said circuit board by said insulative roadbed.

83. A circuit board for holding electrical components as in claim 82 wherein said connection between said pads additionally comprises a covering trace of insulative material extruded from an orifice, said covering trace covering said trace at the level of said inner conductive layer of said circuit board.

84. A method of forming a mounting pad for registering and attaching leads of discrete devices on a circuit substrate support comprising the steps of:

extruding a pad of insulative polymerizable material onto an circuit substrate support:

polymerizing said polymerizable insulative material;

forming openings into said polymerized insulative pad, said openings for registering and mounting leads of electrical components;

extruding polymerizable material conductive after polymerization into said openings to form conductive mounting surfaces for said leads of said electrical components; and polymerizing said conductive polymerizable material.

85. A polymer thick film extrusion device comprising;

an extrusion housing including a central passage in which extrudable polymer is contained;

a fill passage in said housing for allowing the passage of extrudable polymer from a polymer storage reservoir to said central passage;

means for forcing said extrudable polymer from said passage and onto a circuit board means for monitoring the rate at which said extrudable polymer is extruded; and control means for controlling the application of force applied via said force applying means responsive to said rate of extrusion information supplied by said monitoring means.

86. A polymer thick film extrusion device as in claim 85 wherein said means for forcing said extrudable polymer from said passage comprises a piston positioned within said central passage.

87. A polymer thick film extrusion device as in claim 86 wherein said piston is made from a magnetically permeable material and said monitoring means comprises an LVDT coil for sensing the position and rate of movement of said piston.

88. A polymer thick film extrusion device as in claim 86 wherein said control means comprises a gas control unit responsive to extrusion rate information supplied from said monitoring means, said gas control unit controlling gas pressure and gas flow rate from a pressurized gas source to said piston.

89. A polymer thick film extrusion device as in claim 85 further comprising valve means positioned adjacent said fill passage for controlling the flow of said extrudable polymer from said reservoir through said fill passage and into said central passage.

90. A polymer thick film extrusion device as in claim 89 wherein said valve means comprises a coil spring biasing said valve means toward a closed position.

91. A method of creating circuits on a circuit board comprising the steps of:

(1) extruding a first polymeric material onto a circuit board substrate along preselected paths to form traces, said polymeric material comprising a polymer solution which is conductive upon curing and which undergoes an increase in viscosity upon extrusion such that only negligible mechanical deformation takes place whenever crossover traces are laid over said traces; and (2) prior to curing, extruding a second polymeric material onto said circuit substrate and over said traces.

92. A circuit board for holding electrical components comprising:

a circuit substrate support;

a plurality of electrically conductive pads attached to said support to which components are to be electrically connected a plurality of electrically conductive traces adhered to said support and beginning and ending on top of said pads to form electrical pathways between said pads, said traces being formed by extrusion of a polymer thick film from an orifice, some of said plurality of traces crossing over a countable number of other traces;

said circuit board wherein said traces are coated with an electrically insulating material and formed by extrusion of said insulating material along said pathways.

* * * * *